US008883323B2

(12) United States Patent
Kawamura et al.

(10) Patent No.: US 8,883,323 B2
(45) Date of Patent: Nov. 11, 2014

(54) ORGANIC ELECTROLUMINESCENCE DEVICE

(75) Inventors: Yuichiro Kawamura, Sodegaura (JP); Hiroyuki Saito, Sodegaura (JP); Hitoshi Kuma, Sodegaura (JP); Masahiro Kawamura, Sodegaura (JP); Yukitoshi Jinde, Sodegaura (JP); Hirokatsu Ito, Sodegaura (JP); Takayasu Sado, Sodegaura (JP); Sayaka Mizutani, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 136 days.

(21) Appl. No.: 13/302,205

(22) Filed: Nov. 22, 2011

(65) Prior Publication Data
US 2012/0126209 A1 May 24, 2012

Related U.S. Application Data

(63) Continuation-in-part of application No. 13/017,978, filed on Jan. 31, 2011.

(30) Foreign Application Priority Data

Nov. 22, 2010 (JP) ................................. 2010-260674
Jul. 28, 2011 (JP) ................................. 2011-165670

(51) Int. Cl.
H01L 51/54 (2006.01)
H01L 51/50 (2006.01)
H01L 51/00 (2006.01)

(52) U.S. Cl.
CPC ......... H01L 51/5096 (2013.01); *H01L 51/0072* (2013.01); *H01L 2251/55* (2013.01); *H01L 51/0073* (2013.01); *Y10S 428/917* (2013.01)
USPC ....... 428/690; 428/917; 313/506; 257/E51.05

(58) Field of Classification Search
None
See application file for complete search history.

(56) References Cited

U.S. PATENT DOCUMENTS

| 8,502,200 | B2 | 8/2013 | Schwartz et al. |
| 8,803,420 | B2 | 8/2014 | Kawamura et al. |
| 2002/0028329 | A1 | 3/2002 | Ise et al. |
| 2004/0086745 | A1 | 5/2004 | Iwakuma et al. |
| 2004/0265630 | A1 | 12/2004 | Suh et al. |
| 2007/0159083 | A1 | 7/2007 | Matsuura et al. |
| 2007/0190355 | A1 | 8/2007 | Ikeda et al. |
| 2007/0257600 | A1 | 11/2007 | Matsuura et al. |
| 2007/0275266 | A1 | 11/2007 | Jinde et al. |
| 2008/0286610 | A1 | 11/2008 | Deaton et al. |
| 2009/0102356 | A1 | 4/2009 | Wang et al. |
| 2009/0191427 | A1 | 7/2009 | Liao et al. |
| 2010/0044689 | A1 | 2/2010 | Nishimura et al. |
| 2010/0109514 | A1 | 5/2010 | Schafer et al. |
| 2010/0141122 | A1 | 6/2010 | Begley et al. |
| 2010/0163853 | A1 | 7/2010 | Ogiwara et al. |
| 2010/0295027 | A1 | 11/2010 | Kawamura et al. |
| 2010/0295444 | A1 | 11/2010 | Kuma et al. |
| 2010/0295445 | A1 | 11/2010 | Kuma et al. |
| 2010/0301318 | A1 | 12/2010 | Kuma et al. |
| 2010/0301319 | A1 | 12/2010 | Kuma et al. |
| 2010/0308322 | A1 | 12/2010 | Yokoyama et al. |
| 2010/0314644 | A1 | 12/2010 | Nishimura et al. |
| 2011/0006291 | A1 | 1/2011 | Yokoyama et al. |
| 2011/0049483 | A1 | 3/2011 | Nishimura et al. |
| 2011/0114926 | A1 | 5/2011 | Okabe et al. |
| 2011/0156013 | A1 | 6/2011 | Kim et al. |
| 2011/0169045 | A1 | 7/2011 | Oyamada et al. |
| 2011/0175079 | A1 | 7/2011 | Yokoyama et al. |
| 2011/0192464 | A1 | 8/2011 | Urano et al. |
| 2012/0126208 | A1* | 5/2012 | Kawamura et al. ............. 257/40 |
| 2012/0132899 | A1 | 5/2012 | Kawamura et al. |
| 2012/0153268 | A1* | 6/2012 | Kawamura et al. ............. 257/40 |
| 2012/0161107 | A1 | 6/2012 | Yokoyama et al. |
| 2012/0248973 | A1 | 10/2012 | Ito et al. |
| 2012/0256172 | A1* | 10/2012 | Ito et al. .......................... 257/40 |
| 2012/0313511 | A1 | 12/2012 | Tsurutani et al. |
| 2013/0200337 | A1 | 8/2013 | Iida et al. |
| 2013/0240844 | A1 | 9/2013 | Nakatsuka et al. |

FOREIGN PATENT DOCUMENTS

| JP | 2004-139819 A | 5/2004 |
| JP | 2005-285708 A | 10/2005 |
| JP | 2006-49438 | 2/2006 |
| JP | 2007-165171 | 6/2007 |
| JP | 2007-220721 | 8/2007 |

(Continued)

OTHER PUBLICATIONS

D.Y. Kondakov; Characterization of triplet-triplet annihilation in organic light-emitting diodes based on anthracene derivatives, Journal of Applied Physics 102, 114504 (2007): 5 pages; Eastman Kodak Company; Rochester, New York 14650-2103, USA.
M. Kawamura, et al., Highly Efficient Fluorescent Blue OLEDs with Efficiency-enhancement Layer; SID 10 Digest, 560-563 (2010), 4 pages; Chiba, 299-0293, Japan.
International Search Report and Written Opinion issued Feb. 14, 2012 in Application No. PCT/JP2011/006510.
Office Action issued Jul. 24, 2013 in Korean Patent Application No. 2012-7003300 with English language translation.
Office Action issued Oct. 8, 2013 in Japanese Patent Application No. 2012-504990 (with English language translation).

(Continued)

*Primary Examiner* — Marie R. Yamnitzky
(74) *Attorney, Agent, or Firm* — Oblon, Spivak, McClelland, Maier & Neustadt, L.L.P.

(57) ABSTRACT

An organic electroluminescence device that includes an anode, an emitting layer that includes a host and a dopant, a blocking layer, an electron injecting layer, and a cathode where the blocking layer includes an aromatic heterocyclic derivative, the triplet energy $E^T_b$ (eV) of the blocking layer is larger than a triplet energy $E^T_h$ (eV) of the host, and the affinity $A_b$ (eV) of the blocking layer and an affinity $A_e$ (eV) of the electron injecting layer satisfy a relationship of $A_e - A_b < 0.2$.

14 Claims, 12 Drawing Sheets

(56) References Cited

FOREIGN PATENT DOCUMENTS

| JP | 2009-16693 | 1/2009 |
|---|---|---|
| JP | 2010-171363 | 8/2010 |
| JP | 2011-108792 | 6/2011 |
| KR | 10-2005-0000747 A | 1/2005 |
| WO | WO 2005/011332 A1 | 2/2005 |
| WO | WO 2005/076669 A1 | 8/2005 |
| WO | WO 2005/079118 A1 | 8/2005 |
| WO | 2007/082674 | 7/2007 |
| WO | WO 2007/138906 A1 | 12/2007 |
| WO | WO 2008/123178 A1 | 10/2008 |
| WO | WO 2009/097108 A1 | 8/2009 |
| WO | 2010/134350 | 11/2010 |
| WO | 2010/134352 | 11/2010 |
| WO | WO 2010/126270 A1 | 11/2010 |
| WO | WO 2011/086941 A1 | 7/2011 |

OTHER PUBLICATIONS

Office Action as received in U.S. Appl. No. 13/017,978 dated Aug. 29, 2013.
Office Action as received in U.S. Appl. No. 13/302,063 dated Sep. 6, 2013.
Korean Office Action as received in the corresponding Patent Application No. 2012-7003300 dated Jan. 23, 2014 w/English Translation.
U.S. Office Action issued Aug. 21, 2014 for the related U.S. Appl. No. 13/302,063, filed Nov. 22, 2011.

* cited by examiner

F I G . 1
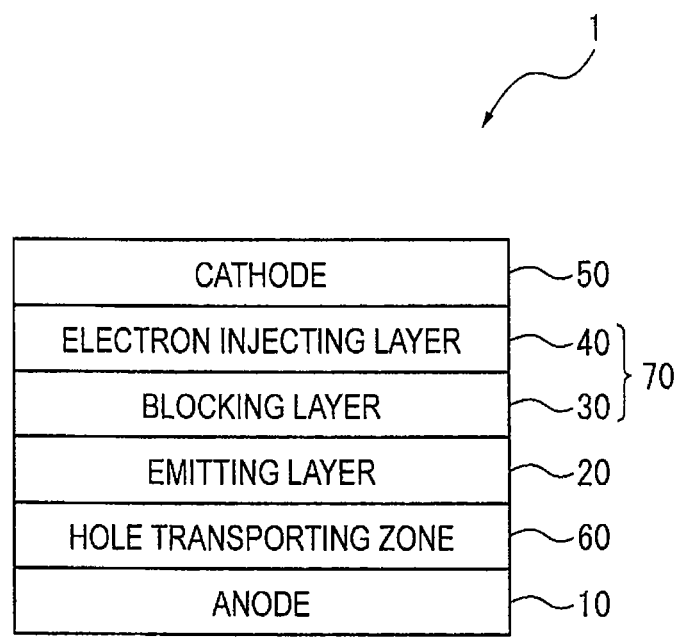

ORGANIC ELECTROLUMINESCENCE DEVICE

CROSS REFERENCE TO RELATED APPLICATIONS

This application is a continuation-in-part application of U.S. Ser. No. 13/017,978 filed Jan. 13, 2011, which is pending, and claims the benefit of JP 2010-260674 filed Nov. 22, 2010 and JP 2011-165670 filed Jul. 28, 2011.

FIELD OF THE INVENTION

The present invention relates to an organic electroluminescence device.

DESCRIPTION OF THE BACKGROUND ART

An organic electroluminescence device (hereinafter, referred to as organic EL device) can be classified by the emission principle into two types: a fluorescent EL device and a phosphorescent EL device. When a voltage is applied to the organic EL device, holes are injected from an anode and electrons are injected from a cathode. The holes and the electrons are recombined in an emitting layer to form excitons. According to the electron spin statistics theory, singlet excitons and triplet excitons are generated at a ratio of 25%: 75%. In a fluorescent EL device which uses emission caused by singlet excitons, the limit value of an internal quantum efficiency is believed to be 25%. This is about 5% in terms of external quantum efficiency. Even considering technical improvement in efficiency for obtaining emission, in a blue-emission fluorescent device exhibiting CIEy=about 0.1, the limit value of the external quantum efficiency was 8%. A voltage applied at the maximum efficiency was about 4 to 6 V.

In association with the technology for bringing efficiency to the fluorescent EL device, several technologies are disclosed in which emission is obtained from triplet excitons, which have heretofore been not utilized effectively. For instance, a paper published in the Journal of Applied Physics, 102,114504 (2007) analyzed a non-doped device, in which an anthracene compound is used as a host. A mechanism is found that singlet excitons are generated by collision and fusion of two triplet excitons, whereby fluorescent emission is increased. Such a phenomenon in which singlet excitons are generated by collision and fusion of two triplet excitons is hereinafter referred to as TTF (Triplet-Triplet Fusion) phenomenon.

SID10 DIGEST, 560 (2010) discloses a blue-emission fluorescent OLED in which a layer of an aromatic compound (efficiency-enhancement layer, referred to as EEL) is interposed between an emitting layer including a host and a dopant and an electron transporting layer. It is reported that an OLED in which a compound EEL-1 is used as EEL is driven by a low voltage, exhibits a high external quantum efficiency and has a long lifetime compared with an OLED in which BPhen or BCP is used as EEL. This EEL can serve as a blocking layer for causing a TTF phenomenon. In BPhen and BCP disclosed in SID10 DIGEST, 560 (2010), a TTF ratio was very low and a voltage at 10 mA/cm$^2$ was 4.5 V or more.

SUMMARY OF THE INVENTION

However, the 2007 Journal of Applied Physics publication discloses only that fluorescent emission is increased by collision and fusion of triplet excitons in a non-doped device in which only a host is used. In this technology, an increase in efficiency by triplet excitons is as low as 3% to 6%.

The SID10 DIGEST publication reports that the external quantum efficiency (EQE) of the device using BCP as EEL is inferior to a device using EEL-1 as EEL by tens of %. It has been considered difficult to satisfy a predetermined relationship of triplet energy and to efficiently cause a TTF phenomenon by using a compound (e.g. BCP) including a hetero atom in a blocking layer, thereby preparing a highly efficient device.

An object of the invention is to provide an organic EL device of a fluorescent emission with high efficiency.

As a result of the studies, the inventors have found as follows.

In an organic EL device in which a blocking layer is interposed between an emitting layer and an electron injecting layer, there is a difference between an affinity of the electron injecting layer and an affinity of the blocking layer. When the affinity difference is large, electrons injected from the cathode cannot sufficiently be supplied to the emitting layer, whereby holes and electrons are not sufficiently recombined in the emitting layer. Thus, it has been found that a presence of the affinity difference hampers sufficient generation of excitons contributing to a TTF phenomenon.

The excitons contributing to a TTF phenomenon cannot be observed in a typical electron transporting material. However, by providing an electron transporting zone in a layered structure (a blocking layer/an electron injecting layer) with a predetermined affinity difference between the blocking layer and the electron injecting layer, it has been found that observation of a TTF phenomenon and improvement in luminous efficiency are possible even in a typical electron transporting material such as BCP.

Initially, the inventors have found that, by setting a value obtained by subtracting an affinity $A_b$ of the blocking layer from an affinity $A_e$ of the electron injecting layer to be less than 0.2 eV, the electrons supplied from the cathode can sufficiently be supplied into the emitting layer.

Based on these findings, the inventors achieved the invention of an organic EL device as follows.

According to an aspect of the invention, an organic electroluminescence device includes an anode, an emitting layer, a blocking layer, an electron injecting layer, and a cathode in sequential order, in which the emitting layer includes a host and dopant, the blocking layer includes an aromatic heterocyclic derivative, a triplet energy $E^T_b$ (eV) of the aromatic heterocyclic derivative is larger than a triplet energy $E^T_h$ (eV) of the host, and an affinity $A_b$ (eV) of the blocking layer and an affinity $A_e$ (eV) of the electron injecting layer satisfy a relationship of $A_e-A_b<0.2$.

In the organic EL device according to the above aspect of the invention, it is preferable that the triplet energy $E^T_b$ (eV) of the aromatic heterocyclic derivative and the triplet energy $E^T_h$ (eV) of the host satisfy a relationship of $E^T_h+0.2<E^T_b$.

In the organic EL device according to the above aspect of the invention, it is preferable that the triplet energy $E^T_b$ (eV) of the aromatic heterocyclic derivative and a triplet energy $E^T_{Alq}$ (eV) of tris(8-quinolinolato)aluminum complex satisfy a relationship of $E^T_b>E^T_{Alq}$.

In the organic EL device according to the above aspect of the invention, it is preferable that an electron mobility of the aromatic heterocyclic derivative is $10^{-6}$ cm$^2$/Vs or more in an electric field intensity of 0.04 MV/cm to 0.5 MV/cm.

In the organic EL device according to the above aspect of the invention, it is preferable that an electron mobility of a material for forming the electron injecting layer is $10^{-6}$ cm$^2$/Vs or more in an electric field intensity of 0.04 MV/cm to 0.5 MV/cm.

In the organic EL device according to the above aspect of the invention, it is preferable that the dopant exhibits a fluorescent emission of a main peak wavelength of 550 nm or less, and the triplet energy $E^T_d$ (eV) of the dopant is larger than the triplet energy $E^T_h$ (eV) of the host.

In the organic EL device according to the above aspect of the invention, it is preferable that a hole transporting zone is provided between the anode and the emitting layer, a hole transporting layer is adjacent to the emitting layer in the hole transporting zone, and a triplet energy $E^T_{ho}$ (eV) of the hole transporting layer is larger than the triplet energy $E^T_h$ (eV) of the host.

In the organic EL device according to the above aspect of the invention, it is preferable that a material for forming the electron injecting layer is the same as a material for forming the blocking layer, and the electron injecting layer is doped with a donor.

In the organic EL device according to the above aspect of the invention, it is preferable that the dopant is at least one compound selected from the group consisting of a pyrene derivative, aminoanthracene derivative, aminochrysene derivative, aminopyrene derivative, fluoranthene derivative and boron complex.

In the organic EL device according to the aspect of the invention, it is preferable that the host is a compound that contains a double bond only in a cyclic structure.

In the organic EL device according to the aspect of the invention, it is preferable that the dopant is a compound that contains a double bond only in a cyclic structure.

In the organic EL device according to the aspect of the invention, it is preferable that, in applied voltage at the maximum current efficiency (cd/A), luminous intensity derived from singlet excitons generated by collision of triplet excitons generated in the emitting layer accounts for 30% or more of the entire luminous intensity.

According to the above aspect of the invention, the TTF phenomenon efficiently occurs, thereby providing an organic EL device of a fluorescent emission with a high efficiency.

BRIEF DESCRIPTION OF DRAWINGS

FIG. 1 is a view showing one example of an organic EL device according to a first exemplary embodiment of the invention.

DETAILED DESCRIPTION OF THE INVENTION

First Exemplary Embodiment

The invention utilizes a TTF phenomenon. The TTF phenomenon will be initially described below.

Holes and electrons respectively injected from an anode and a cathode are recombined in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of a conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with one another with an increase in the density thereof, whereby a reaction shown by the following formula occurs. In the formula, $^1A$ represents the ground state and $^1A^*$ represents the lowest singlet excitons.

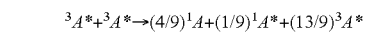

$$^3A^* + ^3A^* \rightarrow (4/9)^1A + (1/9)^1A^* + (13/9)^3A^*$$

In other words, $5\,^3A^* \rightarrow 4\,^1A + ^1A^*$, and it is expected that, among triplet excitons initially generated, which account for 75%, one fifth thereof (i.e., 20%) is changed to singlet excitons. Accordingly, the amount of singlet excitons which contribute to emission is 40%, which is a value obtained by adding 15% (75%×(1/5)=15%) to 25%, which is the amount ratio of initially generated singlet excitons. At this time, a ratio of luminous intensity derived from TTF (TTF ratio) relative to the total luminous intensity is 15/40, i.e., 37.5%. Assuming that singlet excitons are generated by collision of initially-generated triplet excitons which account for 75% (i.e., one singlet exciton is generated from two triplet excitons), a significantly high internal quantum efficiency of 62.5% is obtained which is a value obtained by adding 37.5% (75%×(1/2)=37.5%) to 25%, which is the amount ratio of initially generated singlet excitons. At this time, the TTF ratio is 60% (37.5/62.5).

Figure 2:
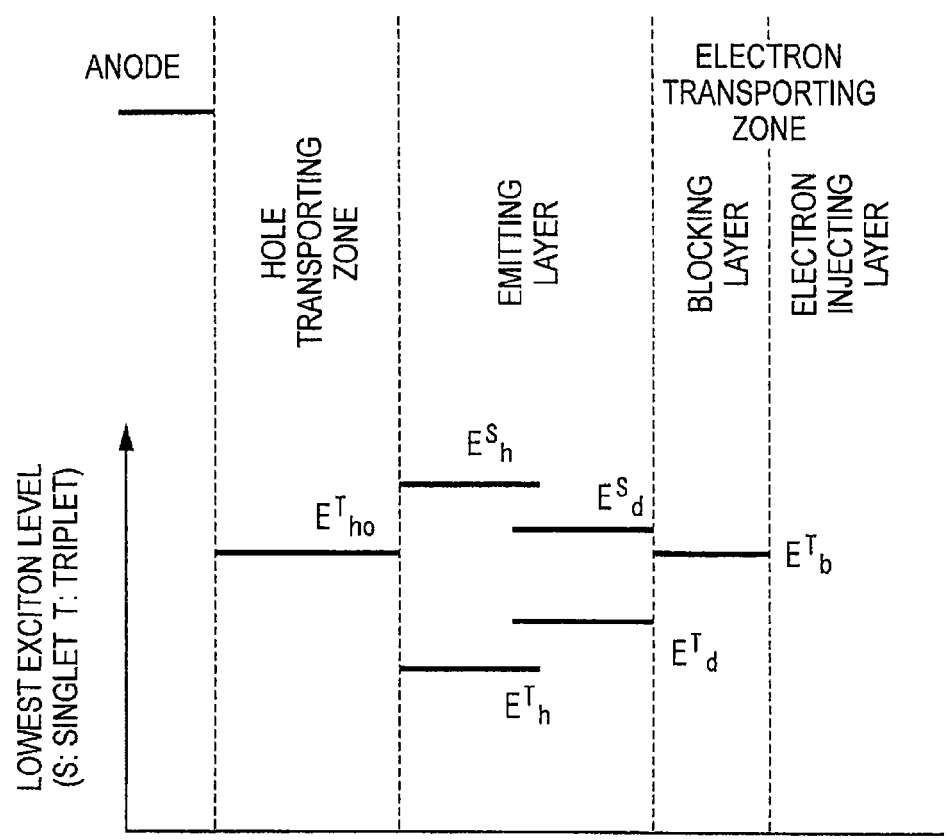
FIG. 2 is a view showing a relationship of energy gaps between layers of the invention.

FIG. 1 is schematic view showing one example of an organic EL device according to a first exemplary embodiment of the invention. FIG. 2 is a schematic view showing a relationship between a triplet energy of the emitting layer and a triplet energy of an electron transporting zone in the organic EL device according to the first exemplary embodiment In the invention, the triplet energy is referred to as a difference between energy in the lowest triplet state and energy in the ground state. The singlet energy (often referred to as energy gap) is referred to as a difference between energy in the lowest singlet state and energy in the ground state.

The organic EL device 1 shown in FIG. 1 includes an anode 10, a hole transporting zone 60, an emitting layer 20, a blocking layer 30, an electron injecting layer 40, and a cathode 50 in sequential order. These components are adjacent to one another in the organic EL device of the invention. An electron transporting zone 70 includes the blocking layer 30 and the electron injecting layer 40. It is preferred that the hole transporting zone 60 is interposed between the anode 10 and the emitting layer 20. The hole transporting zone includes at least one of a hole injecting layer and a hole transporting layer. In the invention, a simply-called blocking layer means a layer functioning as a barrier against triplet energy. Accordingly, the blocking layer functions differently from a hole blocking layer and a charge blocking layer.

The emitting layer includes a host and a dopant. As the dopant, a dopant emitting fluorescent light of a main peak wavelength of 550 nm or less (hereinafter occasionally referred to as a fluorescent dopant having a main peak wavelength of 550 nm or less) is preferable. A main peak wavelength means a peak wavelength of luminescence spectrum exhibiting a maximum luminous intensity among luminous spectra measured in a toluene solution with a concentration from $10^{-5}$ mol/l to $10^{-6}$ mol/l. The main peak wavelength of 550 nm is substantially equivalent to a green emission. In this wavelength zone, improvement in luminous efficiency of a fluorescent device utilizing the TTF phenomenon is desired. In a blue-emitting fluorescent device of 480 nm or less, further improvement in luminous efficiency is expectable. In a red-emitting fluorescent device of 550 nm or more, a phosphorescent device exhibiting a high internal quantum efficiency has already been at a practical level. Accordingly, improvement in luminous efficiency as a fluorescent device is not desired.

In FIG. 2, the holes injected from the anode are injected to the emitting layer via the hole transporting zone. The electrons injected from the cathode are injected to the emitting layer via the electron injecting layer and the blocking layer. Subsequently, the holes and the electrons are recombined in the emitting layer to generate singlet excitons and triplet excitons. There are two manners as for the occurrence of recombination: recombination may occur either on host molecules or on dopant molecules.

Figure 3:
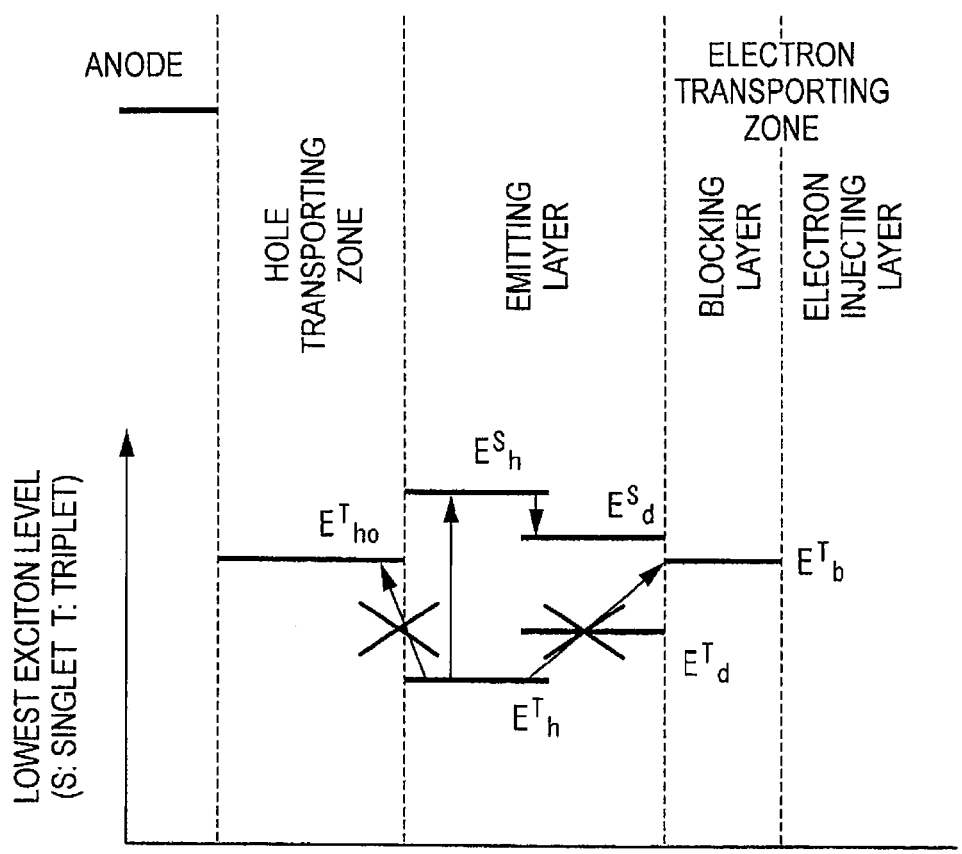
FIG. 3 is a view showing an action based on the relationship of the energy gaps between the layers of the invention.

In this exemplary embodiment, as shown in FIG. 2, when the triplet energy of the host and that of the dopant are respectively taken as $E^T_h$ and $E^T_d$, a relationship of $E^T_h < E^T_d$ is satisfied. When this relationship is satisfied, triplet excitons generated by recombination on the host do not transfer to the dopant which has a higher triplet energy, as shown in FIG. 3. Triplet excitons generated by recombination on dopant molecules quickly energy-transfer to host molecules. In other words, triplet excitons on the host do not transfer to the dopant but collide with one another efficiently on the host to generate singlet excitons by the TTF phenomenon. Moreover, since the singlet energy $E^S_d$ of the dopant is smaller than the singlet energy $E^S_h$ of the host to satisfy the following relation, $$E^S_d < E^S_h$$

singlet excitons generated by the TTF phenomenon energy-transfer to contribute to fluorescent emission of the dopant. In dopants which are usually used in a fluorescent device, transition from the triplet state to the ground state should be inhibited. In such a transition, triplet excitons are not optically energy-deactivated, but are thermally energy-deactivated. By arranging the triplet energy of a host and the triplet energy of a dopant to satisfy the above-mentioned relationship, singlet excitons are generated efficiently due to the collision of triplet excitons before they are thermally deactivated. As a consequence, luminous efficiency is improved.

In the invention, the blocking layer is adjacent to the emitting layer. The blocking layer has a function of preventing triplet excitons generated in the emitting layer to be diffused to an electron transporting zone and confining the triplet excitons within the emitting layer to increase a density of the triplet excitons therein, thereby causing the TTF phenomenon efficiently.

The blocking layer also serves for efficiently injecting the electrons to the emitting layer. When the electron injecting properties to the emitting layer are deteriorated, the density of the triplet excitons is decreased since the electron-hole recombination in the emitting layer is decreased. When the density of the triplet excitons is decreased, the frequency of collision of the triplet excitons is reduced, whereby the TTF phenomenon does not occur efficiently.

In the invention, the blocking layer contains an aromatic heterocyclic derivative.

In this exemplary embodiment, in order to prevent the triplet excitons generated in the emitting layer from being diffused to the electron transporting zone and efficiently inject the electrons to the emitting layer, an affinity ($A_b$) of the blocking layer and an affinity ($A_e$) of the electron injecting layer satisfy a relationship of the following formula (1).

$$A_e - A_b < 0.2 \quad (1)$$

When the relationship is not satisfied, the electron injection from the electron injecting layer to the blocking layer becomes difficult.

Preferably, the affinity ($A_b$) of the blocking layer and the affinity ($A_e$) of the electron injecting layer satisfy a relationship of the following formula (2).

$$-3 < A_1 - A_b < 0.2 \quad (2)$$

A material for forming the electron injecting layer may be the same as that for forming the blocking layer. In this case, the electron injecting layer is preferably doped with a donor. Doping with the donor facilitates receiving the electrons from the cathode. Particularly, it is preferred that the electron injecting layer is doped with a donor represented by an alkali metal near an interface with the cathode. As the donor, at least one selected from the group consisting of a donor metal, a donor metal compound and a donor metal complex can be used. Specific donors will be described later.

In the invention, in order to prevent diffusion of triplet excitons, the triplet energy $E^T_b$ of the aromatic heterocyclic derivative contained in the blocking layer is larger than the triplet energy $E^T_h$ of the host. In other words, a relationship of $E^T_h < E^T_b$ is satisfied.

It is preferred that the triplet energy $E^T_b$ of the aromatic heterocyclic derivative is larger than the triplet energy $E^T_d$ of the dopant. In other words, a relation of $E^T_d < E^T_b$ is satisfied.

Since the blocking layer prevents triplet excitons from being diffused to the electron injecting layer, in the emitting layer, triplet excitons of the host become singlet excitons efficiently, and the singlet excitons transfer to the dopant, and are optically energy-deactivated.

It is preferred that the triplet energy $E^T_b$ of the aromatic heterocyclic derivative and the triplet energy $E^T_h$ of the host satisfy a relationship of $E^T_h + 0.2 < E^T_b$.

It is more preferable that the triplet energy $E^T_b$ of the aromatic heterocyclic derivative and the triplet energy $E^T_h$ of the host satisfy a relationship of $E^T_h + 0.3 < E^T_b$.

It is further more preferable that the triplet energy $E^T_b$ of the aromatic heterocyclic derivative and the triplet energy $E^T_h$ of the host satisfy a relationship of $E^T_h+0.4<E^T_b$.

As described above, as the energy barrier of triplet energy becomes large, particularly when exceeding 0.2, the triplet excitons are difficult to be energetically balanced between the emitting layer and blocking layer due to thermal energy. In this case, in addition to diffusion to the blocking layer, deterioration in efficiency by a thermal deactivation mode is believed to be prevented. Accordingly, it is preferred that the above relationships are satisfied.

It is preferred that the triplet energy $E^T_b$ of the blocking layer and the triplet energy $E^T_{Alq}$ of tris(8-quinolinolato)aluminum complex satisfy a relationship of $E^T_b>E^T_{Alq}$.

By satisfying such a relationship, advantages to confine the triplet excitons within the emitting layer can be enhanced.

The blocking layer preferably includes an aromatic heterocyclic derivative having a cyclic structure of six rings or more. As a result, it is considered that the exciton density within the emitting layer is increased by allowing sufficient electron supply from the electron injecting layer without the formation of association, whereby the luminous efficiency is enhanced by the TTF phenomenon.

When the blocking layer has a ring structure of five rings or less, film stability at a thin film formation is low due to its small molecule size. This means that, when these compounds are used as the blocking layer, a condition of an interface between the blocking layer and the electron injecting layer is easily changed, resulting in partial association of molecules. Since the condition of the interface is changed by such association, it is considered that the electron supply from the electron injecting layer is hampered.

It will be described how to count a cyclic structure of the aromatic heterocyclic derivative. In the invention, one cyclic structure refers to a cyclic structure having one ring formed by a covalent bond of non-metal atoms in a molecule. Particularly, in the case of a fused ring group, the number of a fused cyclic structure is defined as the number of a cyclic structure of the fused ring group. For instance, a naphthalene ring has two cyclic structures and a dibenzofuran ring has three cyclic structures. An aromatic heterocyclic derivative represented by the following chemical formula (1) has ten cyclic structures.

[Chemical Formula 1]

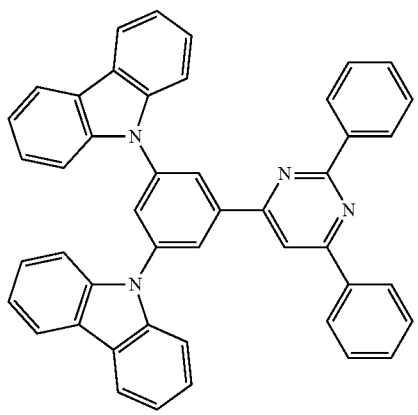

(1)

As for a complex such as BAlq represented by the following chemical formula (2), an aromatic cyclic structure and a hetero cyclic structure, which are directly bonded to metals or indirectly through an atom, are also counted as the cyclic structure. Accordingly, BAlq has six cyclic structures.

[Chemical Formula 2]

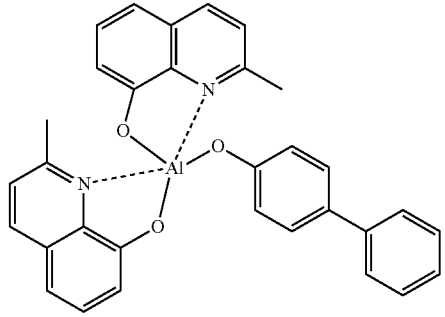

(2)

Bphen represented by the following chemical formula (3) has five cyclic structures.

[Chemical Formula 3]

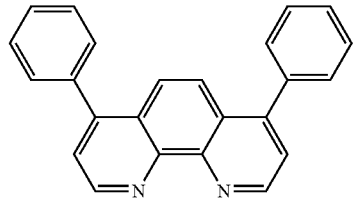

(3)

Specific examples of the aromatic heterocyclic derivative having six or more cyclic structures contained in the blocking layer are structures represented by the following general formulae (BL-1) to (BL-6). However, the aromatic heterocyclic derivative is not limited to compounds as follows.

[Chemical Formula 4]

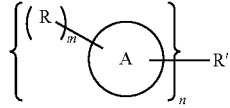

(BL-1)

Signs in the formula (BL-1) will be described.

A represents a monocyclic heterocyclic group. R represents a group selected from a substituted or unsubstituted alkyl group, a substituted or unsubstituted aryl group, and a substituted or unsubstituted heteroaryl group, or residues of combination of two or more thereof. When n is 1, R' represents the same as R. When n is 2 to 6, R' represents a linking group selected from a substituted or unsubstituted alkylene group, a substituted or unsubstituted arylene group, a substituted or unsubstituted heteroarylene group, and residues of combination of two or more thereof.

m is an integer of 0 to 4. n is an integer of 1 to 6. When a plurality of As and Rs are present, the plurality of As and Rs each may be the same or different. In the formula (BL-1), a total number of A, R and R' included in a molecule is six or more, in which A, R and R' represent a ring formed by a covalent bond of non-metal atoms.

Examples of the monocyclic heterocyclic group represented by A are preferably pyridine, pyrimidine, pyrazine, pyridazine, triazine, tetrazine, pyrrole, imidazole, pyrazole, oxazole, isooxazole, furan, thiophene, thiazole, isothiazole, triazole, oxadiazole, thiadiazole, furazan and tetrazole.

Examples of the alkyl group are preferably a methyl group, ethyl group, propyl group, isopropyl group, butyl group, sec-butyl group, tert-butyl group, isobutyl group, cyclobutyl group, cyclopentyl group and cyclohexyl group.

Examples of the aryl group are preferably a phenyl group, naphthyl group, fluorenyl group, biphenyl group, terphenyl group, phenanthryl group, fluoranthenyl group, benzofluoranthenyl group, benzanthryl group, pyrenyl group, benzphenanthryl group, benzochrysenyl group, chrysenyl group, triphenylene group and benzotrienylenyl group.

Examples of the heteroaryl group are preferably pyridine, pyrimidine, pyrazine, pyridazine, triazine, tetrazine, pyrrole, imidazole, pyrazole, oxazole, isooxazole, furan, thiophene, thiazole, isothiazole, triazole, oxadiazole, thiadiazole, furazan and tetrazole.

The alkylene group is preferably an n-valent residue of the groups listed above as the alkyl group.

The arylene group is preferably an n-valent residue of the groups listed above as the aryl group.

The heteroarylene group is preferably an n-valent residue of the groups listed above as the heteroaryl group.

A structure represented by the general formula (BL-1) also includes the following.

[Chemical Formula 5]

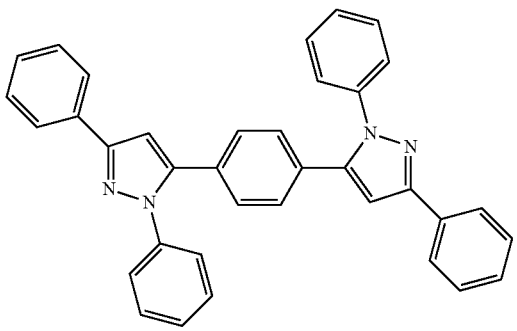

Next, structures represented by the general formula (BL-2) will be described.

[Chemical Formula 6]

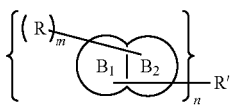

(BL-2)

Signs in the formula (BL-2) will be described.

$B_1$ and $B_2$ both represent a cyclic structure. Adjacent Bs are fused to form a ring. At least one of $B_1$ and $B_2$ is structured to have a hetero atom. Such a fused cyclic structure formed by $B_1$ and $B_2$ is referred to as $B_1$-$B_2$ ring.

R represents a group selected from a substituted or unsubstituted alkyl group, a substituted or unsubstituted aryl group, and a substituted or unsubstituted heteroaryl group, or residues of combination of two or more thereof.

When n is 1, R' represents the same as R. When n is 2 to 6, R' represents a linking group selected from a substituted or unsubstituted alkylene group, a substituted or unsubstituted arylene group, a substituted or unsubstituted heteroarylene group, and residues of combination of two or more thereof, or R' directly bonds two $B_1$-$B_2$ rings in a single bond.

m is an integer of 0 to 6. n is an integer of 1 to 6.

When a plurality of $B_1$-$B_2$ rings and Rs are present, the plurality of $B_1$-$B_2$ rings and Rs each may be the same or different. In the formula (BL-2), a total number of $B_1$, $B_2$, R and R' included in a molecule is six or more, in which $B_1$, $B_2$, R and R' represent a ring formed by a covalent bond of non-metal atoms.

Examples of the alkyl group and the aryl group are preferably the same as those described in relation to the general formula (BL-1). Examples of the heteroaryl group are preferably pyridine, pyrimidine, pyrazine, pyridazine, triazine, tetrazine, pyrrole, imidazole, pyrazole, oxazole, isooxazole, furan, thiophene, thiazole, isothiazole, triazole, oxadiazole, thiadiazole, furazan, tetrazole, benzimidazole, imidazopyridine, indazole, quinoline, isoquinoline, quinoxaline, naphthyridine, benzoxazole and benzthiazole.

The alkylene group, arylene group and heteroarylene group are preferably an n-valent residue of the groups listed above as the alkyl group, aryl group and heteroaryl group.

Examples of a structure of $B_1$-$B_2$ ring are preferably fused cyclic structures listed below in the general formulae (BL-2-1).

[Chemical Formula 7]

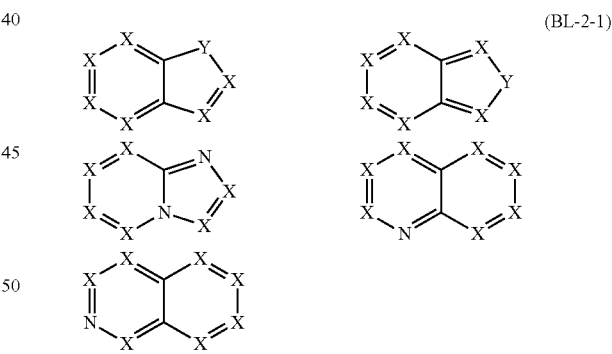

(BL-2-1)

Signs in the formulae (BL-2-1) will be described.

X represents CR" or N.

Y represents O, S, NR" or C(R")$_2$. At least one of Ys in a single structure is O, S or NR".

One of R"s is used as a bonding portion to R'. The rest of R"s each are a hydrogen atom or substituents same as those of R.

C represents a carbon atom. O represents an oxygen atom. S represents a sulfur atom. N represents a nitrogen atom.

A structure represented by the general formula (BL-2) also includes the following.

[Chemical Formula 8]

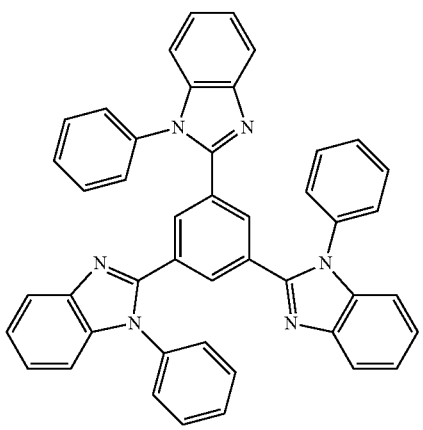

Next, structures represented by the general formula (BL-3) will be described.

[Chemical Formula 9]

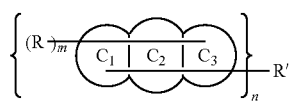

(BL-3)

Signs in the formula (BL-3) will be described.

$C_1$ to $C_3$ each represent a cyclic structure. Adjacent Cs are fused to form a ring. At least one of $C_1$ to $C_3$ is structured to have a hetero atom. Another fused ring may be formed in such a manner as to cross-couple the adjacent Cs. Such a fused cyclic structure formed by $C_1$ to $C_3$ is referred to as $C_1$-$C_3$ ring.

R represents a group selected from a substituted or unsubstituted alkyl group, a substituted or unsubstituted aryl group, and a substituted or unsubstituted heteroaryl group, or residues of combination of two or more thereof.

When n is 1, R' represents the same as R. When n is 2 to 6, R' represents a linking group selected from a substituted or unsubstituted alkylene group, a substituted or unsubstituted arylene group, a substituted or unsubstituted heteroarylene group, and residues of combination of two or more thereof, or R' directly bonds two $C_1$-$C_3$ rings in a single bond.

m is an integer of 0 to 9. n is an integer of 1 to 6.

When a plurality of $C_1$-$C_3$ rings and Rs are present, the plurality of $C_1$-$C_3$ rings and Rs each may be the same or different. In the formula (BL-3), a total number of $C_1$ to $C_3$, R and R' included in a molecule is six or more, in which $C_1$ to $C_3$, R and R' represent a ring formed by a covalent bond of non-metal atoms.

Examples of the alkyl group and the aryl group are preferably the same as those described in relation to the general formula (BL-1). Examples of the heteroaryl group are preferably pyridine, pyrimidine, pyrazine, pyridazine, triazine, tetrazine, pyrrole, imidazole, pyrazole, oxazole, isooxazole, furan, thiophene, thiazole, isothiazole, triazole, oxadiazole, thiadiazole, furazan, tetrazole, benzimidazole, imidazopyridine, indazole, quinoline, isoquinoline, quinoxaline, naphthyridine, benzoxazole, benzthiazole, carbazole, dibenzofuran, dibenzothiophen and phenanthroline.

The alkylene group, arylene group and heteroarylene group are preferably an n-valent residue of the groups listed above as the alkyl group, aryl group and heteroaryl group.

Examples of a structure of $C_1$-$C_3$ ring are preferably fused cyclic structures listed below in the general formulae (BL-3-1).

[Chemical Formula 10]

(BL-3-1)

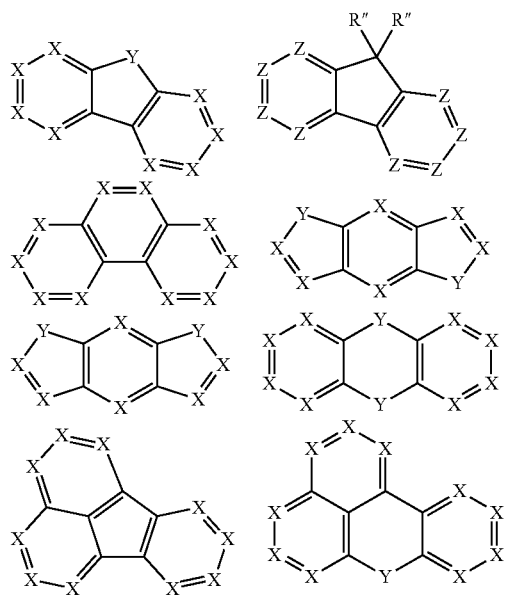

Signs in the formulae (BL-3-1) will be described.

X, Y and R" are the same as those described in relation to the formulae (BL-2-1).

Z represents CR" or N. At least one of Zs is N.

A structure represented by the general formula (BL-3) also includes the following.

[Chemical Formula 11]

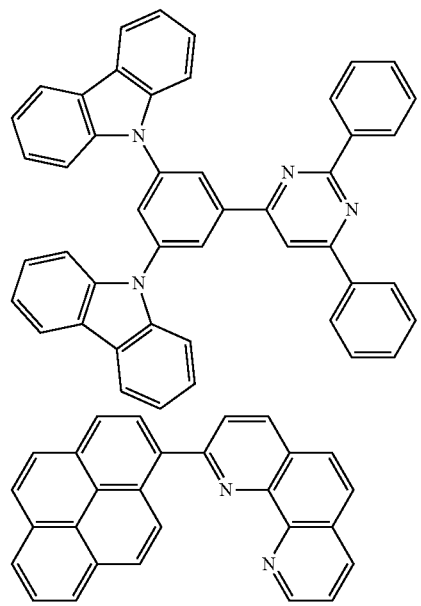

Next, structures represented by the general formula (BL-4) will be described.

[Chemical Formula 12]

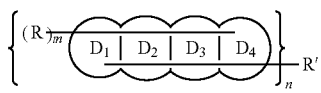

(BL-4)

Signs in the formula (BL-4) will be described.

$D_1$ to $D_4$ each represent a cyclic structure. Adjacent Ds are fused to form a ring. At least one of $D_1$ to $D_4$ is structured to have a hetero atom. Another fused ring may be formed in such a manner as to cross-couple the adjacent Ds. Such a fused cyclic structure by $D_1$ to $D_4$ is referred to as $D_1$-$D_4$ ring.

R represents a group selected from a substituted or unsubstituted alkyl group, a substituted or unsubstituted aryl group, and a substituted or unsubstituted heteroaryl group, or residues of combination of two or more thereof.

When n is 1, R' represents the same as R. When n is 2 to 6, R' represents a linking group selected from a substituted or unsubstituted alkylene group, a substituted or unsubstituted arylene group, a substituted or unsubstituted heteroarylene group, and residues of combination of two or more thereof, or R' directly bonds two $D_1$-$D_4$ rings in a single bond.

m is an integer of 0 to 11. n is an integer of 1 to 6.

When a plurality of $D_1$-$D_4$ rings and Rs are present, the plurality of $D_1$-$D_4$ rings and Rs each may be the same or different. In the formula (BL-4), a total number of $D_1$-$D_4$, R and R' included in a molecule is six or more, in which $D_1$-$D_4$, R and R' represent a ring formed by a covalent bond of non-metal atoms.

Examples of the alkyl group and the aryl group are preferably the same as those described in relation to the general formula (BL-1). Examples of the heteroaryl group are preferably pyridine, pyrimidine, pyrazine, pyridazine, triazine, tetrazine, pyrrole, imidazole, pyrazole, oxazole, isooxazole, furan, thiophene, thiazole, isothiazole, triazole, oxadiazole, thiadiazole, furazan, tetrazole, benzimidazole, imidazopyridine, indazole, quinoline, isoquinoline, quinoxaline, naphthyridine, benzoxazole, benzthiazole, carbazole, dibenzofuran, dibenzothiophen and phenanthroline.

The alkylene group, arylene group and heteroarylene group are preferably an n-valent residue of the groups listed above as the alkyl group, aryl group and heteroaryl group.

Examples of a structure of $D_1$-$D_4$ ring are preferably fused cyclic structures listed below in the formulae (BL-4-1).

[Chemical Formula 13]

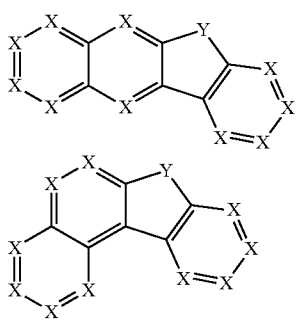

(BL-4-1)

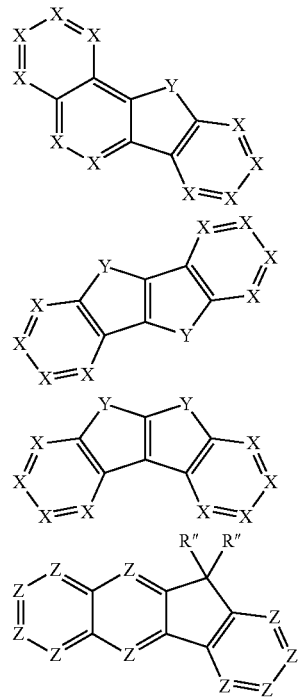

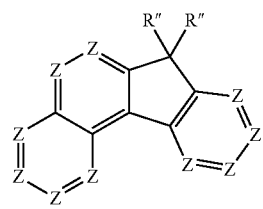

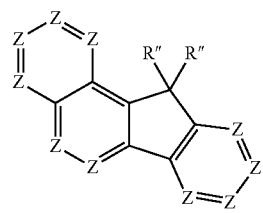

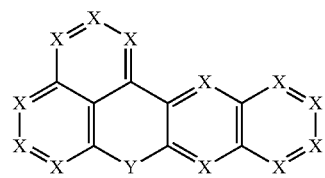

Signs in the formulae (BL-4-1) will be described.

X, Y, Z and R" are the same as those described in relation to the formulae (BL-3-1).

A structure represented by the general formula (BL-4) also includes the following.

[Chemical Formula 14]

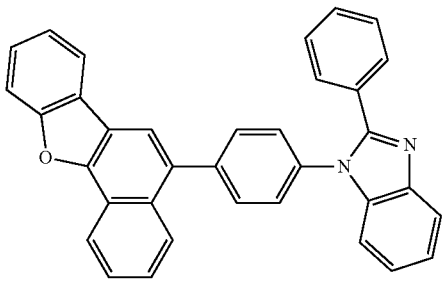

Next, structures represented by the general formula (BL-5) will be described.

[Chemical Formula 15]

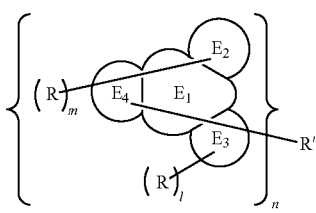

(BL-5)

Signs in the formula (BL-5) will be described.

$E_1$ to $E_4$ each represent a cyclic structure. Adjacent Es are fused to form a ring. At least one of $E_1$ to $E_4$ is structured to have a hetero atom. Another fused ring may be formed in such a manner as to cross-couple the adjacent substituents on $E_2$ to $E_4$. Such a fused cyclic structure by $E_1$ to $E_4$ is referred to as $E_1$-$E_4$ ring.

R represents a group selected from a substituted or unsubstituted alkyl group, a substituted or unsubstituted aryl group, and a substituted or unsubstituted heteroaryl group, or residues of combination of two or more thereof.

When n is 1, R' represents the same as R. When n is 2 to 6, R' represents a linking group selected from a substituted or unsubstituted alkylene group, a substituted or unsubstituted arylene group, a substituted or unsubstituted heteroarylene group, and residues of combination of two or more thereof, or R' directly bonds two $E_1$-$E_4$ rings in a single bond.

(m+1) is an integer of 0 to 11. n is an integer of 1 to 6.

When a plurality of $E_1$-$E_4$ rings and Rs are present, the plurality of $E_1$-$E_4$ rings and Rs each may be the same or different. In the formula (BL-5), a total number of $E_1$-4, R and R' included in a molecule is six or more, in which $E_1$-$E_4$, R and R' represent a ring formed by a covalent bond of non-metal atoms. m and 1 represent the number of Rs.

Examples of the alkyl group and the aryl group are preferably the same as those described in relation to the general formula (BL-1). Examples of the heteroaryl group are preferably pyridine, pyrimidine, pyrazine, pyridazine, triazine, tetrazine, pyrrole, imidazole, pyrazole, oxazole, isooxazole, furan, thiophene, thiazole, isothiazole, triazole, oxadiazole, thiadiazole, furazan, tetrazole, benzimidazole, imidazopyridine, indazole, quinoline, isoquinoline, quinoxaline, naphthyridine, benzoxazole, benzthiazole, carbazole, dibenzofuran, dibenzothiophen and phenanthroline.

The alkylene group, arylene group and heteroarylene group are preferably an n-valent residue of the groups listed above as the alkyl group, aryl group and heteroaryl group.

Examples of a structure of $E_1$-$E_4$ ring are preferably fused cyclic structures listed below in the formulae (BL-5-1).

[Chemical Formula 16]

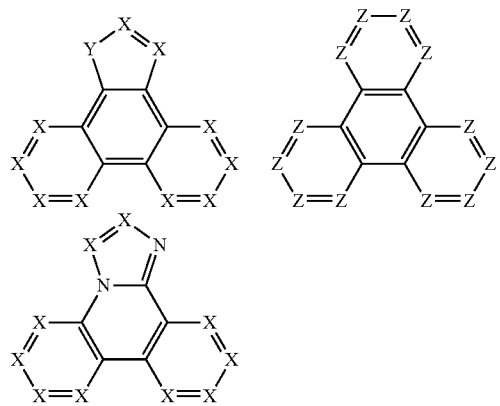

(BL-5-1)

Signs in the formulae (BL-5-1) will be described.

X, Y, Z and R" are the same as those described in relation to the formulae (BL-3-1).

Next, structures represented by the general formula (BL-6) will be described.

[Chemical Formula 17]

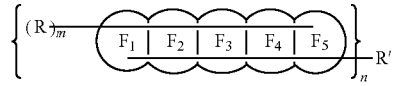

(BL-6)

Signs in the formula (BL-6) will be described.

$F_1$ to $F_5$ each represent a cyclic structure. Adjacent Fs are fused to form a ring.

At least one of $F_1$ to $F_5$ is structured to have a hetero atom. A fused ring may be formed in such a manner as to cross-couple adjacent substituents on each of Fs. Alternatively, a fused ring may be formed in such a manner as to cross-couple the adjacent Fs. Such a fused cyclic structure formed by $F_1$ to $F_5$ is referred to as $F_1$-$F_5$ ring.

R represents a group selected from a substituted or unsubstituted alkyl group, a substituted or unsubstituted aryl group, and a substituted or unsubstituted heteroaryl group, or residues of combination of two or more thereof.

When n is 1, R' represents the same as R. When n is 2 to 6, R' represents a linking group selected from a substituted or unsubstituted alkylene group, a substituted or unsubstituted arylene group, a substituted or unsubstituted heteroarylene group, and residues of combination of two or more thereof, or R' directly bonds two $F_1$-$F_5$ rings in a single bond.

m is an integer of 0 to 13. n is an integer of 1 to 6.

When a plurality of $F_1$-$F_5$ rings and Rs are present, the plurality of $F_1$-$F_5$ rings and Rs each may be the same or different. In the formula (BL-6), a total number of $F_1$ to $F_5$, R and R' included in a molecule is six or more, in which $F_1$ to $F_5$, R and R' represent a ring formed by a covalent bond of non-metal atoms, in a molecule.

Examples of the alkyl group and the aryl group are preferably the same as those described in relation to the general formula (BL-1). Examples of the heteroaryl group are preferably pyridine, pyrimidine, pyrazine, pyridazine, triazine, tetrazine, pyrrole, imidazole, pyrazole, oxazole, isooxazole, furan, thiophene, thiazole, isothiazole, triazole, oxadiazole, thiadiazole, furazan, tetrazole, benzimidazole, imidazopyridine, indazole, quinoline, isoquinoline, quinoxaline, naphthyridine, benzoxazole, benzthiazole, carbazole, dibenzofuran, dibenzothiophen and phenanthroline.

The alkylene group, arylene group and heteroarylene group are preferably an n-valent residue of the groups listed above as the alkyl group, aryl group and heteroaryl group.

Examples of a structure of $F_1$-$F_5$ ring are preferably fused cyclic structures listed below in the general formulae (BL-6-1).

[Chemical Formula 18]

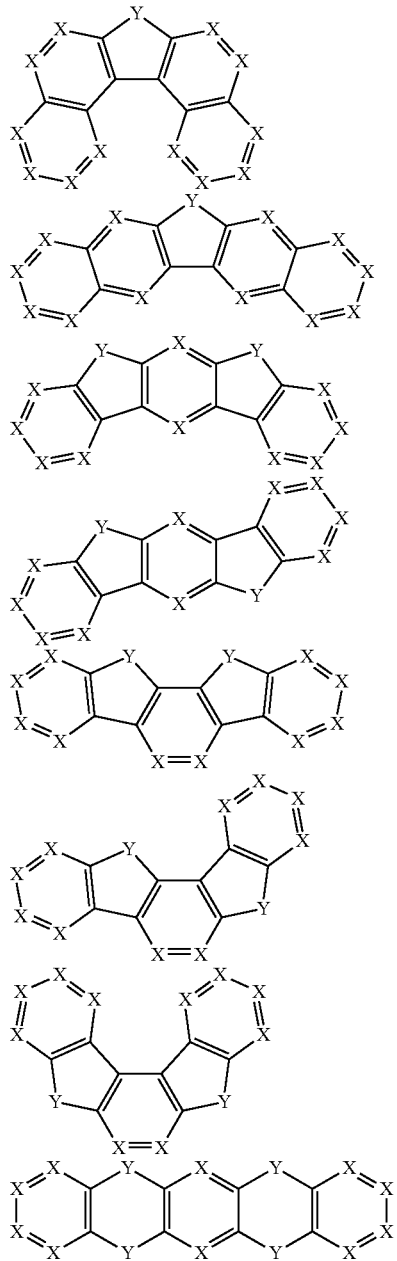

(BL-6-1)

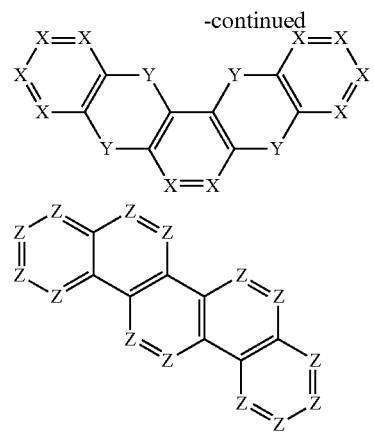

Signs in the formulae (BL-6-1) will be described.

X, Y, Z and R" are the same as those described in relation to the formulae (BL-3-1).

A structure represented by the general formula (BL-6) also includes the following.

[Chemical Formula 19]

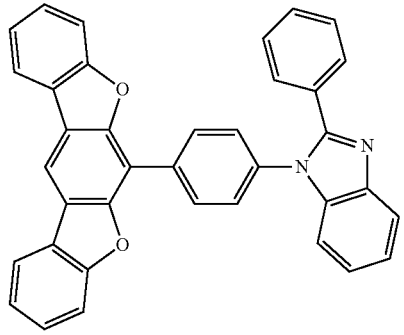

Examples of the aromatic heterocyclic derivative having six or more cyclic structures in the blocking layer are structures represented by the following general formula (BL-7). However, the aromatic heterocyclic derivative is not limited to compounds as follows.

[Chemical Formula 20]

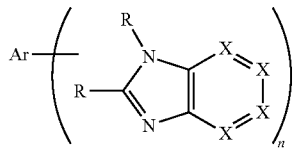

(BL-7)

Signs in the formula (BL-7) will be described.

Ar is a substituted or unsubstituted arylene group or heteroarylene group.

X independently represents CR or N. One of Rs is bonded with Ar in a single bond. The rest of Rs are independently a hydrogen atom, fluorine atom, substituted or unsubstituted alkyl group, cycloalkyl group, aryl group, heteroaryl group, alkoxy group, aryloxy group, alkylamino group, arylamino group, alkylsilyl group, arylsilyl group, nitro group, cyano group, or a linking group formed by two or three of the aryl groups and the heteroaryl groups.

n is an integer of 2 or 3.

Examples of the aryl group are preferably a phenyl group, biphenyl group, o-terphenyl group, m-terphenyl group, p-terphenyl group, naphthyl group, phenanthryl group, chrysenyl group, benzophenanthrenyl group, benzochrysenyl group, benzanthryl group, triphenyl group, fluoranthenyl group, benzofluoranthenyl group and fluorenyl group. Examples of the heteroaryl group are preferably a pyridyl group, pyrimidinyl group, pyrazinyl group, pyridazynyl group, quinolinyl group, isoquinolinyl group, quinoxalinyl group, naphthyridinyl group, imidazopyridyl group, indolyl group, indazolyl group, phenanthrolyl group, imidazolyl group, pyrazolyl group, pyrrolyl group, furanyl group, thiophenyl group, oxazolyl group, thiazolyl group, benzoxazolyl group, benzthiazolyl group, oxadiazolyl group, thiadiazolyl group, triazolyl group, tetrazolyl group, dibenzofuranyl group, dibenzothiophenyl group and carbazolyl group. The arylene group is a di- or tri-valent residue of the aryl group. The heteroarylene group is a di- or tri-valent residue of the heteroaryl group.

A structure represented by the general formula (BL-7) also includes the following.

[Chemical Formula 21]

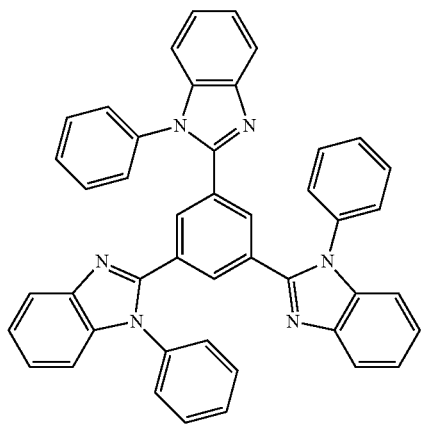

Examples of the aromatic heterocyclic derivative having six or more cyclic structures in the blocking layer are structures represented by the following general formula (BL-8). However, the aromatic heterocyclic derivative is not limited to compounds as follows.

[Chemical Formula 22]

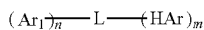
(BL-8)

Signs in the formula (BL-8) will be described.

$Ar_1$ is a fused ring group in which four or more rings having one or more rings selected from a furan ring and a pyran ring are fused.

HAr is one of nitrogen-containing heterocyclic groups represented by the following formulae (BL-8-2) to (BL-8-5).

n and m each are an integer of 0 to 5.

L is a single bond or an (n+m)-valent linking group formed in a single bond by two or three groups selected from a substituted or unsubstituted (n+m)-valent aryl group having 6 to 30 ring carbon atoms and a substituted or unsubstituted (n+m)-valent heterocyclic group having 5 to 30 ring atoms.

[Chemical Formula 23]

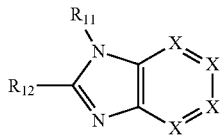
(BL-8-2)

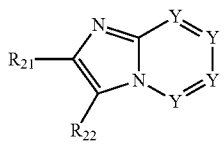
(BL-8-3)

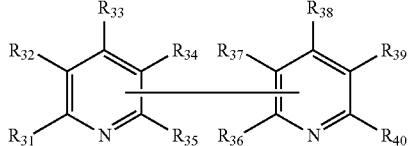
(BL-8-4)

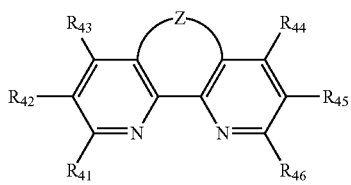
(BL-8-5)

Signs in the formulae (BL-8-2) to (BL-8-5) will be described.

$R_{11}$, $R_{12}$, $R_{21}$, $R_{22}$, $R_{31}$ to $R_{40}$ and $R_{41}$ to $R_{46}$ are independently a hydrogen atom, halogen atom, substituted or unsubstituted alkyl group having 1 to 10 carbon atoms, substituted or unsubstituted cycloalkyl group having 3 to 8 ring carbon atoms, substituted silyl group having 3 to 30 carbon atoms, cyano group, substituted or unsubstituted alkoxy group having 1 to 20 carbon atoms, substituted or unsubstituted aryloxy group having 6 to 20 ring carbon atoms, substituted or unsubstituted alkylthio group having 1 to 20 carbon atoms, amino group, substituted or unsubstituted mono- or di-alkylamino group having 1 to 20 carbon atoms, substituted or unsubstituted aryl group having 6 to 30 ring carbon atoms, or substituted or unsubstituted heterocyclic group having 5 to 30 ring atoms.

One of $R_{31}$ to $R_{35}$ and one of $R_{36}$ to $R_{40}$ are a single bond to bond two pyridine rings represented by the formula (BL-8-4).

X is selected from N or $CR_{13}$.

$R_{13}$ is a hydrogen atom, halogen atom, substituted or unsubstituted alkyl group having 1 to 10 carbon atoms, substituted or unsubstituted cycloalkyl group having 3 to 8 ring carbon atoms, substituted silyl group having 3 to 30 carbon atoms, cyano group, substituted or unsubstituted alkoxy group having 1 to 20 carbon atoms, substituted or unsubstituted aryloxy group having 6 to 20 ring carbon atoms, substituted or unsubstituted alkylthio group having 1 to 20 carbon atoms, amino group, substituted or unsubstituted mono- or di-alkylamino group having 1 to 20 carbon atoms, substituted or unsubstituted aryl group having 6 to 30 ring carbon atoms, or substituted or unsubstituted heterocyclic group having 5 to 30 ring atoms.

When a plurality of $R_{13}$s are present, $R_{13}$s may be the same or different.

Y is selected from N or $CR_{23}$.

$R_{23}$ is a hydrogen atom, halogen atom, substituted or unsubstituted alkyl group having 1 to 10 carbon atoms, substituted or unsubstituted cycloalkyl group having 3 to 8 ring carbon atoms, substituted silyl group having 3 to 30 carbon atoms, cyano group, substituted or unsubstituted alkoxy group having 1 to 20 carbon atoms, substituted or unsubstituted aryloxy group having 6 to 20 ring carbon atoms, substituted or unsubstituted alkylthio group having 1 to 20 carbon atoms, amino group, substituted or unsubstituted mono- or di-alkylamino group having 1 to 20 carbon atoms, substituted or unsubstituted aryl group having 6 to 30 ring carbon atoms, or substituted or unsubstituted heterocyclic group having 5 to 30 ring atoms.

When a plurality of $R_{23}$s are present, $R_{23}$s may be the same or different.

Z is a cross linking group: a substituted or unsubstituted alkylene group or alkenylene group.

One of $R_{11}$ to $R_{13}$, one of $R_{21}$ to $R_{23}$, one of $R_{31}$ to $R_{40}$ and one of $R_{41}$ to $R_{46}$ are a single bond to be bonded with L.

A preferred example of the aromatic heterocyclic derivative in the blocking layer is a compound (carbazole azine compound) represented by the following general formula (BL-9) or (BL-10).

[Chemical Formula 24]

(Cz-)$_m$A　　(BL-9)

In the formula (BL-9), Cz is a substituted or unsubstituted carbazolyl group or a substituted or unsubstituted azacarbazolyl group. A is an aryl-substituted nitrogen-containing ring group, diaryl-substituted nitrogen-containing ring group, or triaryl-substituted nitrogen-containing ring group. m is an integer of 1 to 3.

[Chemical Formula 25]

Cz-A$_n$　　(BL-10)

In the formula (BL-10), Cz is a substituted or unsubstituted carbazolyl group or a substituted or unsubstituted azacarbazolyl group. A is an aryl-substituted nitrogen-containing ring group, diaryl-substituted nitrogen-containing ring group, or triaryl-substituted nitrogen-containing ring group. n is an integer of 1 to 3.

Examples of A are a substituted or unsubstituted pyridine, quinoline, pyrazine, pyrimidine, quinoxaline, triazine, imidazole, imidazopyridine, pyridazine, and benzimidazole.

A preferred example of the aromatic heterocyclic derivative in the blocking layer is a compound (ladder compound) represented by the following general formula (BL-11) or (BL-12).

[Chemical Formula 26]

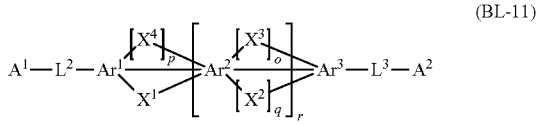

(BL-11)

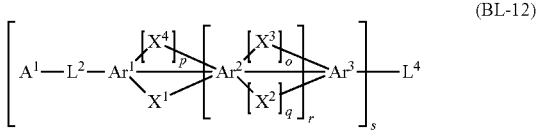

(BL-12)

Signs in the formulae (BL-11) and (BL-12) will be described.

$Ar^1$, $Ar^2$ and $Ar^3$ are independently a substituted or unsubstituted aromatic hydrocarbon group having 6 ring carbon atoms, or a substituted or unsubstituted aromatic heterocyclic group having 6 ring atoms.

$Ar^1$, $Ar^2$ and $Ar^3$ may have one or more substituent Ys. A plurality of Ys may be mutually different.

Y represents an alkyl group having 1 to 20 carbon atoms, substituted or unsubstituted cycloalkyl group having 3 to 20 ring carbon atoms, alkoxy group having 1 to 20 carbon atoms, aralkyl group having 7 to 24 carbon atoms, silyl group or substituted-silyl group having 3 to 20 carbon atoms, substituted or unsubstituted aromatic hydrocarbon group or fused aromatic hydrocarbon group having 6 to 24 ring carbon atoms, or substituted or unsubstituted aromatic heterocyclic group or fused aromatic heterocyclic group having 3 to 24 ring carbon atoms.

In the formulae (BL-11) and (BL-12), $X^1$, $X^2$, $X^3$ and $X^4$ independently represent oxygen (O), sulfur (S), N—R1 or CR2R3. CR2R3 represents R2 and R3 bonded to a carbon atom (C).

R1, R2 and R3 independently represent an alkyl group having 1 to 20 carbon atoms, substituted or unsubstituted cycloalkyl group having 3 to 20 ring carbon atoms, aralkyl group having 7 to 24 carbon atoms, silyl group or substituted-silyl group having 3 to 20 carbon atoms, substituted or unsubstituted aromatic hydrocarbon group or fused aromatic hydrocarbon group having 6 to 24 ring carbon atoms, or substituted or unsubstituted aromatic heterocyclic group or fused aromatic heterocyclic group having 3 to 24 ring carbon atoms.

However, when: both of $X_1$ and $X_2$ represent N—$R_1$; o and p are 0; and q is 1, or when: both of $X_1$ and $X_3$ represent N—R1; p and q are 0; and o is 1, at least one R1 represents a substituted or unsubstituted monovalent fused aromatic heterocyclic group having 8 to 24 ring-forming atoms.

In the formulae (BL-11) and (BL-12), o, p and q represent 0 or 1.

s represents 1, 2, 3 or 4, which respectively mean a monomer, dimer, trimer and tetramer, each of which uses $L^4$ as a linking group.

r represents 1, 2, 3 or 4. In the formulae (BL-11) and (BL-12), $L^2$ represents a single bond, an alkylene group having 1 to 20 carbon atoms, substituted or unsubstituted cycloalkylene group having 3 to 20 ring carbon atoms, divalent silyl group or divalent substituted-silyl group having 2 to 20 carbon atoms, substituted or unsubstituted divalent aromatic hydrocarbon group or fused aromatic hydrocarbon group having 6 to 24 ring carbon atoms, or substituted or unsubstituted monovalent or divalent aromatic heterocyclic group or fused aromatic heterocyclic group having 3 to 24 ring carbon atoms.

In the formula (BL-11), $L^3$ represents a single bond, an alkylene group having 1 to 20 carbon atoms, substituted or unsubstituted cycloalkylene group having 3 to 20 ring carbon atoms, divalent silyl group or divalent substituted-silyl group having 2 to 20 carbon atoms, substituted or unsubstituted divalent aromatic hydrocarbon group or fused aromatic hydrocarbon group having 6 to 24 ring carbon atoms, or substituted or unsubstituted divalent aromatic heterocyclic group or fused aromatic heterocyclic group having 3 to 24 ring carbon atoms.

In the formula (BL-12), when s is 2, $L^4$ represents a single bond, an alkylene group having 1 to 20 carbon atoms, substituted or unsubstituted cycloalkylene group having 3 to 20 ring carbon atoms, divalent silyl group or divalent substituted-silyl group having 2 to 20 carbon atoms, substituted or unsubstituted divalent aromatic hydrocarbon group or fused aromatic hydrocarbon group having 6 to 24 ring carbon atoms, or substituted or unsubstituted divalent aromatic heterocyclic group or fused aromatic heterocyclic group having 3 to 24 ring carbon atoms.

When s is 3, $L^4$ represents a trivalent saturated hydrocarbon group having 1 to 20 carbon atoms, substituted or unsubstituted trivalent saturated cyclic hydrocarbon group having 3 to 20 ring carbon atoms, trivalent silyl group or trivalent substituted-silyl group having 3 to 20 carbon atoms, substituted or unsubstituted trivalent aromatic hydrocarbon group or fused aromatic hydrocarbon group having 6 to 24 ring carbon atoms, or substituted or unsubstituted trivalent aromatic heterocyclic group or fused aromatic heterocyclic group having 3 to 24 ring carbon atoms.

When s is 4, $L^4$ represents a tetravalent saturated hydrocarbon group having 1 to 20 carbon atoms, substituted or unsubstituted tetravalent saturated cyclic hydrocarbon group having 3 to 20 ring carbon atoms, silicon atom, substituted or unsubstituted tetravalent aromatic hydrocarbon group or fused aromatic hydrocarbon group having 6 to 24 ring carbon atoms, or substituted or unsubstituted tetravalent aromatic heterocyclic group or fused aromatic heterocyclic group having 3 to 24 ring carbon atoms.

In the formulae (BL-11) and (BL-12), $A^1$ represents a hydrogen atom, substituted or unsubstituted cycloalkyl group having 3 to 20 ring carbon atoms, silyl group or substituted-silyl group having 3 to 20 carbon atoms, substituted or unsubstituted aromatic hydrocarbon group or fused aromatic hydrocarbon group having 6 to 24 ring carbon atoms, or substituted or unsubstituted aromatic heterocyclic group or fused aromatic heterocyclic group having 3 to 24 ring carbon atoms.

In the formula (BL-11), $A^2$ represents a hydrogen atom, substituted or unsubstituted cycloalkyl group having 3 to 20 ring carbon atoms, silyl group or substituted-silyl group having 3 to 20 carbon atoms, substituted or unsubstituted aromatic hydrocarbon group or fused aromatic hydrocarbon group having 6 to 24 ring carbon atoms, or substituted or unsubstituted aromatic heterocyclic group or fused aromatic heterocyclic group having 3 to 24 ring carbon atoms.

In the invention, it is preferred that one of $X^1$ and $X^4$ or one of $X^2$ and $X^3$ in the formulae (BL-11) and (BL-12) is an oxygen atom and the compounds represented by the formulae (BL-11) and (BL-12) have a dibenzofuran structure in a molecule.

In the invention, it is more preferred that one of $X^1$ and $X^4$ and one of $X^2$ and $X^3$ in the formulae (BL-11) and (BL-12) are both an oxygen atom and the compounds represented by the formulae (BL-11) and (BL-12) have a benzofurano dibenzofuran structure.

A preferred example of the aromatic heterocyclic derivative in the blocking layer is a compound represented by the following general formula (BL-13) or (BL-14).

[Chemical Formula 27]

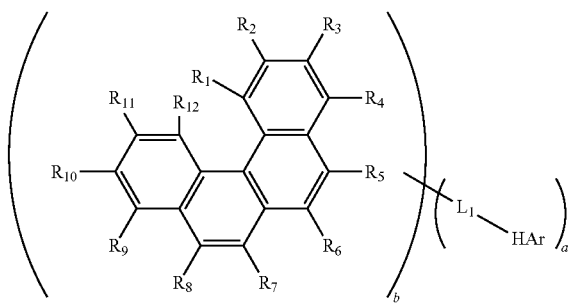

(BL-13)

In the formula (BL-13), any group selected from $R_1$ to $R_{12}$, of which the number is represented by a, is a single bond to be bonded with $L_1$. The rest groups of $R_1$ to $R_{12}$, which is represented by 12-a, are each a hydrogen atom, fluorine atom, substituted or unsubstituted aryl group having 6 to 30 ring carbon atoms, or substituted or unsubstituted heterocyclic ring having 5 to 30 ring atoms.

$L_1$ is a single bond, substituted or unsubstituted (b+1)-valent hydrocarbon ring group having 6 to 30 ring carbon atoms, or substituted or unsubstituted (b+1)-valent heterocyclic group having 5 to 30 ring atoms.

HAr is a substituted or unsubstituted nitrogen-containing heterocyclic group.

a and b each are an integer of 1 to 4, in which at least one of a and b is 1.

[Chemical Formula 28]

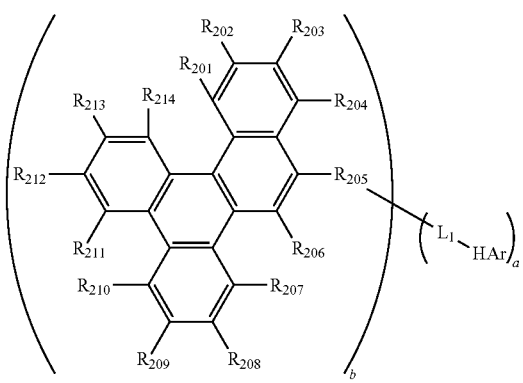

(BL-14)

In the formula (BL-14), any group selected from $R_{201}$ to $R_{214}$, of which the number is represented by a, is a single bond to be bonded with $L_1$. The rest of $R_{201}$ to $R_{214}$, which is represented by 14-a, are each a hydrogen atom, fluorine atom, substituted or unsubstituted alkyl group having 1 to 10 carbon atoms, substituted or unsubstituted cycloalkyl group having 3 to 8 carbon atoms, substituted or unsubstituted alkylsilyl group having 3 to 30 carbon atoms, substituted or unsubstituted arylsilyl group having 8 to 30 ring carbon atoms, substituted or unsubstituted alkoxy group having 1 to 20 carbon atoms, substituted or unsubstituted aryloxy group having 6 to 20 ring carbon atoms, substituted or unsubstituted aryl group having 6 to 30 ring carbon atoms, or substituted or unsubstituted heterocyclic group having 5 to 30 ring atoms.

$L_1$ is a single bond, substituted or unsubstituted (b+1)-valent hydrocarbon ring group having 6 to 30 ring carbon atoms, or substituted or unsubstituted (b+1)-valent heterocyclic group having 5 to 30 ring atoms.

HAr is a substituted or unsubstituted nitrogen-containing heterocyclic group.

a and b each are an integer of 1 to 4, in which at least one of a and b is 1.

HAr in the above formulae (BL-13) and (BL-14) is exemplified by the following formulae (BL-13-1) to (BL-13-5).

[Chemical Formula 29]

(BL-13-1)
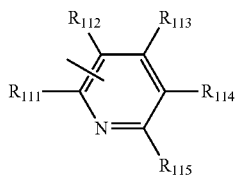

(BL-13-2)
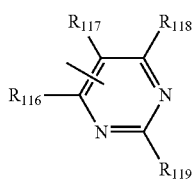

(BL-13-3)
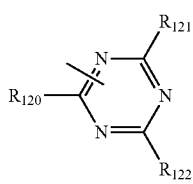

(BL-13-4)
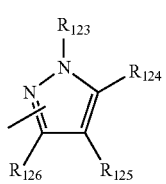

(BL-13-5)
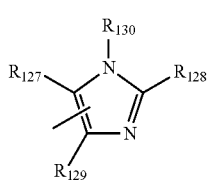

In the formulae (BL-13-1) to (BL-13-5), $R_{111}$ to $R_{130}$ are a hydrogen atom or substituent. In $R_{111}$ to $R_{130}$, adjacent substituents may be bonded with each other to form a saturated or unsaturated ring.

One of $R_{111}$ to $R_{115}$, one of $R_{116}$ to $R_{119}$, one of $R_{120}$ to $R_{122}$, one of $R_{123}$ to $R_{126}$, and one of $R_{127}$ to $R_{130}$ are each a single bond to be bonded with $L_1$.

As a blocking layer material, a nitrogen-containing heterocyclic derivative represented by the following formula (BL-15) is usable.

[Chemical Formula 30]

(BL-15)
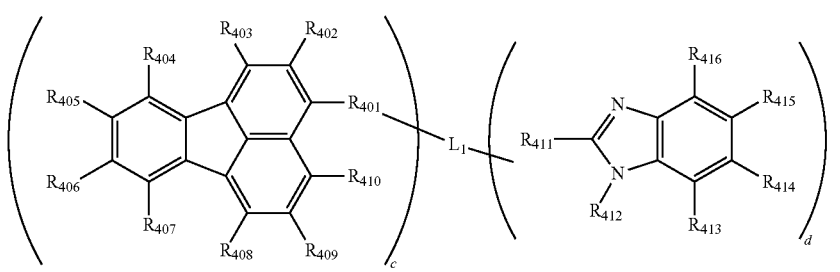

In the formula (BL-15), $R_{401}$ to $R_{416}$ are each a hydrogen atom, fluorine atom, substituted or unsubstituted alkyl group having 1 to 10 carbon atoms, substituted or unsubstituted cycloalkyl group having 3 to 10 carbon atoms, substituted or unsubstituted alkylsilyl group having 3 to 30 carbon atoms, substituted or unsubstituted arylsilyl group having 8 to 30 ring carbon atoms, substituted or unsubstituted alkoxy group having 1 to 20 carbon atoms, substituted or unsubstituted aryloxy group having 6 to 20 ring carbon atoms, substituted or unsubstituted alkylamino group, substituted or unsubstituted arylamino group, substituted or unsubstituted aryl group having 6 to 30 ring carbon atoms, or substituted or unsubstituted heterocyclic group having 5 to 30 ring atoms. One of $R_{401}$ to $R_{410}$ and one of $R_{411}$ to $R_{416}$ are a single bond to be bonded with $L_1$. In $R_{411}$ to $R_{416}$, adjacent substituents may form a saturated or unsaturated ring.

$L_1$ is a single bond, substituted or unsubstituted (c+d)-valent hydrocarbon group having 6 to 30 ring carbon atoms, or substituted or unsubstituted (c+d)-valent heterocyclic group having 5 to 30 ring atoms.

c and d each represent an integer of 1 to 3, provided that $L_1$ and $R_{401}$ to $R_{416}$ are not an anthracene-containing group.

A preferred example of the aromatic heterocyclic derivative in the blocking layer is a compound represented by the following general formula (BL-18).

[Chemical Formula 31]

(BL-18)
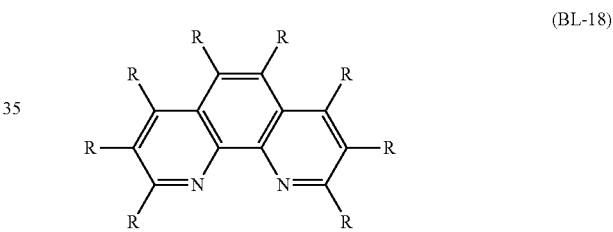

In the formula (BL-18), R independently represents a hydrogen atom, fluorine atom, substituted or unsubstituted alkyl group, cycloalkyl group, aryl group, heteroaryl group, alkoxy group, aryloxy group, alkylamino group, arylamino group, alkylsilyl group, arylsilyl group, nitro group, cyano group, or a linking group formed by two or three of the aryl groups and the heteroaryl groups.

Examples of the aryl group are preferably a phenyl group, biphenyl group, o-terphenyl group, m-terphenyl group, p-terphenyl group, naphthyl group, phenanthryl group, chrysenyl group, benzophenanthryl group, benzochrysenyl group, benzanthryl group, triphenyl group, fluoranthenyl group, benzofluoranthenyl group and fluorenyl group. Examples of the heteroaryl group are preferably a pyridyl group, pyrimidinyl group, pyrazinyl group, pyridazynyl group, quinolinyl group, isoquinolinyl group, quinoxalinyl group, naphthyridinyl group, imidazopyridyl group, indolyl group, indazolyl group, phenanthrolyl group, imidazolyl group, pyrazolyl group, pyrrolyl group, furanyl group, thiophenyl group, oxazolyl group, thiazolyl group, benzoxazolyl group, benzthiazolyl group, oxadiazolyl group, thiadiazolyl group, triazolyl group, tetrazolyl group, dibenzofuranyl group, dibenzothiophenyl group and carbazolyl group.

For instance, the following compound is listed as an example.

[Chemical Formula 32]

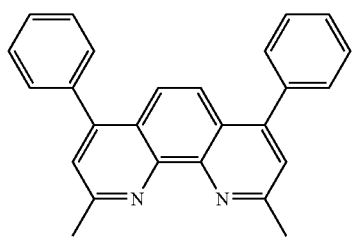

A preferred example of the aromatic heterocyclic derivative in the blocking layer is a compound represented by the following general formula (BL-19).

[Chemical Formula 33]

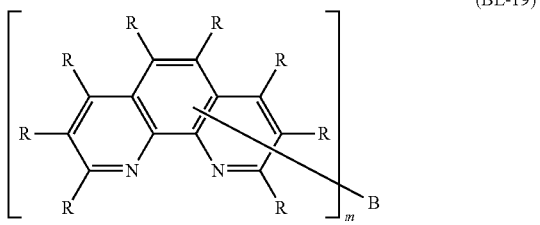

(BL-19)

In the formula (BL-19), one of Rs is a single bond to be bonded with B. The rest of Rs independently represent a hydrogen atom, fluorine atom, substituted or unsubstituted alkyl group, cycloalkyl group, aryl group, heteroaryl group, alkoxy group, aryloxy group, alkylamino group, arylamino group, alkylsilyl group, arylsilyl group, nitro group, cyano group, or a linking group formed by two or three of the aryl groups and the heteroaryl groups. m is an integer of 2 or more. B is a single bond or a linking group. Specifically, B is a substituted or unsubstituted m-valent alkylene group, substituted or unsubstituted alkenylene group, substituted or unsubstituted m-valent arylene group, substituted or unsubstituted m-valent heteroarylene group, m-valent linking group formed by two to four aryl groups and heteroaryl groups, or m-valent group represented by the following formula (BL-20).

[Chemical Formula 34]

(BL-20)

In the formula (BL-20), Ar' is independently a substituted or unsubstituted arylene group or heteroarylene group. a represents a bonding position with a phenanthroline structure shown in the formula (BL-19). Y is O, S or CR'2. R' is independently a substituted or unsubstituted alkyl group, substituted or unsubstituted aryl group, substituted or unsubstituted heteroaryl group. R's may be bonded to each other to form a saturated or unsaturated ring. j and k are independently an integer of 1 or more, which satisfies j+k=m.

Examples of the aryl group are preferably a phenyl group, biphenyl group, o-terphenyl group, m-terphenyl group, p-terphenyl group, naphthyl group, phenanthryl group, chrysenyl group, benzophenanthryl group, benzochrysenyl group, benzanthryl group, triphenyl group, fluoranthenyl group, benzofluoranthenyl group and fluorenyl group. Examples of the heteroaryl group are preferably a pyridyl group, pyrimidinyl group, pyrazinyl group, pyridazynyl group, quinolinyl group, isoquinolinyl group, quinoxalinyl group, naphthyridinyl group, imidazopyridyl group, indolyl group, indazolyl group, phenanthrolyl group, imidazolyl group, pyrazolyl group, pyrrolyl group, furanyl group, thiophenyl group, oxazolyl group, thiazolyl group, benzoxazolyl group, benzthiazolyl group, oxadiazolyl group, thiadiazolyl group, triazolyl group, tetrazolyl group, dibenzofuranyl group, dibenzothiophenyl group and carbazolyl group.

For instance, the following compound is listed as an example.

[Chemical Formula 35]

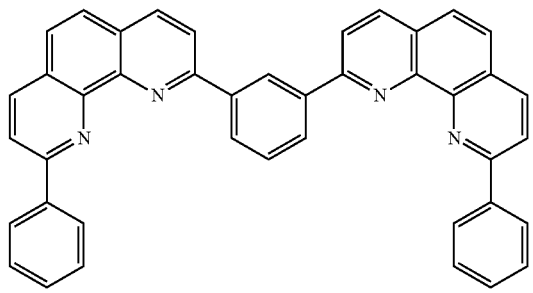

The electron injecting layer is interposed between the blocking layer and the cathode. The electron injecting layer facilitates electron injection from the cathode. Specifically, for instance, the electron injecting layer may have a stacked structure of an alkali metal compound, alkali metal or alkali metal complex on a typical electron transporting material. A material for forming the blocking layer may be doped with a donor represented by an alkali metal compound, alkali metal or alkali metal complex.

In the invention, an electron mobility of the aromatic heterocyclic derivative in the blocking layer is preferably $10^{-6}$ cm$^2$/Vs or more in an electric field intensity of 0.04 MV/cm to 0.5 MV/cm.

This electron mobility aims for promotion of electron injection to the emitting layer and improvement in exciton density in the emitting layer to effectively cause the TTF phenomenon.

A film thickness of the blocking layer in the invention is preferably 10 nm or less. This film thickness aims for prevention of triplet exciton diffusion and reduction of suppression of electron injection to the emitting layer even at a low electron mobility of the blocking layer, thereby effectively causing the TTF phenomenon.

The electron mobility of the aromatic heterocyclic derivative in the blocking layer is effective at $1 \times 10^{-8}$ cm$^2$/Vs or less in an electric field intensity of 0.04 MV/cm to 0.5 MV/cm.

In the electron injecting layer of the invention, the electron mobility is preferably $1\times10^{-6}$ cm$^2$/Vs or more in an electric field intensity of 0.04 MV/cm to 0.5 MV/cm.

This electron mobility aims for promotion of electron injection to the emitting layer and improvement in exciton density in the emitting layer to effectively cause the TTF phenomenon.

Examples of the donor to be doped in the above electron injecting layer are as follows.

A donor metal refers to a metal having a work function of 3.8 eV or less. The donor metal is preferably an alkali metal, alkali earth metal and rare earth metal, more preferably Cs, Li, Na, Sr, K, Mg, Ca, Ba, Yb, Eu and Ce.

A donor metal compound is a compound including the above donor metal, preferably a compounding including the alkali metal, alkali earth metal and rare earth metal, more preferably a halogenide, oxide, carbonate and borate of these metals. Compounds represented by MOx (M: a donor metal, x: 0.5 to 1.5), MFx (x: 1 to 3) and M(CO$_3$)x (x: 0.5 to 1.5) are exemplified.

A donor metal complex is a complex of the above donor metal, preferably an organic metal complex of the alkali metal, alkali earth metal or rare earth metal. The organic metal complex represented by the following formula (1) is preferable.

[Chemical Formula 36]

(I)

In the formula (I), M is a donor metal; Q is a ligand, preferably a carboxylic acid derivative, diketone derivative or quinoline derivative; and n is an integer of 1 to 4.

The donor metal complex is exemplified by a tungsten waterwheel disclosed in JP-A-2005-72012. Alternatively, a phthalocyanine compound and the like with a central metal of an alkali metal or an alkali earth metal, which are disclosed in JP-A-11-345687, are usable as the donor metal complex.

One type of the above donors may be used alone or two or more types may be used in combination.

A compound for the electron injecting layer is exemplified by a compound represented by the following formula (EIL-1).

[Chemical Formula 37]

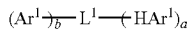

(EIL-1)

In the formula (EIL-1), HAr$^1$ is a substituted or unsubstituted nitrogen-containing heterocyclic group, preferably having the following structures.

[Chemical Formula 38]

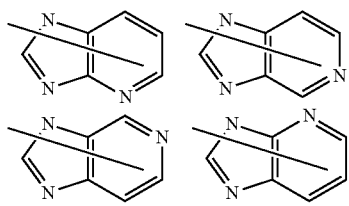

-continued

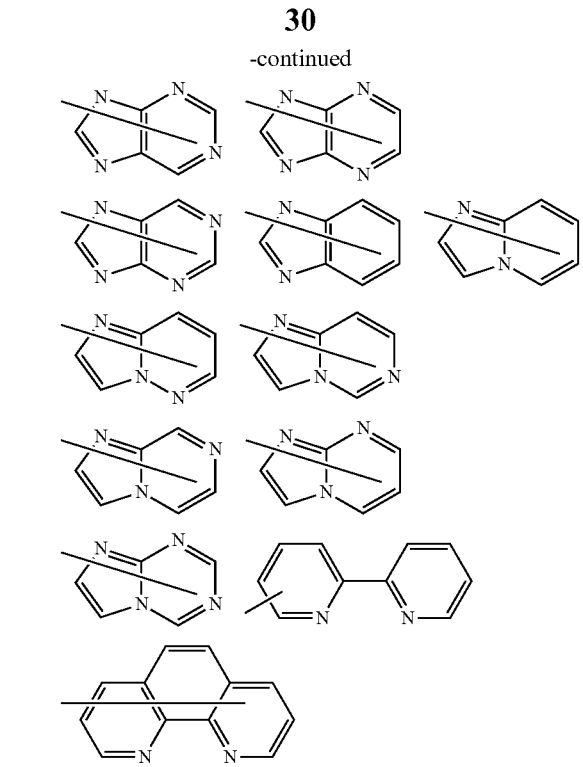

Examples of a substituent for HAr$^1$ in the formula (EIL-1) includes a fluorine atom, cyano group, substituted or unsubstituted alkyl group having 1 to 20 carbon atoms, substituted or unsubstituted cycloalkyl group having 3 to 20 carbon atoms, substituted or unsubstituted alkylsilyl group having 3 to 20 carbon atoms, substituted or unsubstituted arylsilyl group having 8 to 30 carbon atoms, substituted or unsubstituted alkoxy group having 1 to 20 carbon atoms, substituted or unsubstituted aryloxy group having 6 to 30 carbon atoms, substituted or unsubstituted aryl group having 6 to 30 ring carbon atoms and substituted or unsubstituted heterocyclic group having 5 to 30 ring atoms.

In the formula (EIL-1), Ar$^1$ is a substituted or unsubstituted fused ring group having 10 to 30 ring carbon atoms, preferably having the following fused cyclic structures.

[Chemical Formula 39]

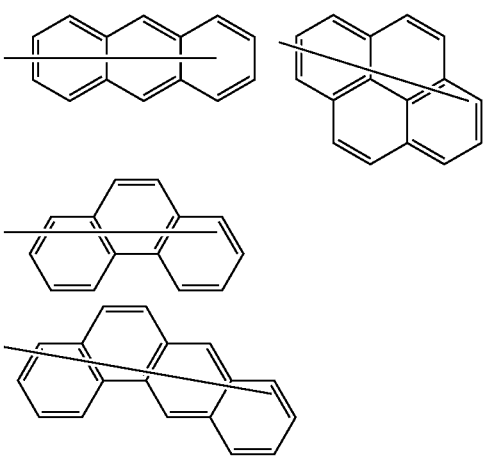

-continued

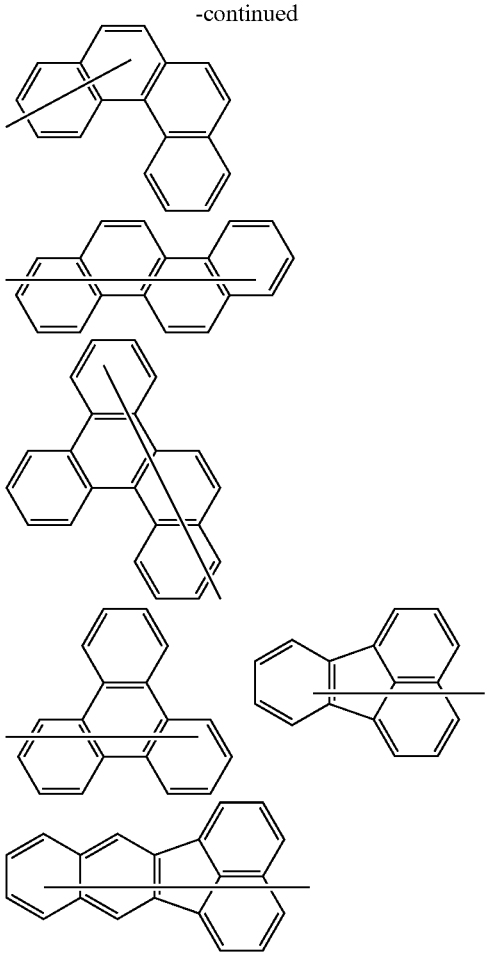

Examples of a substituent for Ar¹ in the formula (EIL-1) includes a fluorine atom, cyano group, substituted or unsubstituted alkyl group having 1 to 20 carbon atoms, substituted or unsubstituted cycloalkyl group having 3 to 20 carbon atoms, substituted or unsubstituted alkylsilyl group having 3 to 20 carbon atoms, substituted or unsubstituted arylsilyl group having 8 to 30 carbon atoms, substituted or unsubstituted alkoxy group having 1 to 20 carbon atoms, substituted or unsubstituted aryloxy group having 6 to 30 carbon atoms, substituted or unsubstituted aryl group having 6 to 30 ring carbon atoms and substituted or unsubstituted heterocyclic group having 5 to 30 ring atoms.

In the formula (EIL-1), L¹ represents a single bond, substituted or unsubstituted (a+b)-valent hydrocarbon cyclic group having 6 to 30 ring carbon atoms, substituted or unsubstituted (a+b)-valent heterocyclic group having 5 to 30 ring atoms, substituted or unsubstituted hydrocarbon cyclic group having 6 to 30 ring carbon atoms, or (a+b)-valent group formed by linking a plurality of substituted or unsubstituted heterocyclic groups each having 5 to 30 ring atoms.

Examples of a substituent for L¹ in the formula (EIL-1) includes a fluorine atom, cyano group, substituted or unsubstituted alkylsilyl group having 3 to 20 carbon atoms, substituted or unsubstituted arylsilyl group having 8 to 30 carbon atoms, substituted or unsubstituted aryl group having 6 to 30 ring carbon atoms and substituted or unsubstituted heterocyclic group having 5 to 30 ring atoms.

In the formula (EIL-1), a is an integer of 1 to 3, preferably a=1.

In the formula (EIL-1), b is an integer of 1 to 3, preferably b=1.

A compound for the electron injecting layer is exemplified by a compound represented by the following formula (EIL-2).

[Chemical Formula 40]

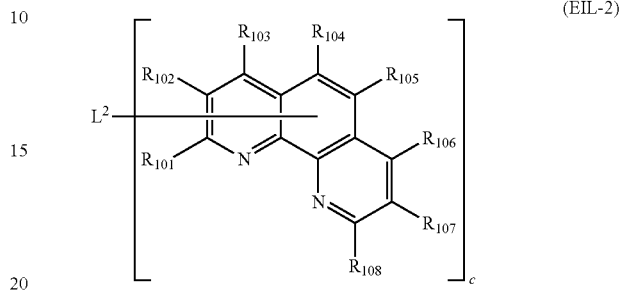

In the formula (EIL-2), one of $R_{101}$ to $R_{108}$ is bonded to $L^2$ in a single bond. The rest of $R_{101}$ to $R_{108}$ are a hydrogen atom or a substituent.

Examples of the substituent for $R_{101}$ to $R_{108}$ in the formula (EIL-2) are the same as those listed in the formula (EIL-1). A preferred example is an alkyl group having 1 to 20 carbon atoms or an aryl group having 6 to 30 ring carbon atoms.

In the formula (EIL-2), $L^2$ represents a single bond or a linking group, in which the linking group is a c-valent aromatic hydrocarbon group or c-valent group having a structure represented by the following formula (EIL-2-1).

[Chemical Formula 41]

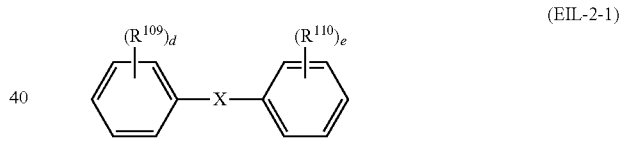

In the formula (EIL-2-1), $R^{109}$ to $R^{110}$ are a hydrogen atom or a substituent.

In the formula (EIL-2-1), d and e are independently an integer of 1 to 5.

In the formula (EIL-2-1), X is selected from the following structures.

[Chemical Formula 42]

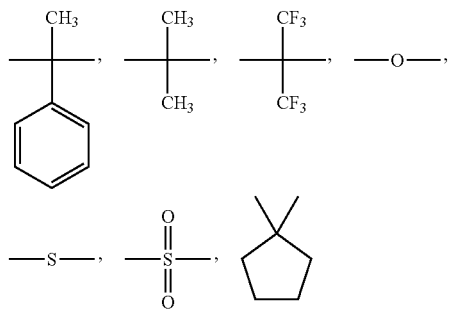

In the formula (EIL-2), c is an integer of 2 to 4, preferably c is 2.

Among the compounds represented by the formula (EIL-2), a compound bonded to $L^2$ in $R_{101}$ and represented by the following formula (EIL-2-2) is preferable.

[Chemical Formula 43]

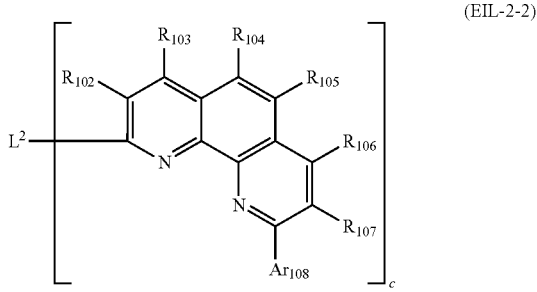

(EIL-2-2)

In the formula (EIL-2-2), $R_{102}$ to $R_{107}$ are a hydrogen atom or a substituent, preferably a hydrogen atom.

In the formula (EIL-2-2), c and $L^2$ are the same as those in the formula (EIL-2).

In the formula (EIL-2-2), c is preferably 2.

In the formula (EIL-2-2), $L^2$ is preferably a substituted or unsubstituted phenylene group or a substituted or unsubstituted naphthylene group.

In the formula (EIL-2-2), $Ar_{108}$ represents a hydrogen atom, alkyl group having 1 to 20 carbon atoms or substituted or unsubstituted aryl group having 6 to 30 ring carbon atoms, more preferably a methyl group, t-butyl group, substituted or unsubstituted phenyl group or substituted or unsubstituted naphthyl group.

Conditions to efficiently cause the TTF phenomenon will be described in terms of a relationship between the affinity of the host and that of the dopant. Hereinafter, the affinity of the host is described as $A_h$, the affinity of the dopant as $A_d$, ionization potential of the host as $I_h$ and ionization potential of the dopant as $I_d$.

Now, the conditions will be described according to the following cases.

[1] Case of $A_h > A_d$
[2] Case of $A_h < A_d$
[3] Case where a dopant satisfying $A_h < A_d$ and a dopant satisfying $A_h > A_d$ coexist

[1] Case of $A_h > A_d$

A case where a relationship of $A_h > A_d$ is satisfied will be described. The dopant used in this exemplary embodiment is a dopant emitting fluorescent light of a main peak wavelength of 550 nm or less (hereinafter occasionally referred to as a fluorescent dopant having a main peak wavelength of 550 nm or less). The dopant exhibits a relatively large energy gap. Accordingly, when the relationship of $A_h > A_d$ is satisfied, a relationship of $I_h > I_d$ is simultaneously satisfied. Consequently, the dopant easily functions as a hole trap.

Figure 4:
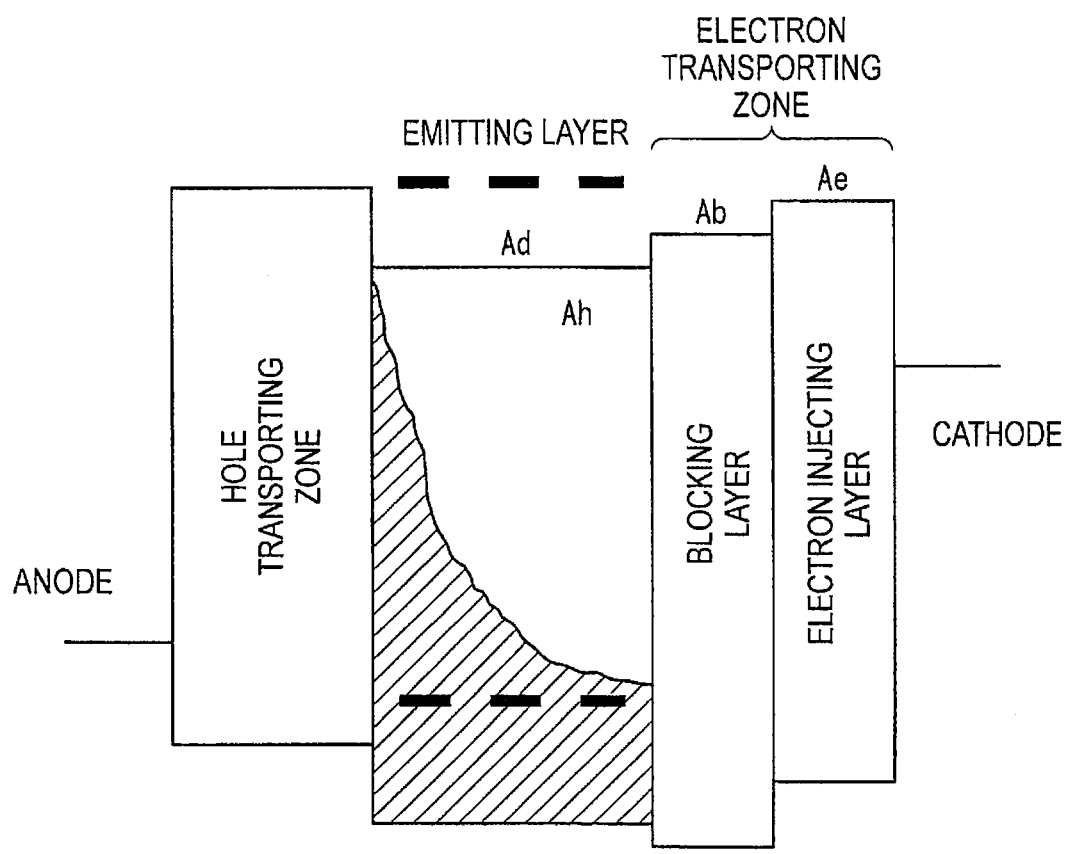
FIG. 4 is an energy band diagram showing a case where an affinity of a host (Ah)>an affinity of a dopant (Ad) is satisfied.

For instance, FIG. 4 shows an Ip-Af relationship of the host and the dopant in the emitting layer in the above case. In FIG. 4, a shaded area in the emitting layer shows an exciton-density distribution. The same applies to FIGS. 5 to 7. FIG. 4 shows the relationship in the case of $A_h > A_b > A_e$.

When a gap in ionization potential between the host and the dopant becomes large, the dopant is likely to have a hole-trapping property, whereby triplet excitons are generated not only on the host molecule but directly on the dopant molecule. Consequently, the triplet excitons generated directly on the dopant are increased. When a relationship of $E^T_h < E^T_d$ is satisfied, triplet exciton energy on the dopant molecule is transferred onto the host molecule by Dexter energy transfer, resulting in that all the triplet excitons gather on the host. As a result, the TTF phenomenon occurs efficiently.

In the invention, it is preferred that the hole transporting layer is adjacent to the emitting layer in the hole transporting zone and a triplet energy $E^T_{ho}$ of the hole transporting layer is larger than a triplet energy $E^T_h$ of the host.

When the dopant has a hole-trapping property, the holes injected from the hole transporting zone to the emitting layer are trapped by the dopant. Accordingly, recombination often occurs in the emitting layer near the anode. A typically-known hole transporting material used for the hole transporting zone often exhibits a larger triplet energy than the host. Accordingly, diffusion of the triplet excitons on holes-side has not been a problem.

However, even though recombination often occurs near the anode, the triplet exciton density in the interface of the electron transporting zone cannot be ignored. Even under such conditions, highly efficient recombination can be achieved by increasing the triplet energy of the blocking layer.

Other factors to determine recombination areas are a carrier mobility, ionization potential, affinity and film thickness of each of the hole transporting zone and the electron transporting zone. For instance, when the film thickness of the hole transporting zone is thicker than that of the electron transporting zone, an amount of the electrons injected to the emitting layer is relatively decreased. As a result, the recombination areas are shifted near the electron transporting zone. In such a case, when the blocking layer having a large triplet energy as in the invention is used, the TTF phenomenon can be efficiently induced.

The host and the dopant that satisfy the above relationship in the affinity are selected from, for instance, the following compounds (see JP-A-2010-50227 (Japanese Patent Application No. 2008-212102) and the like).

The host is an anthracene derivative and a polycyclic aromatic skeleton-containing compound, preferably the anthracene derivative.

The dopant is at least one compound selected from the group consisting of a pyrene derivative, aminoanthracene derivative, aminochrysene derivative and aminopyrene derivative.

Examples of preferable combinations of the host and the dopant are the anthracene derivative as the host and at least one compound selected from the group consisting of a pyrene derivative, aminoanthracene derivative, aminochrysene derivative and aminopyrene derivative as the dopant.

The aminoanthracene derivative is exemplified by a compound represented by the following formula (4).

[Chemical Formula 44]

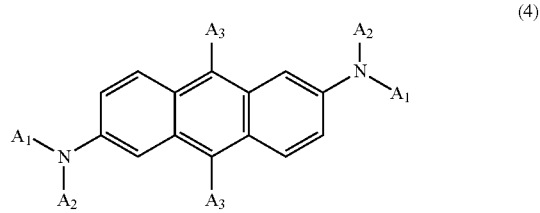

(4)

In the formula (4), $A_1$ and $A_2$ independently represent a substituted or unsubstituted aliphatic hydrocarbon group having 1 to 6 carbon atoms, substituted or unsubstituted aromatic hydrocarbon group having 6 to 20 ring carbon atoms, or substituted or unsubstituted heterocyclic aromatic hydrocarbon group having 5 to 19 ring atoms and containing nitrogen, sulfur or oxygen atom.

$A_3$ independently represents a substituted or unsubstituted aliphatic hydrocarbon group having 1 to 6 carbon atoms, substituted or unsubstituted aromatic hydrocarbon group having 6 to 20 ring carbon atoms, substituted or unsubstituted heterocyclic aromatic hydrocarbon group having 5 to 19 ring atoms, or a hydrogen atom. The heterocyclic aromatic hydrocarbon group includes nitrogen, sulfur or oxygen atom.

The aminochrysene derivative is exemplified by a compound represented by the following formula (5).

[Chemical Formula 45]

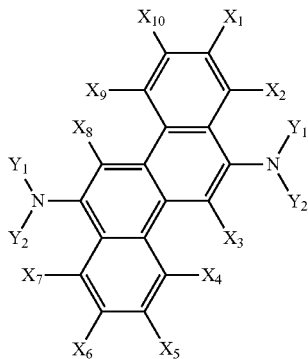

(5)

In the formula (5), $X_1$ to $X_{10}$ each represent a hydrogen atom or a substituent. $Y_1$ and $Y_2$ each represent a substituent.

$X_1$ to $X_{10}$ are preferably a hydrogen atom. $Y_1$ and $Y_2$ are preferably a substituted or unsubstituted aromatic ring having 6 to 30 ring carbon atoms. The substituent of the aromatic ring is preferably an alkyl group having 1 to 6 carbon atoms. The aromatic ring is preferably an aromatic ring having 6 to 10 ring carbon atoms or a phenyl group.

The aminopyrene derivative is exemplified by a compound represented by the following formula (6).

[Chemical Formula 46]

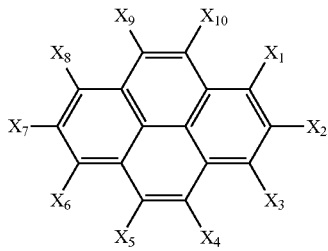

(6)

In the formula (6), $X_1$ to $X_{10}$ each represent a hydrogen atom or a substituent. $X_3$ and $X_8$ or $X_2$ and $X_7$ each represent —$NY_1Y_2$ ($Y_1$ and $Y_2$: substituents). When $X_3$ and $X_8$ each represent —$NY_1Y_2$, it is preferred that $X_{2,4,5,7,9,10}$ represent a hydrogen atom, $X_1$ and $X_6$ represent a hydrogen atom, alkyl group or cycloalkyl group. When $X_2$ and $X_7$ each represent —$NY_1Y_2$, it is preferred that $X_{1,3-6,8-10}$ are a hydrogen atom.

$Y_1$ and $Y_2$ are preferably a substituted or unsubstituted aromatic ring, e.g., a phenyl group and a naphthyl group. The substituent of the aromatic ring is exemplified by an alkyl group having 1 to 6 carbon atoms.

The anthracene derivative is preferably a compound represented by the following formula (7).

[Chemical Formula 47]

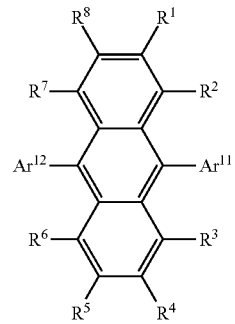

(7)

In the formula (7), $Ar^{11}$ and $Ar^{12}$ independently represent a substituted or unsubstituted aryl group having 6 to 50 ring carbon atoms, or a substituted or unsubstituted heterocyclic group having 5 to 50 ring atoms. $R^1$ to $R^8$ independently represent a group selected from a hydrogen atom, a substituted or unsubstituted aryl group having 6 to 50 ring carbon atoms, substituted or unsubstituted heterocyclic group having 5 to 50 ring atoms, substituted or unsubstituted alkyl group having 1 to 50 carbon atoms, substituted or unsubstituted cycloalkyl group having 3 to 50 ring carbon atoms, substituted or unsubstituted alkoxy group having 1 to 50 carbon atoms, substituted or unsubstituted aralkyl group having 7 to 50 carbon atoms, substituted or unsubstituted aryloxy group having 6 to 50 ring carbon atoms, substituted or unsubstituted arylthio group having 6 to 50 ring carbon atoms, substituted or unsubstituted alkoxycarbonyl group having 2 to 50 carbon atoms, substituted or unsubstituted silyl group, carboxyl group, halogen atom, cyano group, nitro group and hydroxy group.

Among these anthracene derivatives, one of the following anthracene derivatives (A), (B) and (C) is preferably selected according to an arrangement and a desired property of an organic EL device to be applied.

Anthracene Derivative (A)

In the anthracene derivative, $Ar^{11}$ and $Ar^{12}$ of the formula (7) are independently a substituted or unsubstituted fused aryl group having 10 to 50 ring carbon atoms. The anthracene derivative can be classified into the cases: a case where the substituted or unsubstituted fused aryl groups represented by $Ar^{11}$ and $Ar^{12}$ are the same; and a case where the substituted or unsubstituted fused aryl groups represented by $Ar^{11}$ and $Ar^{12}$ are different.

Specifically, examples of the anthracene derivative are anthracene derivatives represented by the following formulae (7-1) to (7-3) and an anthracene derivative in which $Ar^{11}$ and $Ar^{12}$ are mutually different substituted or unsubstituted fused aryl groups.

In the anthracene derivative represented by the following formula (7-1), $Ar^{11}$ and $Ar^{12}$ are a substituted or unsubstituted 9-phenanthrenyl group.

[Chemical Formula 48]

(7-1)

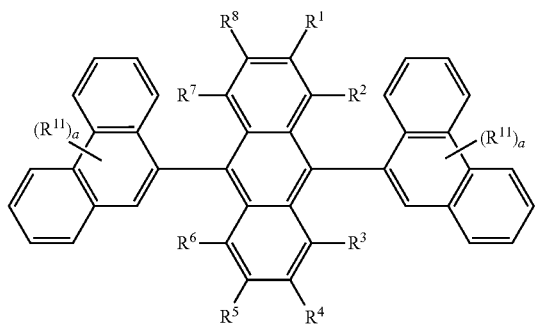

In the formula (7-1), $R^1$ to $R^8$ represent the same as described above.

$R^{11}$ independently represents a group selected from a hydrogen atom, a substituted or unsubstituted aryl group having 6 to 50 ring carbon atoms, a substituted or unsubstituted heterocyclic group having 5 to 50 ring atoms, substituted or unsubstituted alkyl group having 1 to 50 carbon atoms, substituted or unsubstituted cycloalkyl group having 3 to 50 ring carbon atoms, substituted or unsubstituted alkoxy group having 1 to 50 carbon atoms, substituted or unsubstituted aralkyl group having 7 to 50 carbon atoms, substituted or unsubstituted aryloxy group having 6 to 50 ring carbon atoms, substituted or unsubstituted arylthio group having 6 to 50 ring carbon atoms, substituted or unsubstituted alkoxycarbonyl group having 2 to 50 carbon atoms, substituted or unsubstituted silyl group, carboxyl group, halogen atom, cyano group, nitro group and hydroxy group.

a is an integer of 0 to 9. When a is an integer of 2 or more, a plurality of $R^{11}$s may be mutually the same or different under conditions that two substituted or unsubstituted phenanthrenyl groups are the same.

In the anthracene derivative represented by the following formula (7-2), $Ar^{11}$ and $Ar^{12}$ of the formula (7) are a substituted or unsubstituted 2-naphthyl group.

[Chemical Formula 49]

(7-2)

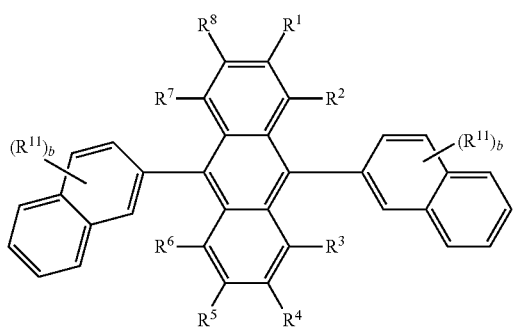

In the formula (7-2), $R^1$ to $R^8$ and R" represent the same as described above.

b is an integer of 1 to 7. When b is an integer of 2 or more, a plurality of $R^{11}$s may be mutually the same or different, provided that two substituted or unsubstituted 2-naphthyl groups are the same.

In the anthracene derivative represented by the following formula (7-3), $Ar^{11}$ and $Ar^{12}$ of the formula (7) are a substituted or unsubstituted 1-naphthyl group.

[Chemical Formula 50]

(7-3)

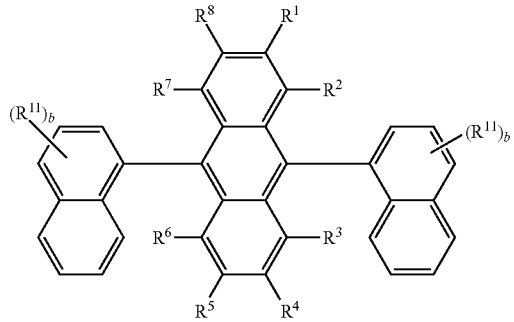

In the formula (7-3), $R^1$ to $R^8$ and $R^{11}$ and b represent the same as described above. When b is an integer of 2 or more, a plurality of $R^{11}$s may be mutually the same or different, provided that two substituted or unsubstituted 1-naphthyl groups are the same.

In the anthracene derivative in which $Ar^{11}$ and $Ar^{12}$ of the formula (7) are different substituted or unsubstituted fused aryl group, $Ar^{11}$ and $Ar^{12}$ are preferably one of a substituted or unsubstituted 9-phenanthrenyl group, substituted or unsubstituted 1-naphthyl group and substituted or unsubstituted 2-naphthyl group.

Specifically, it is preferable when $Ar^{11}$ is a 1-naphthyl group and $Ar^{12}$ is a 2-naphthyl group, when $Ar^{11}$ is a 1-naphthyl group and $Ar^{12}$ is a 9-phenanthrenyl group, and when $Ar^{11}$ is a 2-naphthyl group and $Ar^{12}$ is a 9-phenanthrenyl group.

Anthracene Derivative (B)

In this anthracene derivative, one of $Ar^{11}$ and $Ar^{12}$ of the formula (7) is a substituted or unsubstituted phenyl group and the other of $Ar^{11}$ and $Ar^{12}$ is a substituted or unsubstituted fused aryl group having 10 to 50 ring carbon atoms. Examples of the anthracene derivative are anthracene derivatives represented by the following formulae (7-4) to (7-5).

In the anthracene derivative represented by the following formula (7-4), $Ar^{11}$ of the formula (7) is a substituted or unsubstituted 1-naphthyl group and $Ar^{12}$ is a substituted or unsubstituted phenyl group.

[Chemical Formula 51]

(7-4)

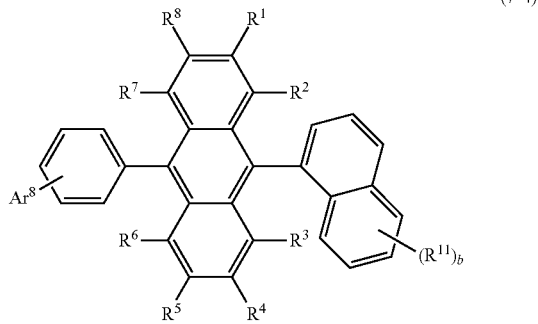

In the formula (7-4), $R^1$ to $R^8$ and R" and b represent the same as described above.

$Ar^6$ represents a substituted or unsubstituted aryl group having 6 to 50 ring carbon atoms, substituted or unsubstituted alkyl group having 1 to 50 carbon atoms, substituted or unsubstituted cycloalkyl group having 3 to 50 ring carbon atoms, substituted or unsubstituted aralkyl group having 7 to 50 carbon atoms, substituted or unsubstituted heterocyclic group having 5 to 50 ring atoms, 9,9-dimethylfluorene-1-yl group, 9,9-dimethylfluorene-2-yl group, 9,9-dimethylfluorene-3-yl group, 9,9-dimethylfluorene-4-yl group, dibenzofuran-1-yl group, dibenzofuran-2-yl group, dibenzofuran-3-yl group, or dibenzofuran-4-yl group. With a benzene ring to which $Ar^6$ is bonded, $Ar^6$ may form a ring such as a substituted or unsubstituted fluorenyl group and substituted or unsubstituted dibenzofuranyl group. When b is an integer of 2 or more, the plurality of $R^{11}$s may be mutually the same or different.

In the anthracene derivative represented by the following formula (7-5), $Ar^{11}$ of the formula (7) is a substituted or unsubstituted 2-naphthyl group and $Ar^{12}$ is a substituted or unsubstituted phenyl group.

[Chemical Formula 52]

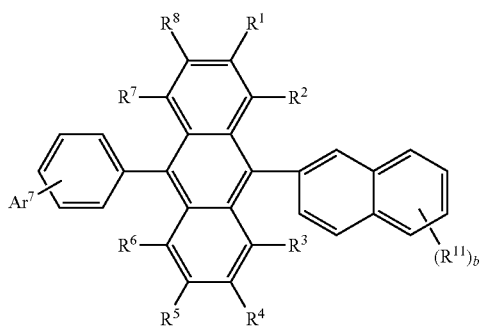

(7-5)

In the formula (7-5), $R^1$ to $R^8$ and $R^{11}$ and b represent the same as described above. $Ar^7$ represents a substituted or unsubstituted aryl group having 6 to 50 ring carbon atoms, substituted or unsubstituted heterocyclic group having 5 to 50 ring atoms, substituted or unsubstituted alkyl group having 1 to 50 carbon atoms, substituted or unsubstituted cycloalkyl group having 3 to 50 ring carbon atoms, substituted or unsubstituted aralkyl group having 7 to 50 carbon atoms, dibenzofuran-1-yl group, dibenzofuran-2-yl group, dibenzofuran-3-yl group, or dibenzofuran-4-yl group. With a benzene ring to which $Ar^7$ is bonded, $Ar^7$ may form a ring such as a substituted or unsubstituted fluorenyl group and substituted or unsubstituted dibenzofuranyl group. When b is an integer of 2 or more, the plurality of $R^{11}$s may be mutually the same or different.

Anthracene Derivative (C)

The anthracene derivative is represented by the following formula (7-6). Specifically, the anthracene derivative is preferably a derivative represented by one of the following formulae (7-6-1), (7-6-2) and (7-6-3).

[Chemical Formula 53]

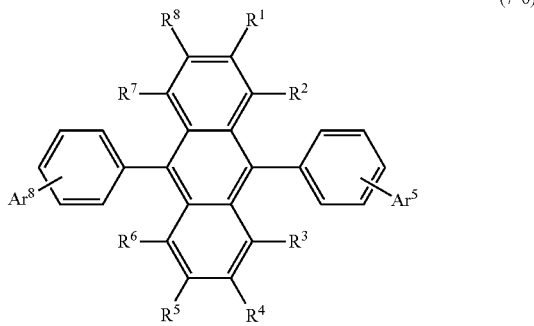

(7-6)

In the formula (7-6), $R^1$ to $R^8$ and $Ar^6$ represent the same as described above. $Ar^5$ represents a substituted or unsubstituted aryl group having 6 to 50 ring carbon atoms, substituted or unsubstituted alkyl group having 1 to 50 carbon atoms, substituted or unsubstituted cycloalkyl group having 3 to 50 ring carbon atoms, substituted or unsubstituted aralkyl group having 7 to 50 carbon atoms, or substituted or unsubstituted heterocyclic group having 5 to 50 ring atoms. $Ar^5$ and $Ar^6$ are independently selected.

[Chemical Formula 54]

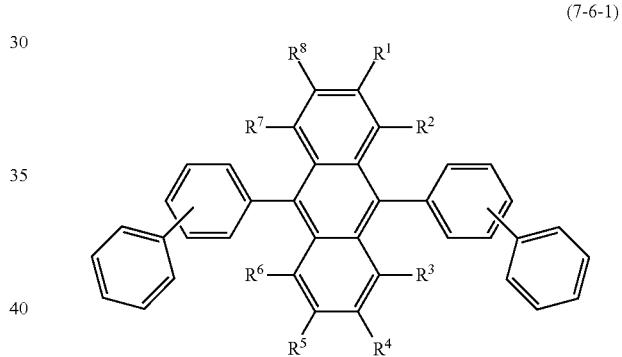

(7-6-1)

In the formula (7-6-1), $R^1$ to $R^8$ represent the same as described above.

[Chemical Formula 55]

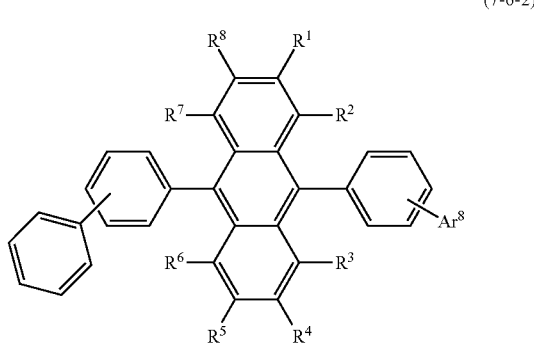

(7-6-2)

In the formula (7-6-2), $R^1$ to $R^8$ represent the same as described above. $Ar^8$ is a substituted or unsubstituted fused aryl group having 10 to 20 ring carbon atoms.

[Chemical Formula 56]

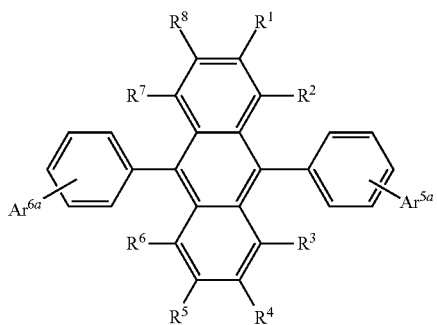

(7-6-3)

In the formula (7-6-3), $R^1$ to $R^8$ represent the same as those of the formula (7).

$Ar^{5a}$ and $Ar^{6a}$ are independently a substituted or unsubstituted fused aryl group having 10 to 20 ring carbon atoms.

Examples of the substituted or unsubstituted aryl group having 6 to 50 ring carbon atoms for $R^1$ to $R^8$, $R^{11}$, $Ar^5$ to $Ar^7$ and $Ar^{12}$ include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 6-chrysenyl group, 1-benzo[c]phenanthryl group, 2-benzo[c]phenanthryl group, 3-benzo[c]phenanthryl group, 4-benzo[c]phenanthryl group, 5-benzo[c]phenanthryl group, 6-benzo[c]phenanthryl group, 1-benzo[g]chrysenyl group, 2-benzo[g]chrysenyl group, 3-benzo[g]chrysenyl group, 4-benzo[g]chrysenyl group, 5-benzo[g]chrysenyl group, 6-benzo[g]chrysenyl group, 7-benzo[g]chrysenyl group, 8-benzo[g]chrysenyl group, 9-benzo[g]chrysenyl group, 10-benzo[g]chrysenyl group, 11-benzo[g]chrysenyl group, 12-benzo[g]chrysenyl group, 13-benzo[g]chrysenyl group, 14-benzo[g]chrysenyl group, 1-triphenyl group, 2-triphenyl group, 2-fluorenyl group, 9,9-dimethylfluorene-2-yl group, benzofluorenyl group, dibenzofluorenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4''-t-butyl-p-terphenyl-4-yl group. An unsubstituted phenyl group, substituted phenyl group, substituted or unsubstituted aryl group having 10 to 14 ring carbon atoms (e.g., 1-naphthyl group, 2-naphthyl group, and 9-phenanthryl group), substituted or unsubstituted fluorenyl group (2-fluorenyl group), and substituted or unsubstituted pyrenyl group (1-pyrenyl group, 2-pyrenyl group, and 4-pyrenyl group) are preferable.

Examples of the substituted or unsubstituted fused aryl group having 10 to 20 ring carbon atoms for $Ar^{5a}$, $Ar^{6a}$ and $Ar^8$ include a 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, and 2-fluorenyl group. Particularly, a 1-naphthyl group, 2-naphthyl group, 9-phenanthryl group, and fluorenyl group (2-fluorenyl group) are preferable.

Examples of the substituted or unsubstituted heterocyclic group having 5 to 50 ring atoms represented by $R^1$ to $R^8$, $R^{11}$, $Ar^5$ to $Ar^7$, $Ar^{11}$ and $Ar^{12}$ include a 1-pyroryl group, 2-pyroryl group, 3-pyroryl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group. Among the above, a 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-carbazolyl group, 2-carbazolyl group, 3-carbazolyl group, 4-carbazolyl group, and 9-carbazolyl group are preferable.

Examples of the substituted or unsubstituted alkyl group having 1 to 50 carbon atoms for $R^1$ to $R^8$, $R^{11}$ and $Ar^5$ to $Ar^7$ include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group. Among the above, a methyl group, ethyl group, propyl group, isopropyl group, n-butyl group, s-butyl group, isobutyl group, and t-butyl group are preferable.

Examples of the substituted or unsubstituted cycloalkyl group having 3 to 50 ring carbon atoms for $R^1$ to $R^8$, $R^{11}$, and $Ar^5$ to $Ar^7$ include a cyclopropyl group, cyclobutyl group, cyclopentyl group, cyclohexyl group, 4-methylcyclohexyl group, 1-adamantyl group, 2-adamantyl group, 1-norbornyl group, and 2-norbornyl group. Among the above, a cyclopentyl group and cyclohexyl group are preferable.

The substituted or unsubstituted alkoxy group having 1 to 50 carbon atoms for $R^1$ to $R^8$ and $R^{11}$ is a group represented by —OZ. Z is selected from the substituted or unsubstituted alkyl groups having 1 to 50 carbon atoms for $R^1$ to $R^8$.

Examples of the substituted or unsubstituted aralkyl group (in which the aryl portion has 6 to 49 carbon atoms and the alkyl portion has 1 to 44 carbon atoms) having 7 to 50 carbon atoms for $R^1$ to $R^8$, $R^{11}$ and $Ar^5$ to $Ar^7$ include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrorylmethyl group, 2-(1-pyroryl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

The substituted or unsubstituted aryloxy group having 6 to 50 carbon atoms and the substituted or unsubstituted arylthio group having 6 to 50 carbon atoms for $R^1$ to $R^8$ and $R^{11}$ are respectively represented by —OY and SY. Y is selected from the substituted or unsubstituted aryl groups having 6 to 50 ring carbon atoms for $R^1$ to $R^8$.

The substituted or unsubstituted alkoxycarbonyl group having 2 to 50 carbon atoms for $R^1$ to $R^8$ and $R^{11}$ (in which the alkyl portion has 1 to 49 carbon atoms) is represented by —COOZ. Z is selected from the substituted or unsubstituted alkyl groups having 1 to 50 carbon atoms for $R^1$ to $R^8$.

Examples of the substituted silyl group for $R^1$ to $R^8$ and $R^{11}$ include a trimethylsilyl group, triethylsilyl group, t-butyldimethylsilyl group, vinyldimethylsilyl group, propyldimethylsilyl group, and triphenylsilyl group.

Examples of the halogen atom for $R^1$ to $R^8$ and $R^{11}$ include fluorine, chlorine, bromine and iodine.

[2] Case of $A_h < A_d$

When the host and the dopant are combined to satisfy $A_h < A_d$, the blocking layer provided within the electron transporting zone can exhibit outstanding advantages, resulting in high efficiency due to the TTF phenomenon. Description will be given in the following cases of [2-1] and [2-2]. In general, an organic material has a broadening of a LUMO level in a range larger than the measured affinity level by approximately 0.2 eV.

[2-1] Case where Difference Between $A_d$ and $A_h$ is Smaller than 0.2 eV

Figure 5:
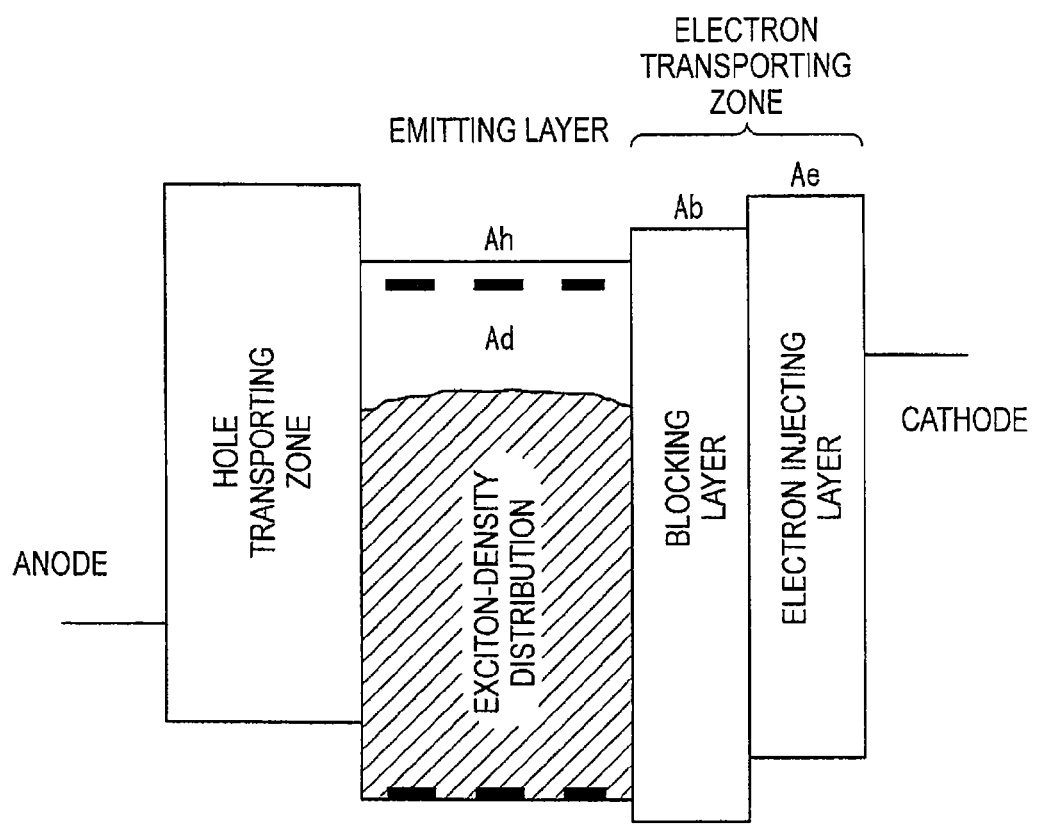
FIG. 5 is an energy band diagram showing a case where Ah<Ad is satisfied and a difference between Ah and Ad is less than 0.2 eV.

FIG. 5 shows one example of an energy band diagram in this case. Dotted lines in the emitting layer show an energy level of the dopant. As shown in FIG. 5, when a difference between $A_d$ and $A_h$ is smaller than 0.2 eV, the LUMO level of the dopant is included in the range of the broadening of the LUMO level of the host, so that the electrons carried within the emitting layer is unlikely to be trapped by the dopant. In other words, the dopant is unlikely to exhibit an electron-trapping property. Moreover, the dopant of the invention is a wide-gap fluorescent dopant having a main peak wavelength of 550 nm or less. When the relationship of $A_h < A_d$ is satisfied, since the difference between $A_h$ and $A_d$ is approximately 0.2 eV, a difference between the ionization potential of the host and the ionization potential of the dopant is reduced. As a result, the dopant does not tend to exhibit an outstanding hole-trapping property. FIG. 5 shows the relationship in the case of $A_h > A_b > A_e$.

In other words, the dopant in this case does not tend to exhibit an outstanding trapping property for both electrons and holes. With this arrangement, as shown in the shaded area of the emitting layer in FIG. 5, the electron-hole recombination occurs mainly on the host molecule in the broad whole area in the emitting layer, thereby generating 25% of singlet excitons and 75% of triplet excitons mainly on the host molecule. Energy of the singlet excitons generated on the host is transferred to the dopant by Förster energy transfer to contribute to a fluorescent emission of the dopant molecule. On the other hand, the transfer direction of the energy of triplet excitons depends on the triplet energy relationship of the host and the dopant. When the relationship is $E^T_h > E^T_d$, the triplet excitons generated on the host are transferred to a nearby dopant by the Dexter energy transfer. A concentration of the dopant in the emitting layer of a fluorescent device is typically as low as at a few mass % to approximately 20 mass %. Accordingly, triplet excitons which have transferred to the dopant collide with one another less frequently, resulting in a less possibility of occurrence of the TTF phenomenon. However, when the relationship of $E^T_h < E^T_d$ is satisfied as in this exemplary embodiment, since the triplet excitons are present on the host molecule, the frequency of collision is increased, so that the TTF phenomenon easily and efficiently occur.

In the invention, the blocking layer is adjacent to the emitting layer. Since the triplet energy $E^T_b$ of the blocking layer is set to be larger than the triplet energy $E^T_h$ of the host, the triplet excitons is prevented from dispersing in the electron transporting zone, so that the TTF phenomenon can occur efficiently in the emitting layer.

[2-2] Case where Difference Between $A_d$ and $A_h$ is Larger than 0.2 eV

Figure 6:
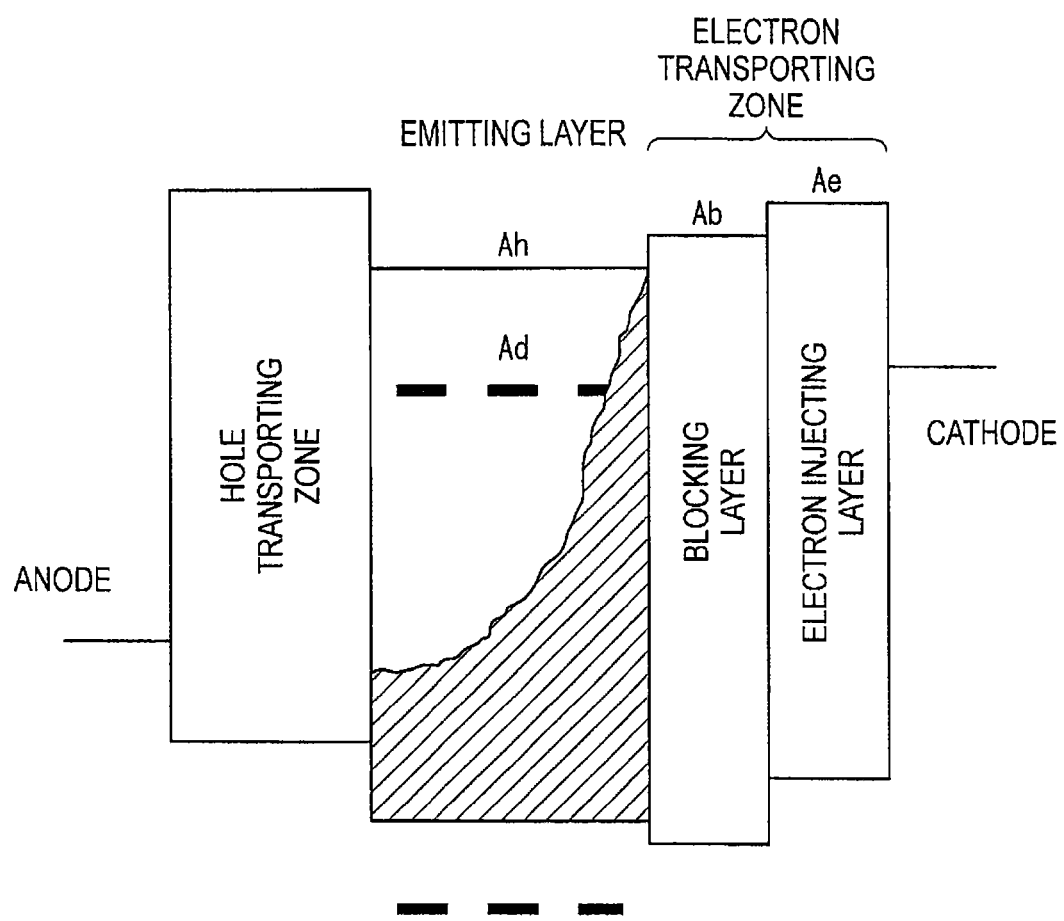
FIG. 6 is an energy band diagram showing a case where Ah<Ad is satisfied and a difference between Ah and Ad is more than 0.2 eV.

FIG. 6 shows one example of an energy band diagram in this case. The difference in affinity between the dopant and the host is increased, so that an LUMO level of the dopant is present at a position further higher than the LUMO level zone of the host. Accordingly, the dopant is more likely to exhibit a significant electron-trapping property. Electrons trapped by the dopant are recombined with holes after the holes are transferred from the host to the dopant. In other words, unlike the condition shown in FIG. 5, the electrons and the holes are recombined in a pair not only on the host molecule but also on the dopant molecule. As a result, triplet excitons are generated not only on the host molecule but also directly on the dopant molecule. Under such conditions, when the relationship of $E^T_h < E^T_d$ is satisfied as in this exemplary embodiment, the triplet excitons generated directly on the dopant also gather on the host by Dexter energy transfer, so that the TTF phenomenon occurs efficiently. When the affinities satisfy the above-mentioned relationship, the possibility of trapping of electrons by the dopant is increased toward the interface between the emitting layer and the blocking layer. As a result, recombination occurs frequently in the vicinity of the interface between the emitting layer and the blocking layer. In this case, the effect of confining triplet excitons by the blocking layer is enhanced as compared with the case mentioned in [2-1], resulting in an increase in density of triplet excitons at the interface between the emitting layer and the blocking layer. FIG. 6 shows the relationship in the case of $A_h > A_b > A_e$.

The host and the dopant that satisfy the above relationship in the $A_h < A_d$ can be selected from, for instance, the following compounds (see JP-A-2010-50227 (Japanese Patent Application No. 2008-212102) and the like).

Examples of the host are an anthracene derivative and a polycyclic aromatic skeleton-containing compound, preferably an anthracene derivative.

Examples of the dopant are a fluoranthene derivative, pyrene derivative, arylacetylene derivative, fluorene derivative, boron complex, perylene derivative, oxadiazole derivative and anthracene derivatives, preferably fluoranthene derivative, pyrene derivative, and boron complex, more preferably fluoranthene derivative and boron complex. As for the combination of a host and a dopant, it is preferred that the host is an anthracene derivative and the dopant is a fluoranthene derivative or a boron complex.

The fluoranthene derivative is exemplified by the following compound.

[Chemical Formula 57]

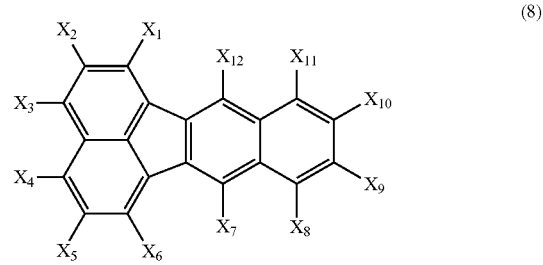

(8)

In the formula (8), $X_1$ to $X_{12}$ each represent a hydrogen atom or a substituent. Preferably, in the compound, $X_1$ to $X_2$, $X_4$ to $X_6$ and $X_8$ to $X_{11}$ are a hydrogen atom, and $X_3$, $X_7$ and $X_{12}$ are a substituted or unsubstituted aryl group having 5 to 50 ring atoms. More preferably, in the compound, $X_1$ to $X_2$, $X_4$ to $X_6$ and $X_8$ to $X_{11}$ are a hydrogen atom, $X_7$ and $X_{12}$ are a substituted or unsubstituted aryl group having 5 to 50 ring atoms, and $X_3$ is $-Ar_1-Ar_2-Ar_3$, in which $Ar_1$ and $Ar_3$ are each a substituted or unsubstituted arylene group having 5 to 50 ring atoms, and $Ar_2$ is a substituted or unsubstituted aryl group having 5 to 50 ring atoms.

Preferably, in the compound, $X_1$ to $X_2$, $X_4$ to $X_6$ and $X_8$ to $X_{11}$ are a hydrogen atom, $X_7$ and $X_{12}$ are a substituted or unsubstituted aryl group having 5 to 50 ring atoms, and $X_3$ is $-Ar_1-Ar_2$, in which $Ar_1$ is a substituted or unsubstituted arylene group having 5 to 50 ring atoms, and $Ar_2$ is a substituted or unsubstituted aryl group having 5 to 50 ring atoms.

The boron complex is exemplified by the following compound.

[Chemical Formula 58]

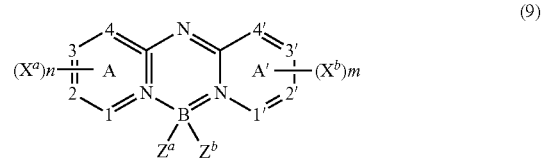

(9)

In the formula (9), A and A' represent an independent azine ring system corresponding to a six-membered aromatic ring containing one or more nitrogen. $X^a$ and $X^b$ each represent independently-selected substituents, which are bonded together to form a fused ring with the ring A or the ring A'. The fused ring contains an aryl or heteroaryl substituent. m and n independently represent 0 to 4. $Z^a$ and $Z^b$ each represent an independently-selected halide. 1, 2, 3, 4, 1', 2', 3' and 4' each represent an independently-selected carbon atom or nitrogen atom.

Desirably, the azine ring is preferably a quinolinyl ring or isoquinolinyl ring in which all of 1, 2, 3, 4, 1', 2', 3' and 4' are carbon atoms, m and n each are 2 or more, and $X^a$ and X" are a substituent having 2 or more carbon atoms that combine with each other to form an aromatic ring. $Z^a$ and $Z^b$ are desirably fluorine atoms.

The anthracene derivatives as the host in the case of [2] are the same as those described in the above "[1] Case of $A_h > A_d$."

Figure 7:
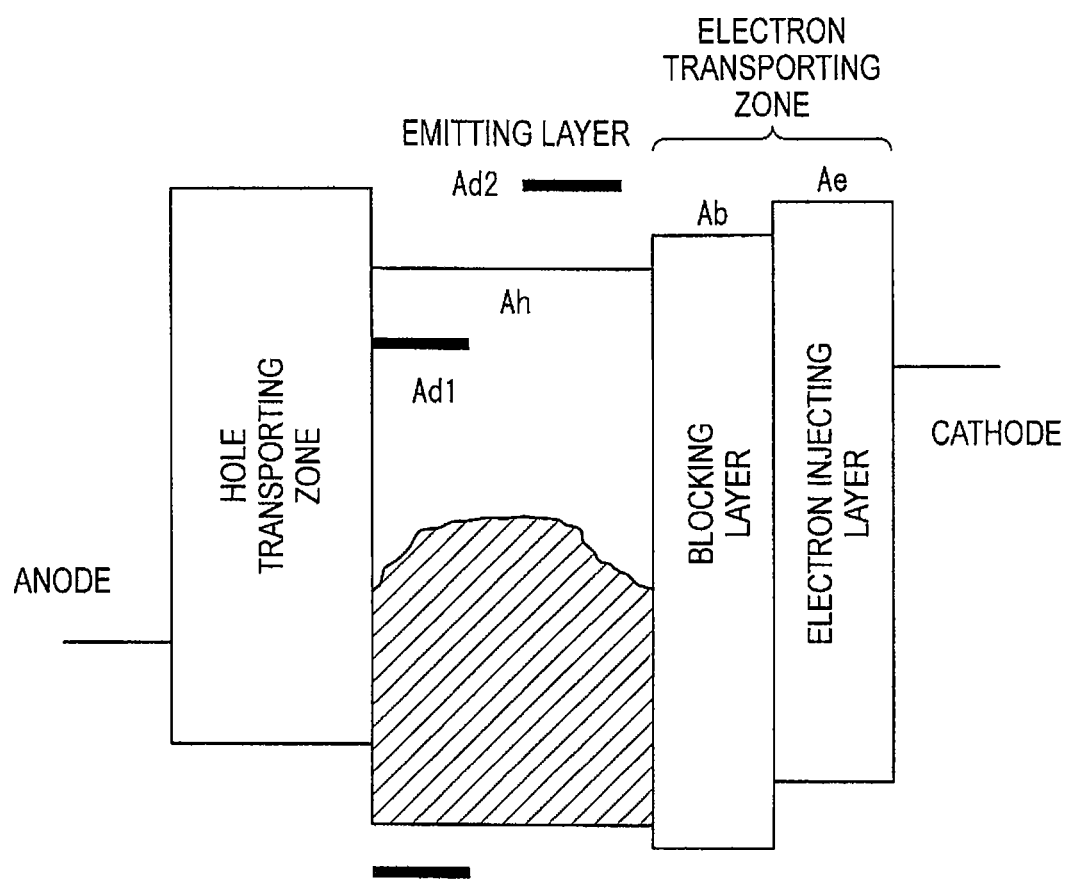
FIG. 7 is an energy band diagram showing a case where a dopant satisfying Ah<Ad and a dopant satisfying Ah>Ad coexist.

[3] Case where a Dopant Satisfying $A_h<A_d$ and a Dopant Satisfying $A_h>A_d$ Coexist FIG. 7 shows one example of an energy band diagram when a dopant satisfying $A_h<A_d$ and a dopant satisfying $A_h>A_d$ are both contained in the emitting layer. In such a case, both electrons and holes are trapped properly, whereby recombination occurs in the entire region of the emitting layer. Accordingly, recombination occurs frequently also on the cathode side. When providing a blocking layer having a large triplet energy, the TTF phenomenon occurs efficiently. FIG. 7 shows the relationship in the case of $A_h>A_b>A_e$.

In the invention, the density of excitons is large in the interface between the emitting layer and the blocking layer. In this case, holes which do not contribute to recombination in the emitting layer are injected in the blocking layer with a high probability. Accordingly, among the above-mentioned aromatic heterocyclic derivatives, one having an excellent oxidation resistance is preferable as the material to be used in the blocking layer.

The blocking layer material desirably exhibits a reversible oxidation process in a cyclic voltammetry measurement.

Next, the measurement of the mobility by the impedance spectroscopy will be described below. The blocking layer material having a thickness of approximately 100 nm to 200 nm is preferably held between the anode and the cathode. While applying a bias DC voltage, a small alternate voltage of 100 mV or less is applied. The value of an alternate current (the absolute value and the phase) which flows at this time is measured. This measurement is performed while changing the frequency of the alternate voltage, and complex impedance (Z) is calculated from a current value and a voltage value. A frequency dependency of the imaginary part (1 mM) of the modulus $M=i\omega Z$ (i: imaginary unit $\omega$: angular frequency) is obtained. The reciprocal number of a frequency $\omega$ at which the ImM becomes the maximum is defined as a response time of electrons carried in the blocking layer. The electron mobility is calculated according to the following formula.

Electron mobility=(film thickness of the blocking layer material)$^2$/(response time·voltage)

The emitting layer may contain two or more fluorescent dopants of which the main peak wavelength is 550 nm or less. When the emitting layer contains two or more fluorescent dopants, the affinity $A_d$ of at least one dopant is equal to or larger than the affinity $A_h$ of the host, and the triplet energy $E^T_d$ of this dopant is larger than the triplet energy $E^T_h$ of the host. For instance, the affinity $A_d$ of at least one dopant of the rest of the dopants may be smaller than the affinity $A_h$ of the host. Containing such two kinds of dopants means containing both of a dopant satisfying $A_h<A_d$ and a dopant satisfying $A_h>A_d$ as described above. Efficiency can be significantly improved by providing the blocking layer having a large triplet energy.

Examples of the dopant having the affinity $A_d$ that is smaller than the affinity $A_h$ of the host include a pyrene derivative, aminoanthracene derivative, aminochrysene derivative, and aminopyrene derivative.

In addition to the above-mentioned hosts, dibenzofuran compounds disclosed in WO05/113531 and JP2005-314239, fluorene compounds disclosed in WO02/14244, and benzanthracene compounds disclosed in WO08/145,239 can be used.

In addition to the above-mentioned dopants, pyrene compounds disclosed in JP2004-204238, WO05/108348, WO04/83162, WO09/84512, KR10-2008-79956, KR10-2007-115588 and KR10-2010-24894, chrysene compounds disclosed in WO04/44088, and anthracene compounds disclosed in WO07/21117 can be used.

Preferably, the host and the dopant are each a compound formed by bonding ring structures or single atoms (including bonding of a ring structure and a single atom), in which the bonding is a single bond. A compound having a carbon-carbon double bond in the part other than the ring structure thereof is not preferable The reason thereof is that the triplet energies generated on the host and the dopant are used for the structural change of the double bond, not for a TTF phenomenon.

Second Exemplary Embodiment

The device of the invention may have a tandem device configuration in which at least two organic layer units including emitting layers are provided. An intermediate layer (also referred to as an intermediate conductive layer, a charge generation layer or CGL) is interposed between the two emitting layers. An electron transporting zone can be provided in each unit. At least one emitting layer is a fluorescent emitting layer and the unit including the emitting layer satisfies the above-mentioned requirements. Specific examples of stack order are given below. The following emitting layer may be a multi-layer stack of emitting layers or one organic layer unit including a charge blocking layer according to a later-described third exemplary embodiment.

anode/fluorescent emitting layer/intermediate layer/fluorescent emitting layer/blocking layer/electron injecting layer/cathode.

anode/fluorescent emitting layer/blocking layer/electron injecting layer/intermediate layer/fluorescent emitting layer/cathode.

anode/fluorescent emitting layer/blocking layer/electron injecting layer/intermediate layer/fluorescent emitting layer/blocking layer/cathode.

anode/fluorescent emitting layer/blocking layer/intermediate layer/fluorescent emitting layer/blocking layer/electron injecting layer/cathode.

anode/phosphorescent emitting layer/intermediate layer/fluorescent emitting layer/blocking layer/electron injecting layer/cathode.

anode/fluorescent emitting layer/blocking layer/electron injecting layer/intermediate layer/phosphorescent emitting layer/cathode.

Figure 8:
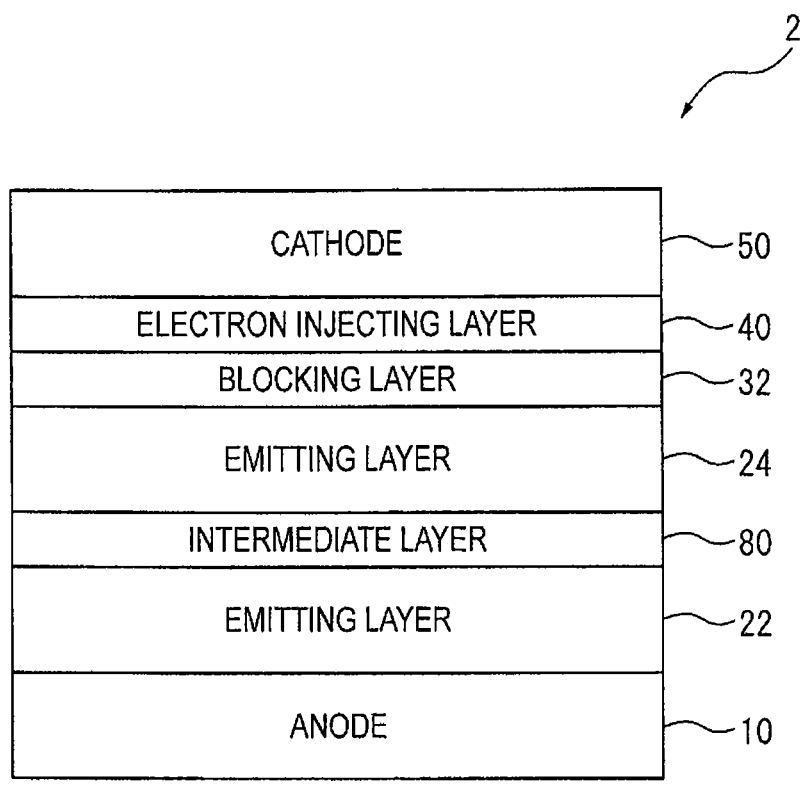
FIG. 8 is a view showing one example of an organic EL device according to a second exemplary embodiment.

FIG. 8 shows one example of an organic EL device according to the second exemplary embodiment. An organic EL device 2 includes an anode 10, emitting layers 22 and 24 and a cathode 50 in sequential order. An intermediate layer 80 is interposed between the emitting layers 22 and 24. A blocking layer 32 is adjacent to the emitting layer 24. The electron injecting layer 40 is interposed between the blocking layer 32 and the cathode 50. The blocking layer 32, the electron injecting layer 40 and the emitting layer 24 are respectively a blocking layer, an electron injecting layer and a fluorescent emitting layer which satisfy the requirements of the invention. The other emitting layer may be either a fluorescent emitting layer or a phosphorescent emitting layer. Another blocking layer and another electron injecting layer are provided adjacent to the emitting layer 22 in sequential order. These blocking layer and electron injecting layer and the emitting layer 22 may be respectively used as the blocking layer, the electron injecting layer, and the fluorescent emitting layer which satisfy the requirements of the invention.

At least one of an electron transporting zone and hole transporting zone may be interposed between the two emitting layers 22 and 24. Three or more emitting layers may be provided, and two or more intermediate layers may be provided. When three or more emitting layers are present, an intermediate layer may or may not be present between all of the emitting layers.

The intermediate layer is a layer including at least one of the intermediate conductive layer and the charge generation layer, or at least one of the intermediate conductive layer and the charge generation layer. The intermediate layer serves as a source for supplying electrons or holes to be injected in an emitting unit. In addition to charges injected from a pair of electrodes, charges supplied from the intermediate layer are injected into the emitting unit. Accordingly, by providing the intermediate layer, luminous efficiency (current efficiency) relative to injected current is improved.

Examples of the intermediate layer include a metal, metal oxide, mixture of metal oxides, composite oxide, and electron-accepting organic compound. Examples of the metal are preferably Mg, Al, and a film formed by co-evaporating Mg and Al. Examples of the metal oxide include ZnO, $WO_3$, $MoO_3$ and $MoO_2$. Examples of the mixture of the metal oxides include ITO, IZO (registered trade mark), and ZnO:Al. Examples of the electron-accepting organic compound include an organic compound having a CN group as a substituent. Preferable examples of the organic compound having a CN group include a triphenylene derivative, tetracyanoquinodimethane derivative and indenofluorene derivative. The triphenylene derivative is preferably hexacyanohexaazatriphenylene. The tetracyanoquinodimethane derivative is preferably tetrafluoroquinodimethane and dicyanoquinodimethane. The indenofluorene derivative is preferably a compound disclosed in International Publication No. WO2009/011327, WO2009/069717, or WO2010/064655. The electron accepting substance may be a single substance, or a mixture with other organic compounds.

In order to easily accept the electrons from the charge generation layer, it is suitable to dope a donor represented by an alkali metal in the vicinity of an interface of the charge generation layer in the electron transporting layer. As the donor, at least one selected from the group consisting of a donor metal, donor metal compound and donor metal complex can be used.

Specific examples of the compounds used for the donor metal, donor metal compound and donor metal complex are compounds disclosed in Japanese Patent Application No. PCT/JP2010/003434 (International Publication No. WO2010/134352).

Third Exemplary Embodiment

In the third exemplary embodiment, an anode, a plurality of emitting layers, an electron transporting zone that includes a blocking layer adjacent to one of the emitting layers and an electron injecting layer adjacent to the blocking layer, and a cathode are provided in sequential order. A charge blocking layer is provided between two emitting layers of the plurality of the emitting layers. The emitting layers in contact with the charge blocking layer are fluorescent emitting layers. The fluorescent emitting layer, and the blocking layer and the electron injecting layer in the electron transporting zone satisfy the above requirements.

As a configuration of a suitable organic EL device according to the third exemplary embodiment, there can be given a configuration as disclosed in Japanese Patent No. 4134280, US Patent Publication US2007/0273270A1 and International Publication WO2008/023623A1. Specifically, the configuration in which an anode, a first emitting layer, a charge blocking layer, a second emitting layer and a cathode are sequentially stacked, and an electron-transporting zone having a blocking layer and an electron injecting layer for preventing diffusion of triplet excitons is further provided between the second emitting layer and the cathode. Here, the charge blocking layer means a layer to control the carrier injection to an emitting layer and the carrier balance between electrons and holes injected in the emitting layer by providing an energy barrier of an HOMO level or an LUMO level between adjacent emitting layers Specific examples of such a configuration are given below.

anode/first emitting layer/charge blocking layer/second emitting layer/electron transporting zone/cathode anode/first emitting layer/charge blocking layer/second emitting layer/third emitting layer/electron transporting zone/cathode It is preferred that a hole transporting zone is provided between the anode and the first emitting layer in the same manner as in other exemplary embodiments.

Figure 9:
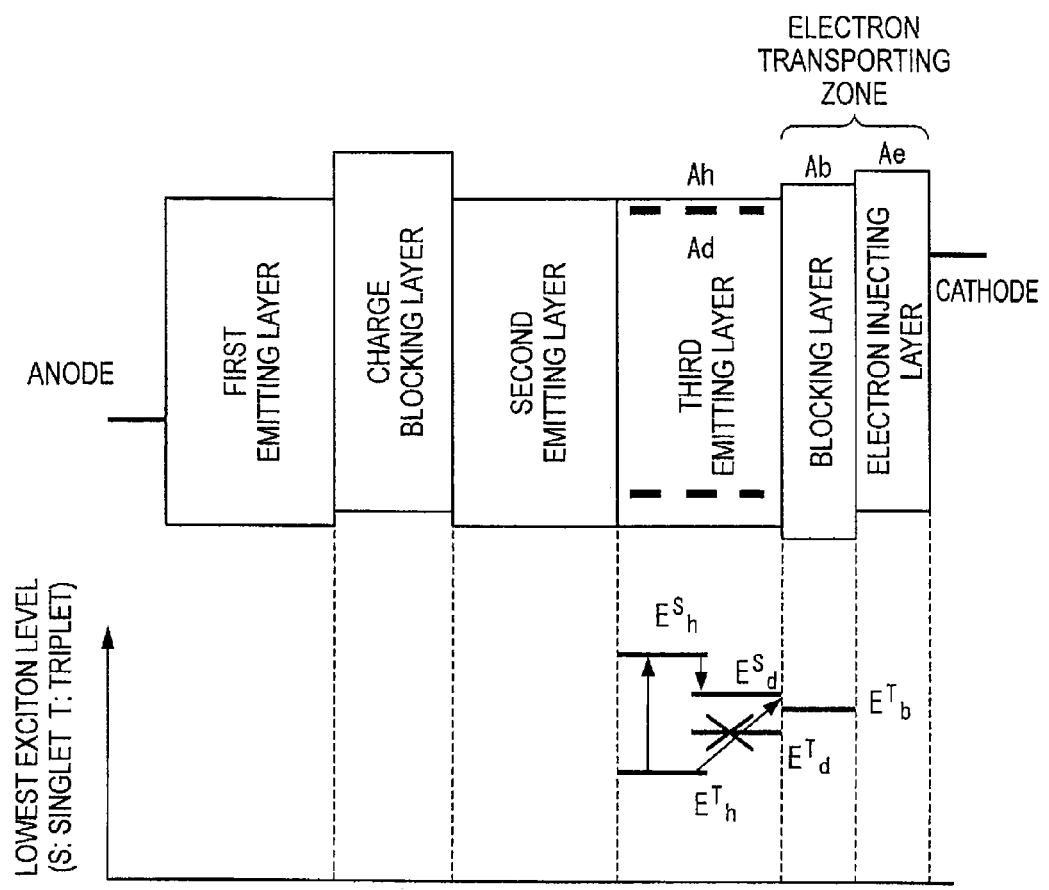
FIG. 9 is a view showing one example of an organic EL device according to a third exemplary embodiment.

FIG. 9 shows one example of an organic EL device according to this exemplary embodiment. An upper view in FIG. 9 shows a device configuration, and the HOMO and LUMO energy levels of each layer. A lower view in FIG. 9 shows a relationship between energy gaps of the third emitting layer and the blocking layer. The upper view in FIG. 9 shows the relationship in the case of $A_h > A_b > A_e$. The organic EL device includes the anode, first emitting layer, second emitting layer, third emitting layer, electron transporting zone, and cathode in sequential order. A charge blocking layer is interposed between the first and second emitting layers. The electron transporting zone is formed of the blocking layer. This blocking layer and third emitting layer are the blocking layer and the fluorescent emitting layer that satisfy the requirements of the invention. The first and second emitting layers may be either a fluorescent emitting layer or a phosphorescent emitting layer.

The device of this exemplary embodiment is suitable as a white emitting device. The device can be a white emitting device by adjusting the emission colors of the first emitting layer, second emitting layer and third emitting layer. Moreover, the device can be a white emitting device by arranging only the first emitting layer and the second emitting layer and adjusting the emission colors of these two emitting layers. In this case, the second emitting layer is a fluorescent emitting layer satisfying the requirements of the invention.

In particular, by using a hole transporting material as the host in the first emitting layer, by adding a fluorescent emitting dopant of which the main peak wavelength is larger than 550 nm, by using an electron transporting material as the host in the second emitting layer (and the third emitting layer), and by adding a fluorescent emitting dopant of which the main peak wavelength is equal to or smaller than 550 nm, it is possible to achieve a white emitting device that exhibits a higher luminous efficiency as compared with conventional white emitting devices, even though all of them are entirely formed of fluorescent materials.

Reference is made particularly to a hole transporting layer which is adjacent to the emitting layer. In order to allow the TTF phenomenon of the invention to occur effectively, it is preferred that the triplet energy of the hole transporting material is larger than the triplet energy of the host, when the triplet energy of the hole transporting material and that of the host are compared.

Fourth Exemplary Embodiment

In a fourth exemplary embodiment, a blue pixel, a green pixel and a red pixel are arranged in parallel on a substrate. Of these three color pixels, at least one of the blue pixel and the green pixel has the configuration of the first exemplary embodiment.

Figure 10:
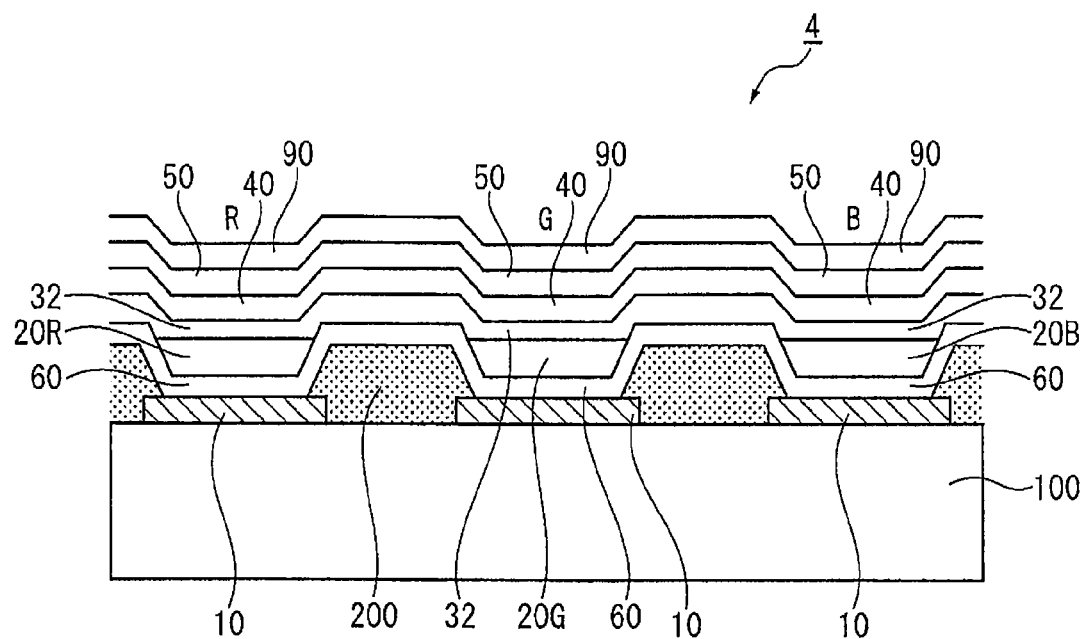
FIG. 10 is a view showing one example of an organic EL device according to a fourth exemplary embodiment.

FIG. 10 shows one example of an organic EL device according to this exemplary embodiment.

In a top-emission type organic EL device 4 shown in FIG. 10, a blue pixel B, a green pixel G and a red pixel R are arranged in parallel on a common substrate 100.

The blue pixel B includes the anode 10, the hole transporting zone 60, a blue emitting layer 20B, the blocking layer 32, the electron injecting layer 40, the cathode 50, and a protection layer 90 on the substrate 100 in sequential order. The green pixel G includes the anode 10, the hole transporting zone 60, a green emitting layer 20G, the blocking layer 32, the electron injecting layer 40, the cathode 50, and the protection layer 90 on the substrate 100 in sequential order.

The red pixel R includes the anode 10, the hole transporting zone 60, a red emitting layer 20R, the blocking layer 32, the electron injecting layer 40, the cathode 50, and the protection layer 90 on the substrate 100 in sequential order.

An insulating film 200 is formed between the anodes of adjacent pixels to keep the insulation between the pixels. The electron transporting zone is formed of the blocking layer 32 and the electron injecting layer 40.

In the organic EL device 4, the blocking layer is provided as a common blocking layer for the blue pixel B, the red pixel R and the green pixel G.

The advantageous effects brought by the blocking layer are outstanding comparing to the luminous efficiency conventionally attained in a blue fluorescent device. In a green fluorescent device and a red fluorescent device, similar advantageous effects, such as confining triplet energies in the emitting layer, can be attained, and improvement in luminous efficiency can also be expected.

On the other hand, in a phosphorescent emitting layer, it is possible to attain the advantageous effects of confining triplet energies in the emitting layer, and as a result, diffusion of triplet energies is prevented, thereby contributing to improvement in luminous efficiency of a phosphorescent dopant.

The hole transporting zone is formed of, for instance, a hole transporting layer, or a combination of a hole transporting layer and a hole injecting layer. A common hole transporting zone may be provided or different hole transporting zones may be provided for the blue pixel B, the red pixel R and the green pixel G. Typically, the hole transporting zones respectively have a configuration suited to the color of emitted light.

The configuration of the organic layer formed of the emitting layers 20B, G and R and the blocking layer is not limited to that shown in the figure and is changeable appropriately.

The host and dopant that can be used in the invention are described above. In particular, each color emitting layer will be described below.

A green emitting layer is preferably formed of the following host material and dopant material.

The host material is preferably a fused aromatic ring derivative. As the fused aromatic ring derivative, an anthracene derivative, pyrene derivative and the like are more preferable in view of luminous efficiency and luminous lifetime.

The host material is exemplified by a heterocycle-containing compound. Examples of the heterocycle-containing compound are a carbazole derivative, dibenzofuran derivative, ladder-type furan compound and pyrimidine derivative.

The dopant material is not particularly limited so long as it functions as a dopant, but an aromatic amine derivative is preferable in view of luminous efficiency and the like. As the aromatic amine derivative, a fused aromatic ring derivative having a substituted or unsubstituted arylamino group is preferable. Examples of such a compound are pyrene, anthracene and chrysene having an arylamino group.

A styrylamine compound is also preferable as the dopant material. Examples of the styrylamine compound are styrylamine, styryldiamine, styryltriamine and styryltetraamine. Here, the styrylamine means a compound in which a substituted or unsubstituted arylamine is substituted with at least one arylvinyl group. The arylvinyl group may be substituted with a substituent such as an aryl group, silyl group, alkyl group, cycloalkyl group, or arylamino group, which may have a further substituent.

Furthermore, as the dopant material, a boron complex and a fluoranthene compound are preferable. A metal complex is also preferable as the dopant material. The metal complex is exemplified by an iridium complex or platinum complex.

A red emitting layer is preferably formed of the following host material and dopant material. The host material is preferably a fused aromatic ring derivative. As the fused aromatic ring derivative, a naphthacene derivative, pentacene derivative and the like are more preferable in view of luminous efficiency and luminous lifetime.

The host material is exemplified by a fused polycyclic aromatic compound. Examples of the fused polycyclic aromatic compound are a naphthalene compound, phenanthrene compound and fluoranthene compound.

The dopant material is preferably an aromatic amine derivative. As the aromatic amine derivative, a fused aromatic ring derivative having a substituted or unsubstituted arylamino group is preferable. Such a compound is exemplified by periflanthene having an arylamino group.

A metal complex is also preferable as the dopant material. The metal complex is exemplified by an iridium complex or platinum complex.

The organic EL device of the fourth exemplary embodiment is prepared in the following manner.

On a substrate, an APC (Ag—Pd—Cu) layer as a silver alloy layer (reflective layer) and a transparent conductive layer such as a zinc oxide (IZO) film and a tin oxide film are sequentially formed. Next, by a typical lithographic technology, this conductive material layer is patterned by etching using a mask with a resist pattern, thereby forming an anode. Then, by the spin coating method, an insulating film formed of a photosensitive resin such as a polyimide is formed by coating on the anode. Thereafter, the resulting film is exposed, developed and cured to allow the anode to be exposed, whereby the anodes for a blue emitting region, a green emitting region and a red emitting region are patterned.

There are three types of electrodes, i.e. an electrode for the red pixel, an electrode for the green pixel and an electrode for a blue pixel. They respectively correspond to the blue emitting region, the green emitting region and the red emitting region, and respectively correspond to the anode. After conducting cleaning for 5 minutes in isopropyl alcohol, a UV ozone cleaning is conducted for 30 minutes. When the hole injecting layer and the hole transporting layer are formed thereafter, the hole injecting layer is stacked over the entire surface of the substrate, and the hole transporting layer is stacked thereon. Emitting layers are formed to be correspondingly arranged to the positions of the anode for the red pixel, the anode for the green pixel and the anode for the blue pixel When vacuum evaporation method is used, the blue emitting layer, the green emitting layer and the red emitting layer are finely patterned using a shadow mask.

Next, a blocking layer is stacked over the entire surface. Subsequently, an electron injecting layer is stacked over the entire surface. Thereafter, Mg and Ag are formed into a film by evaporation, thereby forming a semi-transparent cathode formed of an Mg—Ag alloy.

As for the other members used in the invention, such as the substrate, the anode, the cathode, the hole injecting layer and the hole transporting layer, known members disclosed in PCT/JP2009/053247 (International Publication No. WO2009/107596), PCT/JP2008/073180 (International Publication No. WO2009/081857), U.S. patent application Ser. No. 12/376,236 (US Patent Application Publication No. 2009/251886), U.S. patent application Ser. No. 11/766,281 (US Patent Application Publication No. 2008/014464), U.S. patent application Ser. No. 12/280,364 (US Patent Application Publication No. 2009/0021160) or the like can be appropriately selected and used.

It is preferred that the hole transporting layer include an aromatic amine derivative represented by any one of the following formulae (a-1) to (a-5).

[Chemical Formula 59]

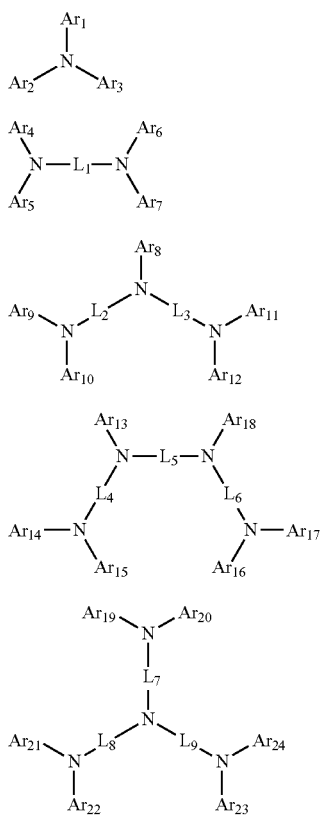

In the formulae (a-1) to (a-5), $Ar_1$ to $Ar_{24}$ are independently a substituted or unsubstituted aryl group having 6 to 50 ring carbon atoms, or a substituted or unsubstituted heteroaryl group having 5 to 50 ring atoms.

$L_1$ to $L_9$ are independently a substituted or unsubstituted arylene group having 6 to 50 ring carbon atoms or a substituted or unsubstituted heteroarylene group having 5 to 50 ring atoms.

Examples of the substituent that may is contained in $Ar_1$ to $Ar_{24}$ and $L_1$ to $L_9$ include a linear or branched alkyl group having 1 to 15 carbon atoms, cycloalkyl group having 3 to 15 ring carbon atoms, trialkylsilyl group having a linear or branched alkyl group having 1 to 15 carbon atoms, triarylsilyl group having an aryl group having 6 to 14 ring carbon atoms, alkylarylsilyl group having a linear or branched alkyl group having 1 to 15 carbon atoms and an aryl group having 6 to 14 ring carbon atoms, aryl group having 6 to 50 ring carbon atoms, heteroaryl group having 5 to 50 ring atoms, halogen atom, and cyano group. Adjacent substituents may bond to each other to form a saturated or unsaturated divalent group forming a ring.

At least one of the above $Ar_1$ to $Ar_{24}$ is preferably a substituent represented by the following formula (a-6) or (a-7).

[Chemical Formula 60]

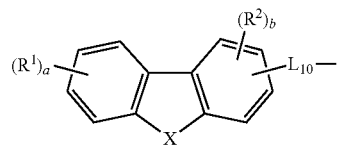

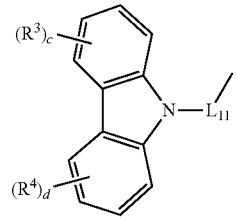

In the formula (a-6), X is an oxygen atom, sulfur atom or N—Ra. Ra is a linear or branched alkyl group having 1 to 15 carbon atoms, cycloalkyl group having 3 to 15 ring carbon atoms, aryl group having 6 to 50 ring carbon atoms or heteroaryl group having 5 to 50 ring atoms.

$L_{10}$ is a single bond, a substituted or unsubstituted arylene group having 6 to 50 ring carbon atoms, or substituted or unsubstituted heteroarylene group having 5 to 50 ring atoms.

In the formula (a-7), $L_{11}$ is a substituted or unsubstituted arylene group having 6 to 50 ring carbon atoms, or substituted or unsubstituted heteroarylene group having 5 to 50 ring atoms.

In the formulae (a-6) and (a-7), $R^1$ to $R^4$ are independently a linear or branched alkyl group having 1 to 15 carbon atoms, cycloalkyl group having 3 to 15 ring carbon atoms, trialkylsilyl group having a linear or branched alkyl group having 1 to 15 carbon atoms, triarylsilyl group having an aryl group having 6 to 14 ring carbon atoms, alkylarylsilyl group having a linear or branched alkyl group having 1 to 15 carbon atoms and an aryl group having 6 to 14 ring carbon atoms, aryl group having 6 to 14 ring carbon atoms, heteroaryl group having 5 to 50 ring atoms, halogen atom, and cyano group. Adjacent groups of $R^1$s to $R^4$s may bond to each other to form a ring.

a, c and d each are an integer of 0 to 4.

b is an integer of 0 to 3.

The compound represented by the formula (a-1) is preferably a compound represented by the following formula (a-8).

[Chemical Formula 61]

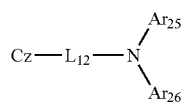

In the formula (a-8), Cz is a substituted or unsubstituted carbazolyl group.

$L_{12}$ is a substituted or unsubstituted arylene group having 6 to 50 ring carbon atoms, or a substituted or unsubstituted heteroarylene group having 5 to 50 ring atoms.

$Ar_{25}$ and $Ar_{26}$ are independently a substituted or unsubstituted aryl group having 6 to 50 ring carbon atoms or a substituted or unsubstituted heteroaryl group having 5 to 50 ring atoms.

The compound represented by the formula (a-8) is preferably a compound represented by the following formula (a-9).

[Chemical Formula 62]

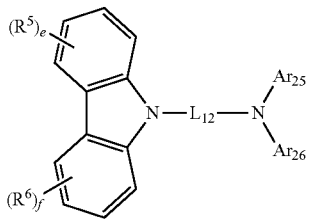

(a-9)

In the formula (a-9), $R^5$ and $R^6$ are independently a linear or branched alkyl group having 1 to 15 carbon atoms, cycloalkyl group having 3 to 15 ring carbon atoms, trialkylsilyl group having a linear or branched alkyl group having 1 to 15 carbon atoms, triarylsilyl group having an aryl group having 6 to 14 ring carbon atoms, alkylarylsilyl group having a linear or branched alkyl group having 1 to 15 carbon atoms and an aryl group having 6 to 14 ring carbon atoms, aryl group having 6 to 14 ring carbon atoms, heteroaryl group having 5 to 50 ring atoms, halogen atom, or cyano group. Adjacent groups of $R^5$s to $R^6$s may bond to each other to form a ring.

e and f each are an integer of 0 to 4.

$L_{12}$, $Ar_{25}$ and $Ar_{26}$ are the same as $L_{12}$, $Ar_{25}$ and $Ar_{26}$ in the formula (a-8).

The compound represented by the formula (a-9) is preferably a compound represented by the following formula (a-10).

[Chemical Formula 63]

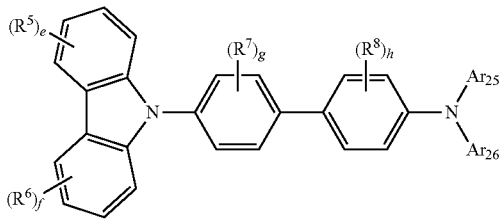

(a-10)

In the formula (a-10), $R^7$ and $R^8$ are independently a linear or branched alkyl group having 1 to 15 carbon atoms, cycloalkyl group having 3 to 15 ring carbon atoms, trialkylsilyl group having a linear or branched alkyl group having 1 to 15 carbon atoms, triarylsilyl group having an aryl group having 6 to 14 ring carbon atoms, alkylarylsilyl group having a linear or branched alkyl group having 1 to 15 carbon atoms and an aryl group having 6 to 14 ring carbon atoms, aryl group having 6 to 14 ring carbon atoms, heteroaryl group having 5 to 50 ring atoms, halogen atom, or cyano group. Adjacent groups of $R^5$s to $R^6$s may bond to each other to form a ring.

g and h each are an integer of 0 to 4.

$R^5$, $R^6$, e, f, $Ar_{25}$ and $Ar_{26}$ are the same as $R^5$, $R^6$, e, f, $Ar_{25}$ and $Ar_{26}$ in the formula (a-9).

EXAMPLES

Examples of the invention will be described below. However, the invention is not limited by these Examples.

Materials used in Examples and Comparatives will be shown below.

[Chemical Formula 64]

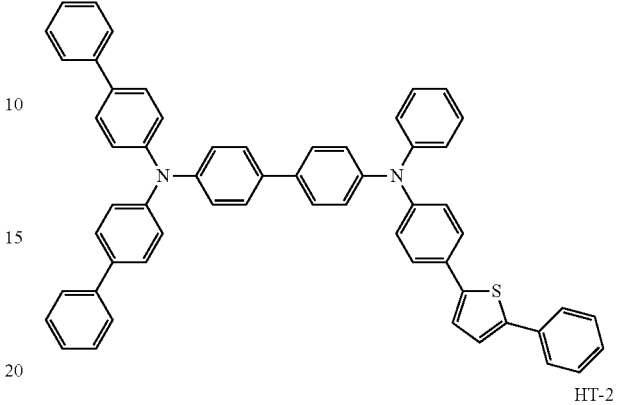

HT-1

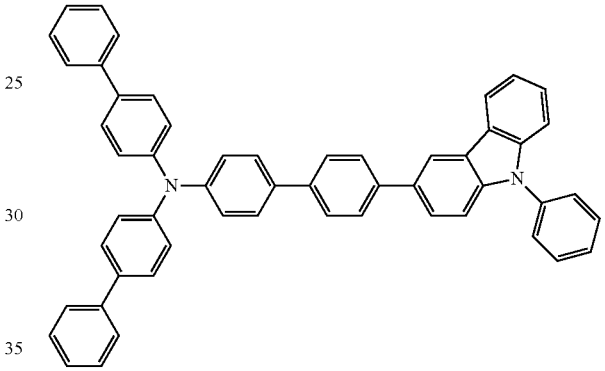

HT-2

[Chemical Formula 65]

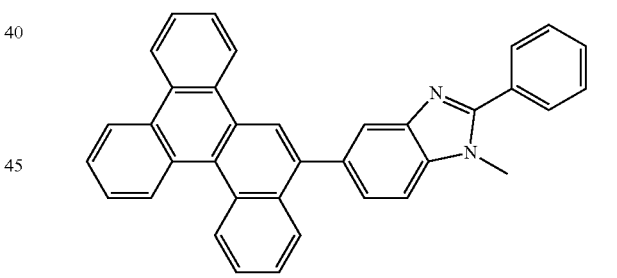

ET-1

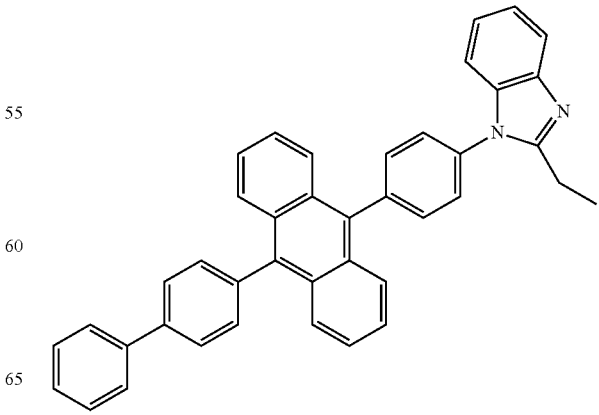

ET-2

-continued
[Chemical Formula 66]
BH-1
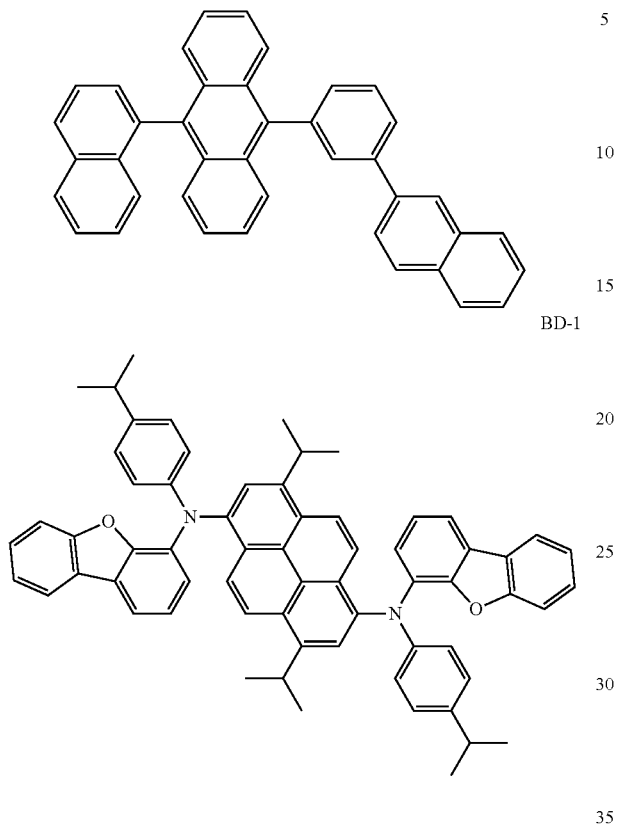
BD-1
[Chemical Formula 67]
BD-2
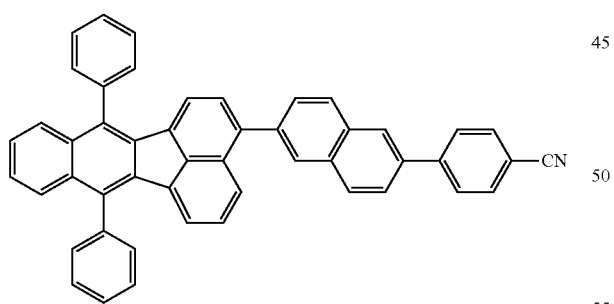
Triplet energies of the compounds BH-1, BD-1 and BD-2 shown above are as follows. A measurement method will be described later.
BH-1 $Eg^T$: 1.83 eV
BD-1 $Eg^T$: 1.94 eV
BD-2 $Eg^T$: 2.13 eV
[Chemical Formula 68]
TB-1
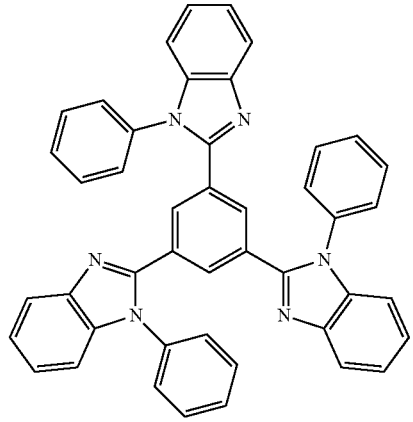
TB-3
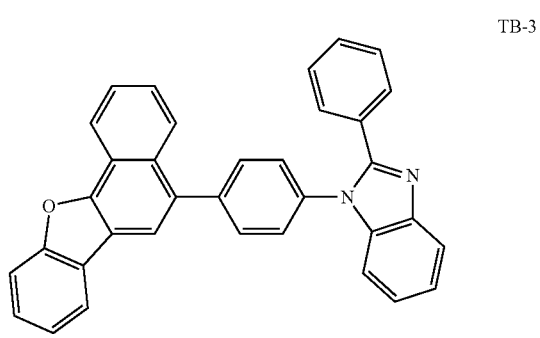
TB-6
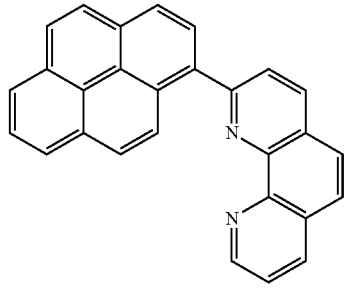
TB-7
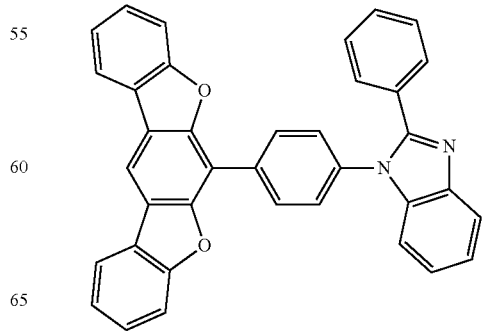

-continued

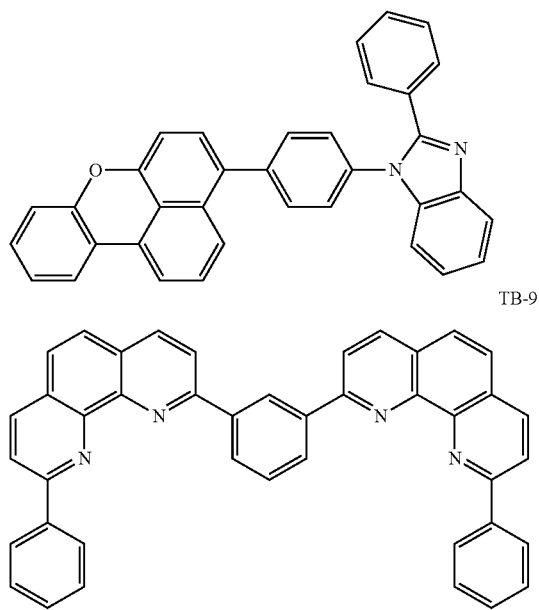

TB-8

TB-9

Measuring methods of the above physical properties of the materials are shown below.

(1) Triplet Energy ($E^T$)

A commercially-available measuring machine F-4500 (manufactured by Hitachi, Ltd.) was used for the measurement. The $E^T$ conversion equation is as follows.

The conversion equation: $E^T(eV)=1239.85/\lambda_{ph}$

When the phosphorescence spectrum is expressed in coordinates of which ordinate axis indicates phosphorescence intensity and of which abscissa axis indicates a wavelength, and a tangent is drawn to the rise of the phosphorescence spectrum on the short-wavelength side, "$\lambda_{ph}$" is a wavelength value at the intersection of the tangent and the abscissa axis. unit: nm Each compound was dissolved in a solvent (a sample 10 (μmol/liter), EPA (diethylether:isopentane:ethanol=5:5:5 (volume ratio), a spectral grade solvent) to provide a sample for phosphorescence measurement. The sample for phosphorescence measurement was put into a quartz cell, cooled to 77(K) and irradiated with exciting light, so that phosphorescence intensity was measured while changing a wavelength. The phosphorescence spectrum was expressed in coordinates of which ordinate axis indicated the phosphorescence intensity and of which abscissa axis indicated the wavelength.

A tangent was drawn to the rise of the phosphorescence spectrum on the short-wavelength side, and a wavelength value $\lambda_{ph}$ (nm) at an intersection of the tangent and the abscissa axis was obtained.

The tangent to the rise of the phosphorescence spectrum on the short-wavelength side is drawn as follows.

While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent is increased as the curve rises (i.e., a value of the ordinate axis is increased). A tangent drawn at a point of the maximum inclination is defined as the tangent to the rise of the phosphorescence spectrum on the short-wavelength side.

The maximum with peak intensity being 10% or less of the maximum peak intensity of the spectrum is not included in the above-mentioned maximum closest to the short-wavelength side of the spectrum. The tangent drawn at a point of the maximum spectral value being closest to the short-wavelength side and having the maximum inclination is defined as a tangent to the rise of the phosphorescence spectrum on the short-wavelength side.

(2) Electron Mobility

An electron mobility was evaluated using the impedance spectrometry. Al as the anode, the blocking layer material, an electron injecting material, LiF, and Al as the cathode were sequentially stacked on the substrate to prepare an electron-only device. DC voltage on which AC voltage of 100 mV was placed was applied thereon, and their complex modulus values were measured. When the frequency at which the imaginary part of the modulus was maximum was set to $f_{max}$ (Hz), a response time T(sec.) was calculated based on the equation $T=1/2/\pi/f_{max}$. Using this value, the dependence property of electron mobility on electric field intensity was determined.

The electron mobility μ conversion equation is as follows.

$$\mu = \frac{d^2}{V \cdot t_{IS}}$$ Formula 1

In the formula: V represents magnitude of the DC voltage; d represents a total film thickness of the blocking layer material, the electron injecting material and LiF in an electron-only device; and $t_{IS}$ represents a response time T measured by the impedance spectroscopy.

(3) Ionization Potential (Ip)

Separately, a single layer of each layer for forming the organic EL device was prepared on a glass substrate by vacuum vapor deposition. Ionization potential was measured using the thin film on the glass substrate and a photoelectron spectroscopy (AC-3, manufactured by Riken Keiki Co., Ltd.) under atmosphere. Specifically, a material was irradiated with light and then the amount of electrons generated by charge separation was measured to measure the ionization potential. The square root of photoelectrons ejected in response to energy of irradiation light was plotted. A threshold of photoelectron ejection energy was defined as ionization potential (Ip).

(4) Affinity

An affinity was calculated from measured values of the ionization potential Ip and an energy gap Eg. The calculation equation is as follows.

$Af=Ip-Eg$

The energy gap Eg was measured based on an absorption edge of an absorption spectrum in a toluene solution. Specifically, an absorption spectrum was measured with a commercially available ultraviolet-visible spectrophotometer. The energy gap was calculated from a wavelength of the fall of the absorption spectrum on the long-wavelength side.

The conversion equation is as follows.

The conversion equation: $Eg(eV)=1239.85/\lambda_{ph}$

The absorption spectrum was expressed in coordinates of which ordinate axis indicated absorbance and of which abscissa axis indicated a wavelength. In the conversion equation about the energy gap Eg, $\lambda_{ab}$ means a wavelength value at an intersection of a tangent and the abscissa axis, the tangent being drawn to the fall of the absorption spectrum on the long-wavelength side. unit: nm Each compound was dissolved in a toluene solvent (a sample of 2×10$^{-5}$ mol/liter) to prepare a sample of 1 cm optical path length. Absorbance was measured while changing a wavelength.

The tangent to the fall of the absorption spectrum on the long-wavelength side is drawn as follows.

While moving on a curve of the absorption spectrum from the maximum spectral value closest to the long-wavelength side in a long-wavelength direction, a tangent at each point on the curve is checked. An inclination of the tangent is decreased and increased in a repeated manner as the curve falls (i.e., a value of the ordinate axis is decreased). A tangent drawn at a point of the minimum inclination closest to the long-wavelength side (except when absorbance is 0.1 or less) is defined as the tangent to the fall of the absorption spectrum on the long-wavelength side.

The maximum absorbance of 0.2 or less is not included in the above-mentioned maximum absorbance on the long-wavelength side.

(5) Measurement of TTF Ratio

When the triplet energy of the host, dopant and blocking layer material satisfies a predetermined relation, the ratio of luminous intensity derived from TTF relative to the entire emission can be high, so that a fluorescent device can be highly efficient to the level unachievable by a typically known fluorescent device.

The ratio of luminous intensity derived from TTF is measurable by a transitional EL method. The transitional EL method is a method for measuring reduction behavior (transitional property) of EL emission after DC voltage applied on the device is removed. EL luminous intensity are classified into a luminescence component from singlet excitons generated in first recombination and a luminescence component from singlet excitons generated through TTF phenomenon. Since lifetime of the singlet excitons is very short at nanosecond order, EL emission is rapidly reduced after removal of DC voltage.

On the other hand, since the TTF phenomenon provides emission from singlet excitons generated through long-life triplet excitons, EL emission is gradually reduced. Thus, since there is a large difference in time between emission from the singlet excitons and emission from the triplet excitons, a luminous intensity derived from TTF is obtainable. Specifically, the luminous intensity can be determined by the following method.

Figure 11:
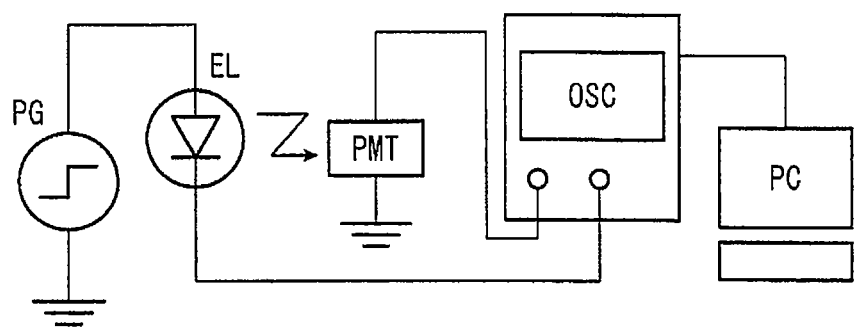
FIG. 11 shows a measurement system of transitional EL waves.

Transitional EL waveform is measured as follows (see FIG. 11). Pulse voltage waveform output from a voltage pulse generator (PG) is applied on an EL device. The applied voltage waveform is loaded in an oscilloscope (OSC). When a pulse voltage is applied on the EL device, the EL device generates pulse emission. This emission is loaded in the oscilloscope (OSC) through a photomultiplier (PMT). The voltage waveform and the pulse emission are synchronized and loaded in a personal computer (PC).

The ratio of luminous intensity is determined as follows based on analysis of the transitional EL waveform.

A rate equation for reduction behavior of triplet excitons is resolved and the reduction behavior of luminous intensity based on TTF phenomenon is brought into modeling. Time-varying reduction of a density $n_T$ of triplet excitons within the emitting layer is represented by the following rate equation using a reduction speed a due to lifetime of the triplet excitons and a reduction speed γ due to collision of the triplet excitons.

$$\frac{dn_T}{dt} = -\alpha \cdot n_T - \gamma \cdot n_T^2 \quad \text{Formula 2}$$

When this differential formula is approximately resolved, the following formula is obtained. Herein, $I_{TTF}$ represents luminous intensity derived from TTF. A is a constant. Thus, when the transitional EL emission is based on TTF, a reciprocal number of the square root of intensity of the transitional EL emission is shown approximately in a linear line. The measured transitional EL waveform data is fit in the following approximate expression to obtain the constant A. At this time, luminous intensity 1/A$^2$ at the time t=0 when DC voltage is removed is defined as the ratio of luminous intensity derived from TTF.

$$\frac{1}{\sqrt{I_{TTF}}} \propto A + \gamma \cdot t \quad \text{Formula 3}$$

Figure 12A:
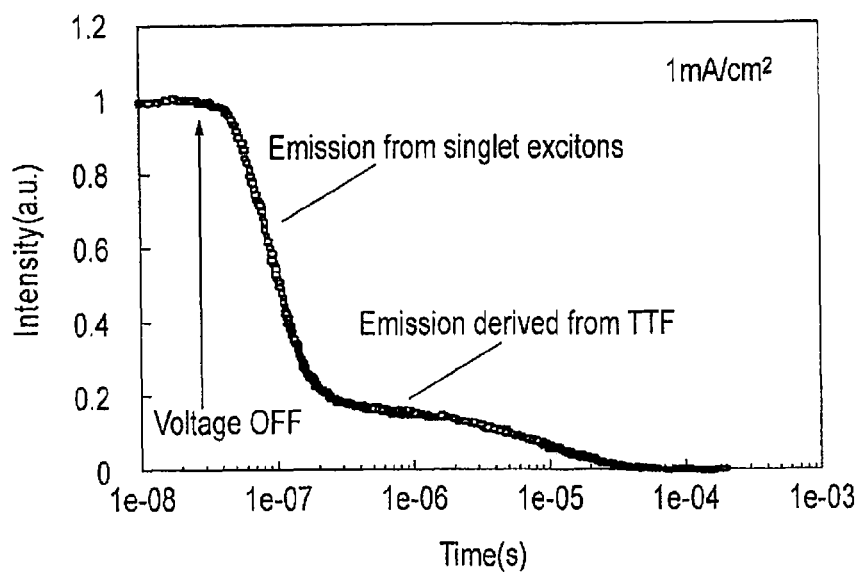
FIG. 12A shows a measurement method of a ratio of luminous intensities derived from TTF and is a graph showing time-varying luminous intensities of the EL device.
Figure 12B:
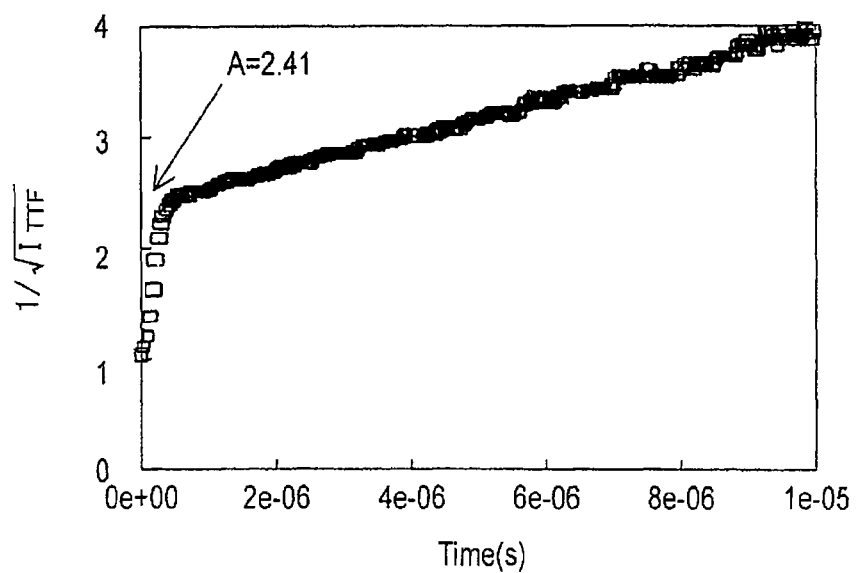
FIG. 12B shows a measurement method of a ratio of luminous intensities derived from TTF and is a graph showing time-varying reciprocal number of the square root of luminous intensities.

A graph of FIG. 12A shows a measurement example where a predetermined DC voltage is applied on the EL device and then the DC voltage is removed and shows time-varying luminous intensity of the EL device. The DC voltage was removed at the time of about 3×10$^{-8}$ seconds in the graph of FIG. 12 A. In the graph, the luminous intensity when voltage is removed is defined as 1. After rapid reduction before the elapse of about 2×10$^{-7}$ seconds, a gradual reduction component appears. In the graph of FIG. 12 B, the voltage removal time is a starting point and the reciprocal numbers of the square root of luminous intensity before the elapse of 10$^{-5}$ seconds after voltage removal are plotted in an approximately linear line. A value at an intersection A of the ordinate axis and the linear line extended to the starting point is 2.41. Accordingly, the ratio of luminous intensity derived from TTF obtained from the transitional EL waveform is 1/2.41$^2$=0.17, which means 17% of the entire luminous intensity was derived from TTF.

The luminous intensity is preferably fitted in a linear line by the method of least squares. In this case, the luminous intensity before the elapse of 10$^{-5}$ seconds is preferably fitted.

Triplet energies of the compounds used for the blocking layer are shown as T1TB in Table 1.

Affinities of the compounds used for the blocking layer and the electron injecting layer are respectively shown as AfBT and AfET in Table 1. Values obtained by subtracting the affinities of the compounds used for the blocking layer from the affinities of the compounds used for the electron injecting layer are shown as Δ(AfET-AfTB) in Table 1.

The organic EL devices were prepared in the following manner and evaluated.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum evaporation apparatus. Initially, a compound HT-1 was evaporated on a surface of the glass substrate where the transparent electrode line was provided in a manner to cover the transparent electrode, thereby forming a 50-nm thick film of the compound HT-1. The HT-1 film serves as a hole injecting layer.

After the film formation of the HT-1 film, a compound HT-2 was deposited on the HT-1 film to form a 45-nm thick HT-2 film on the HT-1 film. The HT-2 film serves as a hole transporting layer.

Then, a compound BH-1 (host material) and a compound BD-1 (dopant material) (mass ratio of BH-1 to BD-1 was 20:1) were co-evaporated on the HT-2 film to form a 25-nm thick emitting layer.

TB-1 was deposited on this emitting layer to form a 5-nm thick blocking layer.

ET-1 (electron transporting material) was deposited on the blocking layer to form a 20-nm thick electron injecting layer.

nics K.K.). The pulse voltage waveform and the EL emission were synchronized and loaded in an oscilloscope (2440: Tektronix) to obtain a transitional EL waveform. The transitional EL waveform was analyzed to determine a TTF ratio.

Voltage was applied on the organic EL device of the Example 1 at the room temperature. The pulse voltage was removed at the time of about $3 \times 10^{-8}$ seconds.

Based on the graph, where the voltage removal time was a starting point and the reciprocal numbers of the square root of luminous intensity before the elapse of $10^{-5}$ seconds after voltage removal were plotted, the TTF ratio was obtained. Also in Examples 2 to 7 and Comparatives 1 to 6, measurements were made in the same manner as in Example 1.

TABLE 1

| | Material | | | | | | | | | | | | |
|---|---|---|---|---|---|---|---|---|---|---|---|---|---|
| | Dopant (BD) | Blocking Layer (TB) | Electron Injecting Layer (ET) | Voltage V | Chromaticity CIE x | y | L/J cd/A | EQE % | λp nm | T1TB eV | AfET eV | AfTB eV | Δ(AfET − AfTB) eV | TTF ratio % |
| Example 1 | BD-1 | TB-1 | ET-1 | 4.0 | 0.132 | 0.133 | 10.9 | 10.0 | 464 | 2.80 | 2.44 | 2.71 | −0.27 | 29.3 |
| Example 2 | BD-1 | TB-3 | ET-1 | 4.3 | 0.132 | 0.128 | 10.6 | 10.1 | 463 | 2.60 | 2.44 | 2.60 | −0.16 | 26.2 |
| Example 3 | BD-1 | TB-6 | ET-1 | 4.6 | 0.132 | 0.131 | 10.6 | 9.86 | 463 | 2.08 | 2.44 | 2.70 | −0.26 | 25.3 |
| Example 4 | BD-2 | TB-7 | ET-1 | 3.6 | 0.145 | 0.112 | 10.0 | 10.0 | 450 | 2.79 | 2.44 | 2.65 | −0.21 | 28.4 |
| Example 5 | BD-2 | TB-8 | ET-1 | 3.6 | 0.144 | 0.113 | 10.1 | 10.0 | 451 | 2.22 | 2.44 | 2.73 | −0.29 | 29.0 |
| Example 6 | BD-2 | TB-9 | ET-1 | 4.3 | 0.145 | 0.119 | 10.2 | 9.70 | 451 | 2.60 | 2.44 | 2.84 | −0.40 | 30.5 |
| Example 7 | BD-2 | TB-9 | ET-2 | 3.8 | 0.144 | 0.118 | 10.4 | 9.95 | 451 | 2.60 | 2.99 | 2.84 | 0.15 | 32.0 |
| Comparative 1 | BD-1 | TB-1 | ET-2 | 5.0 | 0.131 | 0.135 | 8.05 | 7.40 | 464 | 2.80 | 2.99 | 2.71 | 0.28 | 9.7 |
| Comparative 2 | BD-1 | TB-2 | ET-2 | 5.7 | 0.131 | 0.134 | 7.53 | 6.93 | 464 | 2.71 | 2.99 | 2.76 | 0.23 | 7.8 |
| Comparative 3 | BD-1 | TB-3 | ET-2 | 5.9 | 0.131 | 0.127 | 6.67 | 6.36 | 463 | 2.60 | 2.99 | 2.60 | 0.39 | 5.3 |
| Comparative 4 | BD-1 | TB-4 | ET-2 | 6.2 | 0.134 | 0.111 | 4.76 | 4.99 | 462 | 2.85 | 2.99 | 2.46 | 0.53 | 4.1 |
| Comparative 5 | BD-2 | TB-7 | ET-2 | 4.8 | 0.145 | 0.102 | 5.24 | 5.62 | 449 | 2.79 | 2.99 | 2.65 | 0.34 | 8.7 |
| Comparative 6 | BD-2 | TB-8 | ET-2 | 5.1 | 0.145 | 0.099 | 4.32 | 4.76 | 450 | 2.22 | 2.99 | 2.73 | 0.26 | 6.6 |

LiF was deposited on the electron injecting layer to form a 1-nm thick LiF film.

A metal Al was deposited on the LiF film to form a 150-nm thick metal cathode.

Thus, the organic EL device of Example 1 was prepared.

Examples 2 to 7 and Comparatives 1 to 6

Except that the compounds shown in Table 1 were used as the dopant of the emitting layer and the compounds of the blocking layer and the electron injecting layer, the organic EL devices were prepared in the same manner as in the Example 1.

Evaluation of Organic EL Devices

The prepared organic EL devices were evaluated as below. The results are shown in Table 1.

Initial Performance

Voltage was applied on the organic EL devices such that a current density was 1 mA/cm², where a value (V) of the voltage was measured. EL emission spectrum at that time was measured with a spectral radiance meter (CS-1000, manufactured by KONICA MINOLTA). Chromaticity $CIE_x$, $CIE_y$, current efficiency La (cd/A), external quantum efficiency EQE (%), and main peak wavelength $\lambda_p$ (nm) were calculated from the obtained spectral-radiance spectrum.

TTF Ratio

Voltage pulse waveform (pulse width: 500 micro second, frequency: 20 Hz, voltage: equivalent to 0.1 to 100 mA/cm²) output from a pulse generator (8114A: manufactured by Agilent Technologies) was applied. EL emission was input in a photomultiplier (R928: manufactured by Hamamatsu Photo- In the organic EL devices of Examples 1 to 7, the triplet energy of the blocking layer was larger than triplet energy of the host and a value obtained by subtracting the affinity of the blocking layer from the affinity of the electron injecting layer was 0.15 eV or less. As a result, the electrons were favorably supplied from the cathode and the carrier balance was improved, so that a high external quantum efficiency was obtained.

On the other hand, in the organic EL devices of Comparatives 1 to 6, a value obtained by subtracting the affinity of the blocking layer from the affinity of the electron injecting layer was 0.2 eV or more. As a result, the electrons were not sufficiently supplied from the cathode, and the carrier balance was not met, so that the obtained external quantum efficiency was lower than those of Examples 1 to 7.

INDUSTRIAL APPLICABILITY

The organic EL device of the invention is applicable to a display and an illuminator.

EXPLANATION OF CODES 1, 2, 4 organic EL device
10 anode
20, 22, 24 emitting layer
30, 32 blocking layer
40 electron injecting layer
50 cathode
60 hole transporting zone
70 electron transporting zone

What is claimed is:

1. An organic electroluminescence device, comprising in sequential order an anode, an emitting layer, a blocking layer, an electron injecting layer, and a cathode, wherein the emitting layer comprises a host and a dopant, the blocking layer comprises an aromatic heterocyclic derivative, a triplet energy $E^T_b$ (eV) of the aromatic heterocyclic derivative is larger than a triplet energy $E^T_h$ (eV) of the host, the triplet energy $E^T_h$ (eV) of the host and a triplet energy $E^T_d$ (eV) of the dopant satisfy $E^T_h < E^T_d$, and an affinity $A_b$ (eV) of the blocking layer and an affinity $A_e$ (eV) of the electron injecting layer satisfy a relationship of $A_e - A_b < 0.2$, wherein the aromatic heterocyclic derivative is represented by formula (BL-6)

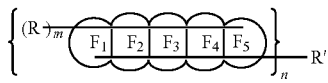
(BL-6)

wherein $F_1$ to $F_5$ each independently represent a cyclic structure and a $F_1$-$F_5$ ring represents a fused ring provided by $F_1$ to $F_5$, optionally cross-coupled by another fused ring, at least one of $F_1$ to $F_5$ comprises a hetero atom, R is independently selected from the group consisting of a substituted or unsubstituted alkyl group, a substituted or unsubstituted aryl group, a substituted or unsubstituted heteroaryl group, and a combination thereof, when a plurality of $F_1$-$F_5$ rings and R groups are present, the plurality of $F_1$-$F_5$ rings and the R groups each may be the same or different, m is an integer of 0 to 13, n is an integer of 1 to 6, when n is 1, R' is independently selected from the group consisting of a substituted or unsubstituted alkyl group, a substituted or unsubstituted aryl group, a substituted or unsubstituted heteroaryl group, and a combination thereof, when n is 2 to 6, R' is a linking group independently selected from the group consisting of a substituted or unsubstituted alkylene group, a substituted or unsubstituted arylene group, a substituted or unsubstituted heteroarylene group, and a combination thereof, or R' is a single bond that directly bonds two $F_1$-$F_5$ rings.

2. The organic electroluminescence device according to claim 1, wherein the triplet energy $E^T_b$ (eV) of the aromatic heterocyclic derivative and the triplet energy $E^T_h$ (eV) of the host satisfy a relation of $E^T_h + 0.2 < E^T_b$.

3. The organic electroluminescence device according to claim 1, wherein the triplet energy $E^T_b$ (eV) of the aromatic heterocyclic derivative and a triplet energy $E^T_{Alq}$ (eV) of a tris(8-quinolinolato)aluminum complex satisfy a relationship of $E^T_b > E^T_{Alq}$.

4. The organic electroluminescence device according to claim 1, wherein an electron mobility of the aromatic heterocyclic derivative is at least $10^{-6}$ cm$^2$/Vs in an electric field intensity of 0.04 MV/cm to 0.5 MV/cm.

5. The organic electroluminescence device according to claim 1, wherein an electron mobility of a material for forming the electron injecting layer is at least $10^{-6}$ cm$^2$/Vs in an electric field intensity of 0.04 MV/cm to 0.5 MV/cm.

6. The organic electroluminescence device according to claim 1, wherein the dopant exhibits a fluorescent emission of a main peak wavelength of less than or equal to 550 nm.

7. The organic electroluminescence device according to claim 1, wherein a hole transporting zone is positioned between the anode and the emitting layer, a hole transporting layer is adjacent to the emitting layer in the hole transporting zone, and a triplet energy $E^T_{ho}$ (eV) of the hole transporting layer is larger than the triplet energy $E^T_h$ (eV) of the host.

8. The organic electroluminescence device according to claim 1, wherein the electron injecting layer and the blocking layer are formed of the same material, and the electron injecting layer is doped with a donor.

9. The organic electroluminescence device according to claim 1, wherein the dopant is at least one compound selected from the group consisting of a pyrene derivative, an aminoanthracene derivative, an aminochrysene derivative, an aminopyrene derivative, a fluoranthene derivative and a boron complex.

10. The organic electroluminescence device according to claim 1, wherein the host is a compound that comprises a double bond only in a cyclic structure.

11. The organic electroluminescence device according to claim 1, wherein the dopant is a compound that comprises a double bond only in a cyclic structure.

12. The organic electroluminescence device according to claim 1, wherein in applied voltage at the maximum current efficiency (cd/A), luminous intensity derived from singlet excitons generated by collision of triplet excitons generated in the emitting layer accounts for 30% or more of the entire luminous intensity.

13. The organic electroluminescence device according to claim 1, wherein the electron injecting layer is formed from a material that is different from the material that forms the blocking layer.

14. An organic electroluminescence device comprising in sequential order an anode, an emitting layer, a blocking layer, and a cathode, wherein the emitting layer comprises a host and a dopant, the blocking layer comprises an aromatic heterocyclic derivative, a triplet energy $E^T_b$ (eV) of the aromatic heterocyclic derivative is larger than a triplet energy $E^T_h$ (eV) of the host, and the triplet energy $E^T_h$ (eV) of the host and a triplet energy $E^T_d$ (eV) of the dopant satisfy $E^T_h < E^T_d$, wherein the aromatic heterocyclic derivative is represented by formula (BL-6)

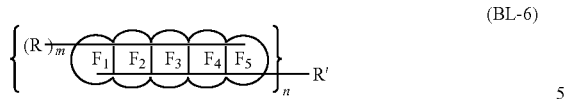
(BL-6)

wherein $F_1$ to $F_5$ each independently represent a cyclic structure and a $F_1$-$F_5$ ring represents a fused ring provided by $F_1$ to $F_5$, optionally cross-coupled by another fused ring, at least one of $F_1$ to $F_5$ comprises a hetero atom, R is independently selected from the group consisting of a substituted or unsubstituted alkyl group, a substituted or unsubstituted aryl group, a substituted or unsubstituted heteroaryl group, and a combination thereof, when a plurality of $F_1$-$F_5$ rings and R groups are present, the plurality of $F_1$-$F_5$ rings and the R groups each may be the same or different, m is an integer of 0 to 13, n is an integer of 1 to 6, when n is 1, R' is independently selected from the group consisting of a substituted or unsubstituted alkyl group, a substituted or unsubstituted aryl group, a substituted or unsubstituted heteroaryl group, and a combination thereof, when n is 2 to 6, R' is a linking group independently selected from the group consisting of a substituted or unsubstituted alkylene group, a substituted or unsubstituted arylene group, a substituted or unsubstituted heteroarylene group, and a combination thereof, or R' is a single bond that directly bonds two $F_1$-$F_5$ rings.

\* \* \* \* \*